US005756981A

United States Patent [19]
Roustaei et al.

[11] Patent Number: 5,756,981
[45] Date of Patent: May 26, 1998

[54] OPTICAL SCANNER FOR READING AND DECODING ONE- AND-TWO-DIMENSIONAL SYMBOLOGIES AT VARIABLE DEPTHS OF FIELD INCLUDING MEMORY EFFICIENT HIGH SPEED IMAGE PROCESSING MEANS AND HIGH ACCURACY IMAGE ANALYSIS MEANS

[75] Inventors: Alexander R. Roustaei, La Jolla; Roland L. Lawrence, San Diego; Ali Lebaschi, San Diego; Long-Xiang Bian, San Diego; Donald Fisher, Valley Center, all of Calif.

[73] Assignee: Symbol Technologies, Inc., Holtsville, N.Y.

[21] Appl. No.: 690,752

[22] Filed: Aug. 1, 1996

Related U.S. Application Data

[63] Continuation-in-part of Ser. No. 569,728, Dec. 8, 1995, Ser. No. 137,426, Oct. 18, 1993, Pat. No. 5,484,994, and Ser. No. 444,387, May 19, 1995, abandoned, which is a continuation-in-part of Ser. No. 329,257, Oct. 26, 1994, abandoned, said Ser. No. 569,728, is a continuation-in-part of Ser. No. 363,985, Dec. 27, 1994, abandoned, which is a continuation of Ser. No. 59,322, May 7, 1993, abandoned, which is a continuation-in-part of Ser. No. 965,991, Oct. 23, 1992, Pat. No. 5,354,977, which is a continuation-in-part of Ser. No. 956,646, Oct. 2, 1992, Pat. No. 5,349,172, which is a continuation-in-part of Ser. No. 843,266, Feb. 27, 1992, Pat. No. 5,291,009.

[51] Int. Cl.$^6$ .................................................. G06K 07/10
[52] U.S. Cl. .................................................. 235/462; 235/472
[58] Field of Search .................................. 235/472, 462, 235/459, 469, 470, 454

[56] References Cited

U.S. PATENT DOCUMENTS

| 3,684,868 | 8/1972 | Christie et al. ............... 235/61.11 |
| 3,819,938 | 6/1974 | Kornrumpf et al. ............ 250/222 |
| 3,876,900 | 4/1975 | Amatsuka et al. ............. 313/510 |

(List continued on next page.)

FOREIGN PATENT DOCUMENTS

| 0152733 | 8/1985 | European Pat. Off. |
| 0164012 | 11/1985 | European Pat. Off. |
| 0249713 | 4/1987 | European Pat. Off. |
| 0384955 | 9/1990 | European Pat. Off. |
| 0517956 | 12/1992 | European Pat. Off. |
| 0524653 | 1/1993 | European Pat. Off. |
| 002673738 | 9/1992 | France . |

(List continued on next page.)

OTHER PUBLICATIONS

"CCD Bar Code Scanner;" ZB–1000/2000 Plus Series, Zebex Industries, Inc., 1992 Zebex Catalog No. 920802.

"CCD Bar Code Handy Scanner Model BHS–6000 Series;" Nippondenso Co., Ltd., Mar. 1992 brochure.

(List continued on next page.)

*Primary Examiner*—Donald T. Hajec
*Assistant Examiner*—Le Thien Minh
*Attorney, Agent, or Firm*—Brown, Martin, Haller & McClain

[57] ABSTRACT

An optical device for reading one- and two-dimensional symbologies at variable depths of field. The device has a light source for projecting emitted light toward the symbol image to be reflected back to an optical assembly, or zoom lens. The zoom gives multiple field of view capability to a CCD detector for detecting the reflected light, and generating a proportional electrical signal. The sensor is aimed for reading the symbology by a frame locator including a light source that emits a beam divided by diffractive optics into beamlets matching the dimensions of the respective field of views. Refractive optics are shifted in response to movement of the zoom lens for aiming the beamlets to form an aiming frame in accordance with the depth of field selected by the zoom lens. The device includes a microcomputer that communicates with a host PC including an API library with downloadable applications for image processing, including segmenting, analyzing, and decoding.

37 Claims, 35 Drawing Sheets

U.S. PATENT DOCUMENTS

| | | | |
|---|---|---|---|
| 4,115,703 | 9/1978 | Dobras | 250/568 |
| 4,306,147 | 12/1981 | Fukuyama et al. | 250/221 |
| 4,315,245 | 2/1982 | Nakahara et al. | 340/146 |
| 4,409,470 | 10/1983 | Shepard et al. | 235/472 |
| 4,473,746 | 9/1984 | Edmonds | 250/216 |
| 4,542,528 | 9/1985 | Sanner et al. | 382/62 |
| 4,570,057 | 2/1986 | Chadima, Jr. et al. | 235/472 |
| 4,578,571 | 3/1986 | Williams | 235/472 |
| 4,647,766 | 3/1987 | Dimur et al. | 250/227 |
| 4,673,805 | 6/1987 | Shepard et al. | 235/472 |
| 4,728,784 | 3/1988 | Stewart | 235/462 |
| 4,734,566 | 3/1988 | Senda et al. | 235/455 |
| 4,743,773 | 5/1988 | Katana et al. | 250/566 |
| 4,758,717 | 7/1988 | Shepard et al. | 235/472 |
| 4,766,300 | 8/1988 | Chadima, Jr. et al. | 235/472 |
| 4,804,949 | 2/1989 | Faulkerson | 340/710 |
| 4,818,847 | 4/1989 | Hara et al. | 235/455 |
| 4,841,132 | 6/1989 | Kajitani et al. | 235/472 |
| 4,845,350 | 7/1989 | Shepard et al. | 235/472 |
| 4,850,009 | 7/1989 | Zook et al. | 379/96 |
| 4,855,581 | 8/1989 | Mertel et al. | 235/462 |
| 4,874,933 | 10/1989 | Sanner | 235/470 |
| 4,877,949 | 10/1989 | Danielson et al. | 235/462 |
| 4,879,456 | 11/1989 | Cherry et al. | 235/462 |
| 4,882,476 | 11/1989 | White | 235/462 |
| 4,894,523 | 1/1990 | Chadima, Jr. et al. | 235/472 |
| 4,900,907 | 2/1990 | Matusima et al. | 235/472 |
| 4,933,538 | 6/1990 | Heiman et al. | 235/462 |
| 4,970,379 | 11/1990 | Danstrom | 250/205 |
| 5,010,241 | 4/1991 | Butterworth | 235/462 |
| 5,019,699 | 5/1991 | Koenck | 235/472 |
| 5,021,642 | 6/1991 | Chadima, Jr. et al. | 235/472 |
| 5,073,954 | 12/1991 | Van Tyne et al. | 382/18 |
| 5,081,343 | 1/1992 | Chadima, Jr. et al. | 235/472 |
| 5,095,197 | 3/1992 | Chadima, Jr. et al. | 235/472 |
| 5,107,100 | 4/1992 | Shepard et al. | 235/472 |
| 5,110,226 | 5/1992 | Sherman et al. | 400/88 |
| 5,128,519 | 7/1992 | Tokuda | 235/462 |
| 5,130,520 | 7/1992 | Shepard et al. | 235/472 |
| 5,135,160 | 8/1992 | Tasaki | 235/462 |
| 5,144,119 | 9/1992 | Chadima, Jr. et al. | 235/472 |
| 5,144,121 | 9/1992 | Chadima, Jr. et al. | 235/472 |
| 5,157,687 | 10/1992 | Tymes | 375/1 |
| 5,182,441 | 1/1993 | Chadima, Jr. et al. | 235/472 |
| 5,187,355 | 2/1993 | Chadima, Jr. et al. | 235/472 |
| 5,187,356 | 2/1993 | Chadima, Jr. et al. | 235/472 |
| 5,192,856 | 3/1993 | Schaham | 235/462 |
| 5,196,684 | 3/1993 | Lum et al. | 235/462 |
| 5,202,817 | 4/1993 | Koenck et al. | 361/393 |
| 5,216,233 | 6/1993 | Main et al. | 235/472 |
| 5,218,187 | 6/1993 | Koenck et al. | 235/375 |
| 5,218,188 | 6/1993 | Hanson | 235/375 |
| 5,218,191 | 6/1993 | Chadima, Jr. et al. | 235/472 |
| 5,233,172 | 8/1993 | Chadima, Jr. et al. | 235/472 |
| 5,241,488 | 8/1993 | Chadima, Jr. et al. | 364/708.1 |
| 5,243,655 | 9/1993 | Wang | 380/51 |
| 5,250,790 | 10/1993 | Meltisky et al. | 235/462 |
| 5,258,605 | 11/1993 | Metlisky et al. | 235/462 |
| 5,258,606 | 11/1993 | Chadima, Jr. et al. | 235/472 |
| 5,260,553 | 11/1993 | Rockstein et al. | 235/462 |
| 5,262,625 | 11/1993 | Tom et al. | 235/462 |
| 5,264,956 | 11/1993 | Tzu-Chin | 359/196 |
| 5,270,525 | 12/1993 | Ukai et al. | 235/472 |
| 5,280,161 | 1/1994 | Niwa | 235/462 |
| 5,288,984 | 2/1994 | Ito et al. | 234/472 |
| 5,291,009 | 3/1994 | Roustaei | 235/472 |
| 5,336,873 | 8/1994 | Imamura | 235/462 |
| 5,349,172 | 9/1994 | Roustaei | 235/472 |
| 5,354,977 | 10/1994 | Roustaei | 235/472 |
| 5,548,110 | 8/1996 | Storch et al. | 235/462 |

FOREIGN PATENT DOCUMENTS

| | | |
|---|---|---|
| 2009893 | 9/1971 | Germany. |
| 59-35276 | 2/1984 | Japan. |
| 61-34681 | 2/1986 | Japan. |
| 61-28947 | 12/1986 | Japan. |
| 63-189981 | 5/1988 | Japan. |
| 1-52584 | 6/1989 | Japan. |
| 1-224887 | 9/1989 | Japan. |
| 3-113581 | 5/1991 | Japan. |

OTHER PUBLICATIONS

"Get a Head With Denso's Reading Edge Technology;" ID Systems, Apr. 1987, vol. 7, No. 3.

"Information Encoding With Two–Dimensional Bar Codes," Theo Pavlidis, et al., Computer, vol. 25, No. 6, Jun., 1992, pp. 18–28.

"Paper cuts: Highlights of New Proceedings" —OE/Reports, Excerpts of SPIE Proceedings papers on the cutting edge of technology, Aug., 1994, By Tom Hopper, p. 6.

"CMOS In Camera" —Reprint From *IEE Review*, May 1994, By Oliver Vellacott, pp. 111–112.

"Automotive Industry Recommends 2–D Standards" —*Automotive I.D. News* By John Piatek, Aug., 1994, pp. 54–56.

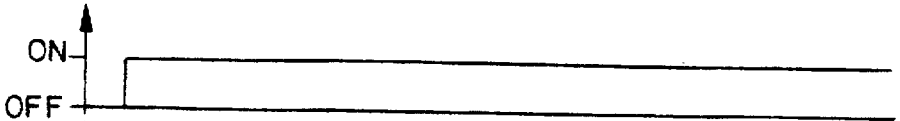
FIG. 7A
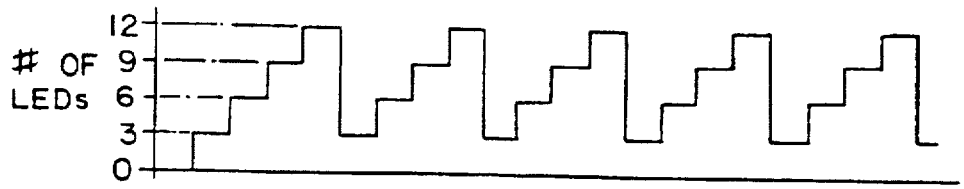
FIG. 7B
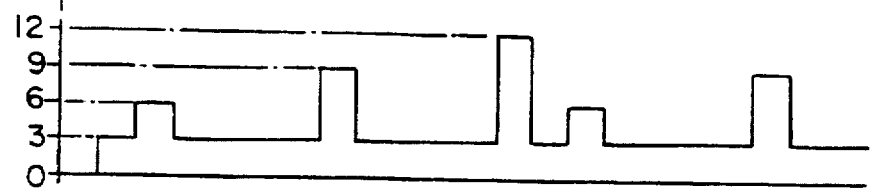
FIG. 7C
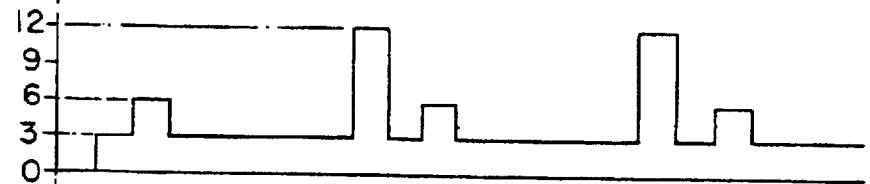
FIG. 7D
FIG. 7E
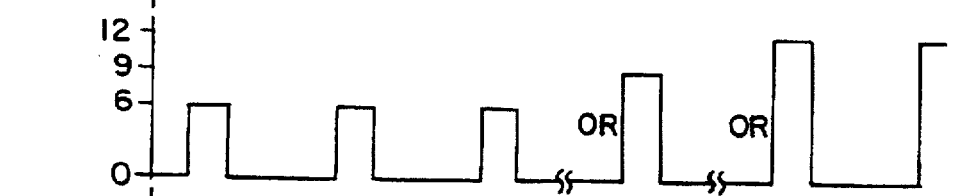
FIG. 7F
PRIOR ART
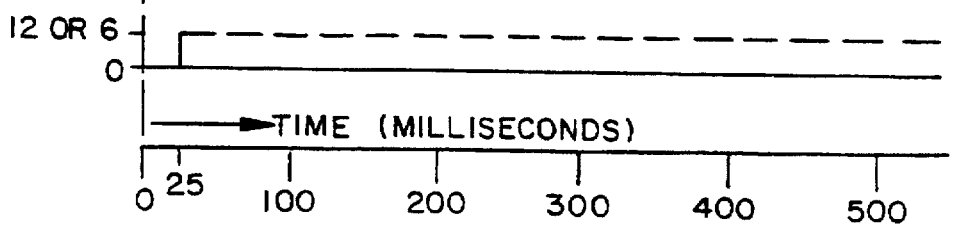
FIG. 7G
PRIOR ART

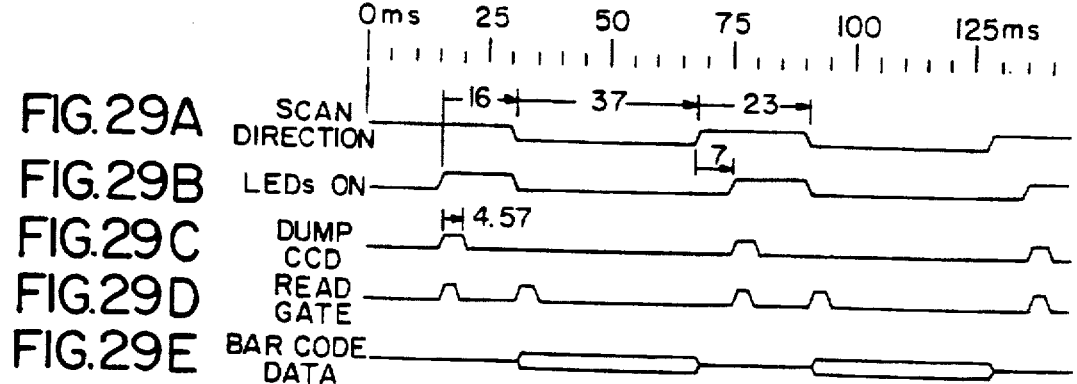
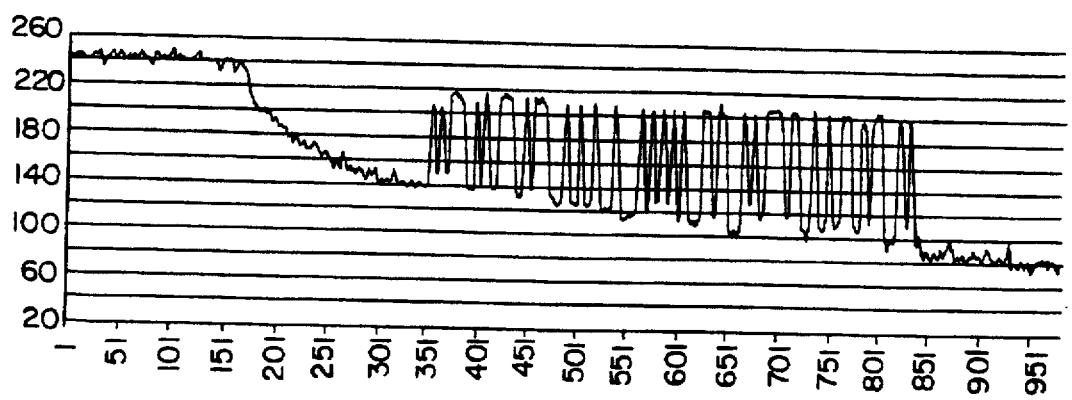
FIG. 30
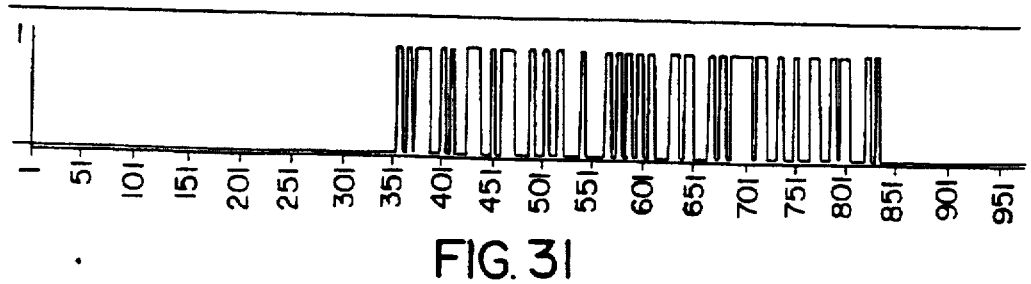
FIG. 31

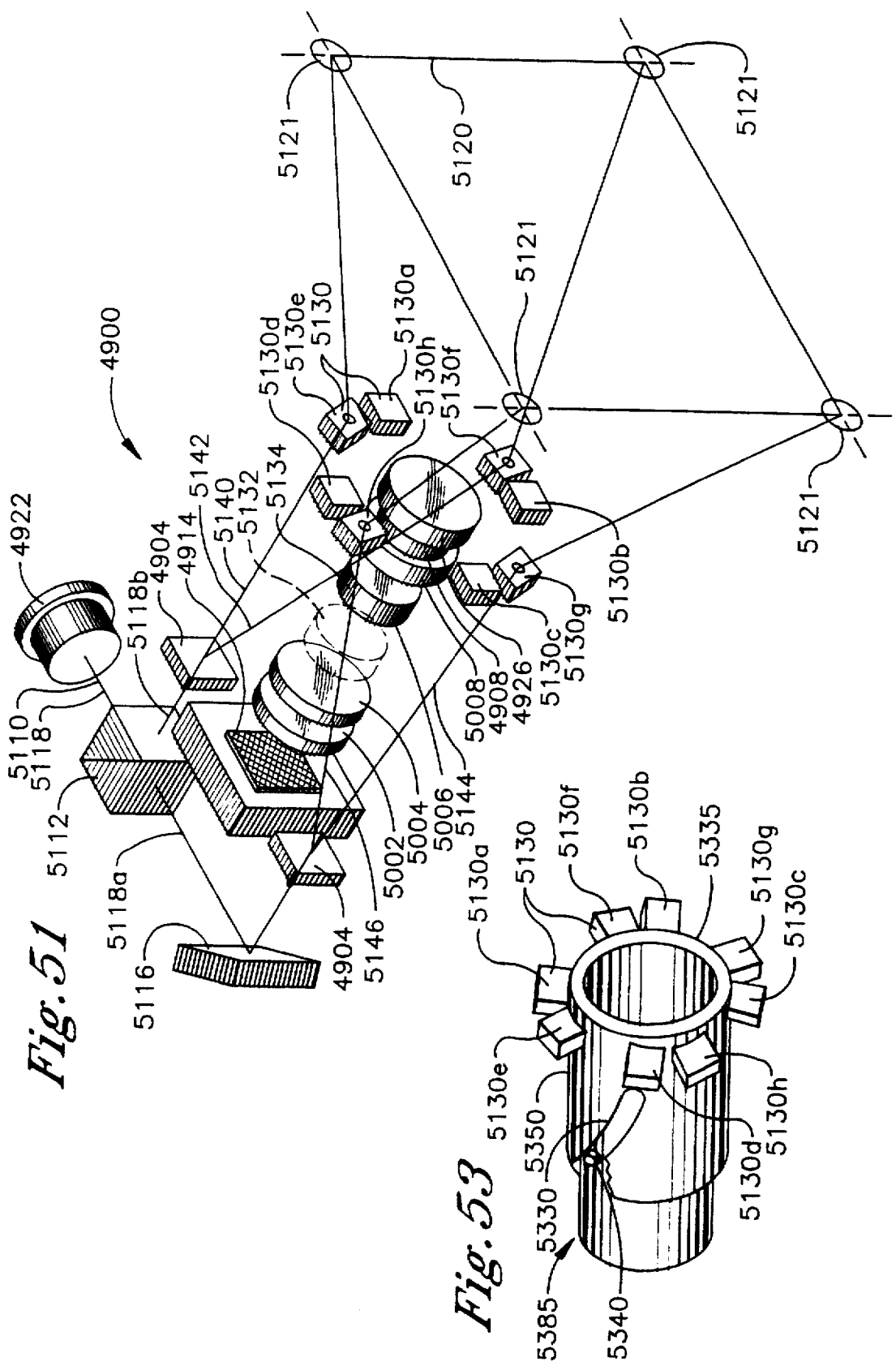

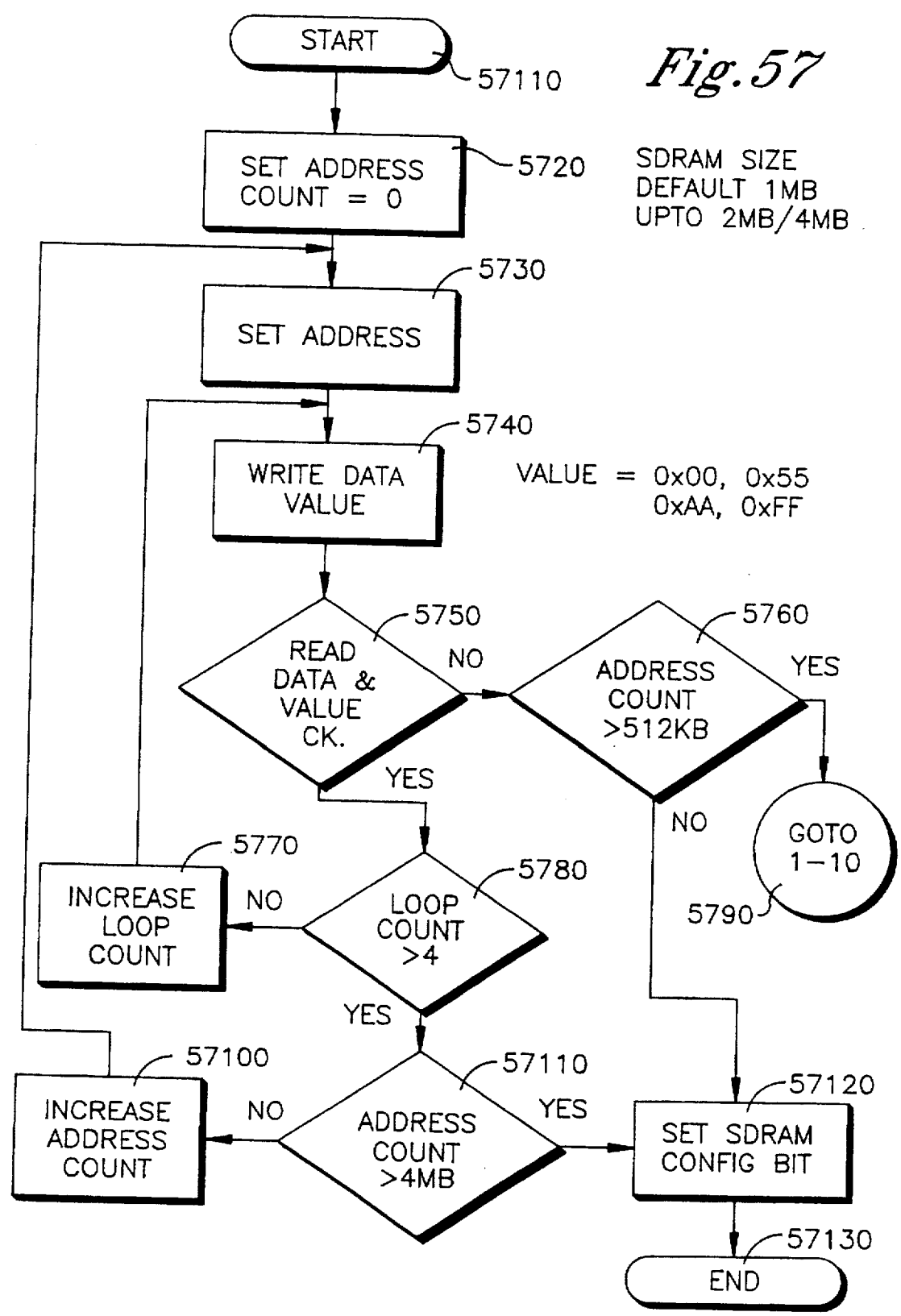

G: BACKGROUND
B: BAR

OPTICAL SCANNER FOR READING AND DECODING ONE- AND-TWO-DIMENSIONAL SYMBOLOGIES AT VARIABLE DEPTHS OF FIELD INCLUDING MEMORY EFFICIENT HIGH SPEED IMAGE PROCESSING MEANS AND HIGH ACCURACY IMAGE ANALYSIS MEANS

CROSS-REFERENCES TO RELATED APPLICATIONS

This is a continuation-in-part of application Ser. No. 08/569,728 filed Dec. 8, 1995, which is a continuation-in-part of application Ser. No. 08/363,985, filed Dec. 27, 1994 now abandoned, which is a continuation of Ser. No. 08/059,322, filed May 7, 1993 now abandoned, which is a continuation-in-part of application Ser. No. 07/965,991, filed Oct. 23, 1992, now issued as U.S. Pat. No. 5,354,977, which is a continuation-in-part of application Ser. No. 07/956,646, filed Oct. 2, 1992, now issued as U.S. Pat. No. 5,349,172, which is a continuation-in-part of application Ser. No. 07/843,266, filed Feb. 27, 1992, now issued as U.S. Pat. No. 5,291,009. This is also a continuation-in-part of application Ser. No. 08/137,426, filed Oct. 18, 1993, now issued as U.S. Pat. No. 5,484,994, and a continuation-in-part of application Ser. No. 08/444,387, filed May 19, 1995 now abandoned, which is a continuation-in-part of application Ser. No. 08/329,257, filed Oct. 26, 1994 now abandoned.

FIELD OF THE INVENTION

The invention generally relates to a scanning or imaging system for reading and/or analyzing optically encoded symbols or images and more particularly to an improved CCD bar code reading device for grabbing one- and two-dimensional symbols and images and processing the images with high speed and analyzing the images with high accuracy while efficiently using memory.

BACKGROUND OF THE INVENTION

Many industries, including the assembly processing, grocery and food processing industries, utilize an identification system in which the products are marked with a bar code symbol consisting of a series of lines and spaces of varying widths, or other types of symbols consisting of series of contrasting markings. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner or imager which can be incorporated into a portable system uses light emitting diodes (LED) as a light source and charge coupled devices (CCD) as detectors. This class of bar code scanners or imagers is generally known as "CCD scanners". CCD scanners record symbols by storing the image in a frame memory, which is then scanned electronically, or processed using software to convert the captured image into an output signal.

One type of such CCD scanner is disclosed in the earlier Roustaei patents, e.g., U.S. Pat. Nos. 5,291,009, 5,349,172, and 5,354,977. While CCD scanners have the advantage of being less expensive to manufacture, the scanners prior to Roustaei were limited to scanning the bar code by either contacting the surface on which the bar code is imprinted or maintaining a distance of no more than one and one-half inches away from the bar code, which creates a further limitation in that it cannot read a bar code any longer than the window or housing width of the scanning head. The CCD scanner disclosed in the '009 patent and its offspring introduced the ability to read symbologies which are wider than the physical width of the scanner housing at distances as much as twenty inches from the scanner. This added versatility to CCD scanners which previously were limited to contact and close range, now allowing the CCD scan engines to be incorporated in fixed scanner systems, such as are used at retail checkout counters.

Considerable attention has been directed toward the scanning of two-dimensional bar codes, which can store about 100 times more information in the same space occupied by a one-dimensional bar code. In two-dimensional bar codes, rows of lines and spaces are stacked upon each other. The codes are read by scanning a laser across each row in succession in a zig-zag pattern. A disadvantage of this technique is that it introduces the risk of loss of vertical synchrony. It also has the disadvantage of requiring a laser for illumination of the bar code, which makes the scanner more expensive.

In all types of optical codes, i.e., one-dimensional, two-dimensional and even three-dimensional (multi-color superimposed symbologies), the performance of the optical system should be optimized to provide the best possible resolution, signal-to-noise ratio, contrast and response. These and other parameters are controllable by selection of, and adjustments to, the optical components, e.g., lens system, the wavelength of illuminating light, the optical and electronic filtering, and the detector sensitivity.

A further disadvantage of scanning two-dimensional symbology is that it takes an increased amount of time and image processing power, i.e., increased microcomputer memory and faster duty-cycle processors. Nevertheless, since memory and high-speed processing chips are costly, it is desirable to limit increased capacity of these resources. On the other hand, increased image processing times invariably lead to customer dissatisfaction and subsequent loss of sales. What is needed are computer-implemented methods for increasing processing speed while efficiently conserving use of memory and not excessively overburdening the central processor.

It would also be advantageous if a scanning device employing such efficient computer-implemented processes further was efficient in its use of power without sacrificing speed or image processing quality. Image processing quality is a measure of good and accurate reads of the target symbology.

There is also a need for scanners having variable depth of field with means for aiding an operator in framing symbology so that is captured in the appropriate field of view.

It would be an advancement in the art if a scanning device having the above-mentioned advantageous qualities was also able to scan a plurality of symbologies within one optically scanned image field, and then separate or segment the image field into individual symbology fields. It would be desirable to allow the individual fields to be decoded and digitably scanned back onto the image field. This would increase throughput speed of reading symbologies. An example of a situation where fast throughput is required is that of processing moving packages with symbologies containing information being attached or imprinted thereon.

SUMMARY OF THE INVENTION

It is an advantage of the present invention to provide an optical scanner or imager reader for reading optically encoded symbols located at variable distances from the reading device using LED light sources and CCD detectors by providing a zoom mechanism enabling variable depths of field.

It is another advantage of the invention to provide an optical reading device which can capture in a single snapshot and decode one- and/or two-dimensional symbols and images.

Still another advantage of the present invention is to provide an optical reading device to decode optical symbols having a wide range of feature sizes.

Yet another advantage of the present invention is to provide an optical reading device which can read symbologies omnidirectionally.

A further advantage of the present invention is providing all of the above advantages in an optical reading device, and including a microcomputer with a communication interface for uploading image data and downloading image processing software to and from a host computer.

A still further advantage of the present invention is to provide all of the advantages above-described while efficiently using the microcomputer's memory and without unduly burdening its central processing unit while efficiently conserving power.

Yet another advantage of the present invention is to provide all of the above-described advantages without sacrificing processing speed or image processing quality and while providing the ability to segment a plurality of images from the same image field for high throughput speed.

Another advantage of the preset invention is to provide all of the above advantages including a laser aiming system to assist a user in aiming the optical device for a respective variable depth of field. The aiming system includes diffractive optics for creating beamlets that are aimed by refractive optics on a rotatable refractive optical mechanism that is angularly displaced in response to movement of the zoom lens.

In an exemplary embodiment, the optical scanning head comprises a one or more light emitting diodes (LEDs) mounted on each side of a printed circuit board to emit light at different angles, so that a diverging beam of light is created. To accomplish this, the LEDs may be oriented so that all LEDs are directed at some non-zero angle from a line perpendicular to the window through which the light is emitted. The number of LEDs can be varied depending on the intensity of light desired and the application. For example, a scan of a two-dimensional bar code may require more LEDs, generally in a double light arrangement, while a one-dimensional bar code needs only one row. A single scanning head can be made with the ability to select one- or two-dimensional scanning by including a trigger or other switching means which activates the appropriate number of LEDs. The LEDs can be arranged in a number of different groupings, such as in a "V"- or "U"-shape, or in single or parallel lines. In an alternate embodiment, the LED array can be replaced with a flash lamp, which provides more intense light for scanning at greater distances.

The optical module includes a light shield or "dark room" and a lens/filter assembly which provides control of the depth of focus of the scanner. The dark room isolates the optical module from the illumination LEDs and extends at least from the entry of the lens/filter assembly to the detector. The detector, made up of a CCD array, is mounted on the PCB at the focal plane of the lens/filter assembly and at the back of the dark room for detecting the light intensity in the reflected beam over a field of view across a bar code symbol. The portion of the dark room that extends between the lens assembly and the detector may have a plurality of baffles formed therein to capture scattered light generated by both the incoming light and by reflections from the front of the detector, preventing this scattered light from becoming noise at the detector. The magnification of the lens/filter assembly is optimized to completely fill the CCD array, allowing a wide range of depth of field. The CCD array may consist of a single linear arrangement, a double linear arrangement, or a matrix arrangement.

The imaging optics of the lens/filter assembly provide a dual field of view by changing its effective focal length. The imaging optics include a simple zoom lens comprising a group of three or four lenses, at least one of these lenses having means for movement relative to the other lenses if the field of view is to be changed. The dual or multi-field of view permits modification of both focal length and the width of the field of view. The zoom mechanism is a small motor or solenoid. The zoom lens is automatically operated at predetermined intervals to change the field of view. An apodizing filter with decreasing transmittance radially across the pupil may be added to the imaging optics to improve the depth of focus.

A light transmissive window is positioned in front of the LEDs for manipulating, homogenizing and/or focussing the light. The window may include a filter and/or anti-reflection coating.

The window may be configured to have a double radius for focussing at two different focal distances, and may be "knurled" or scalloped to homogenize the light. For optimum efficiency, the window is located at a distance in front of the LEDs coinciding with the greatest concentration of light. It may also include a holographic diffuser to homogenize the light.

The CCD detector array generates an electrical signal indicative of the detected intensity of the light reflected from the symbol or image. The captured image is stored in a frame memory as a signal which is conveyed to a signal converter consisting of an analog filter and analog-to-digital conversion circuitry to filter noise and digitize the analog signal to generate data descriptive of the bar code symbol. An automatic gain control, edge detection or highly-adaptive thresholding is provided to adjust the magnitude of the received signal to a pre-determined level, regardless of the distance between the bar code and the scanner and the ambient illumination. In an alternate embodiment, the output of the CCD array will be fed to the input of the A/D converter. The reference voltages in the A/D converter will be selected to maximize the full scale range of the A/D for the offset voltage from the CCD. The reference voltage $V_{REF}$ for the A/D may be programmable to maximize the sensitivity for low light level situations. The output of the A/D converter will be latched for reading by the microprocessor, so the output value may be read while the next conversion is in progress. Each of these techniques look, in effect, at the slope of the waveform produced when a bar code is scanned (while the ideal signal would be a set of rectangular pulses, the real signal has a rounded form because of the convolution distortion). However, using an appropriate optical model for selecting the optical system components, the effects of distortion of the square wave signal can be minimized.

The optical scanning head is powered by a DC source or battery, preferably rechargeable, which provides DC voltage to the LEDs and CCD detector in response to a clocked signal which is provided by a drive clock sequencer and synchronization module. The timing signal can control a gradual, serial illumination of the LEDs and controls and coordinates the activation of the CCD detector in order to minimize power consumption during scans. Alternatively, the voltage supplied to the LEDs can be modulated in response to the level of the signal produced by the CCD detector. If an optical symbol is scanned at close range, a lower level of light will provide a strong signal. However, at greater distances from the symbology, higher light intensity may be necessary to achieve a good quality signal at the CCD detector. Power is conserved in the latter version by not providing full power to the LEDs, detector or processing hardware unless necessary.

An aiming or spotting beam consisting of a coherent or incoherent light source with its own optics may be provided to assist the user to capture the image in the detector. The aiming light source comprises a high purity light so that it is easily discernable from both ambient light and the illumination light provided by the LEDs. Diffractive or similar optics are used to create multiple light spots at the target to define the corners and/or edges of the field of view. In the dual field of view (FOV) embodiment, two separate sets of aiming optics are provided, one corresponding to each focus position. In one embodiment the light spots are aimed by refractive optics.

Mathematical models are provided to assist in selection of appropriate optical components for optimizing performance of the optical scanner at a wide range of field depths and angles. The optical components are fixed in position relative to each other so that no position adjustments are required to obtain a reading at a desired distance once the optical components are optimized. Among the parameters that are considered are LEDs for emitting light within specific wavelength ranges, optical filters, lens focal lengths, magnification, etc. The Fourier transform of the input square wave signal is used to generate the appropriate resolution values. Selection of appropriate optical components is dependent upon the intended operation of the scanner. For example, depth of field is considered, as is scan angle and density of the code to be read. The mathematical models are based upon the modulation transfer function (MTF) of the optical system, calculation of which is generally known in the art.

In one embodiment, the present invention includes a microcomputer including memory and a processing unit and being coupled for communication with a host computer for uploading optically scanned image data and downloading image processing software to and from the host. Certain computer-implemented processes are addditionally provided on the host and are also stored in memory on the microcomputer for fast image processing power conservating image recognition and segmenting. This embodiment also includes a rotatable refractive optical mechanism that spins in response to movement of the zoom lens to aim beamlets formed by diffractive optics operating on laser beams to assist an operator in capturing symbology in the selected depth of field.

BRIEF DESCRIPTION OF THE DRAWINGS

Understanding of the present invention will be facilitated by consideration of the following detailed description of preferred embodiments of the present invention, in view of the accompanying drawings, in which like reference numerals refer to like or similar elements, and in which:

FIGS. 7a through 7g are plots of clock pulses for different timing configurations with respect to activation of the scanner (FIG. 7a); alternate illumination cycles (FIGS. 7b, 7c and 7d) according to the present invention; analog reset of the detector (FIG. 7e); and illumination patterns according to prior art methods 1 and 2 (FIGS. 7f and 7g);

FIG. 8 is a block diagram of the operational sequence of the optical scanning head according to the present invention;

FIG. 18a shows two rows parallel to the front of the PCB; FIG. 18b shows two rows generally parallel to the sides of the PCB; FIG. 18c shows two parallel rows arranged vertically in a plane perpendicular to the PCB; FIG. 18d shows two parallel rows arranged horizontally in a plane perpendicular to the PCB; FIGS. 18e–h show variations of combined vertical and horizontal arrangements in a plane perpendicular to the PCB, respectively;

FIGS. 29a through 29e are plots of the timing diagram showing the scanner configuration with respect to activation of the scanner, showing the scan direction (FIG. 29a); activation of the LEDs and the exposure time (FIG. 29b); dumping of the CCD (FIG. 29c); read gate time (FIG. 29d); and data (FIG. 29e);

FIG. 30 is a plot of the video output signal of the CCD;

FIG. 31 is a plot of the microprocessor output signal;

FIGS. 49a–d are diagrammatic views of another exemplary embodiment of a scanning device, wherein FIG. 49a is a top plan view, FIG. 49b is a side plan view, and FIGS. 49c and 49d are back and front views, respectively;

FIG. 51 is a schematic of the frame locator optics included as part of the scanning head of FIGS. 49a–d;

FIG. 53 is a more detailed diagrammatic view of the framing locator optics of FIG. 51;

FIG. 57 is a flow diagram illustrating the operational sequence of initializing the SDRAM of FIG. 52 under control of the monitoring software illustrated in FIG. 55;

DETAILED DESCRIPTION OF THE PREFERRED EMBODIMENTS

Figure 1:
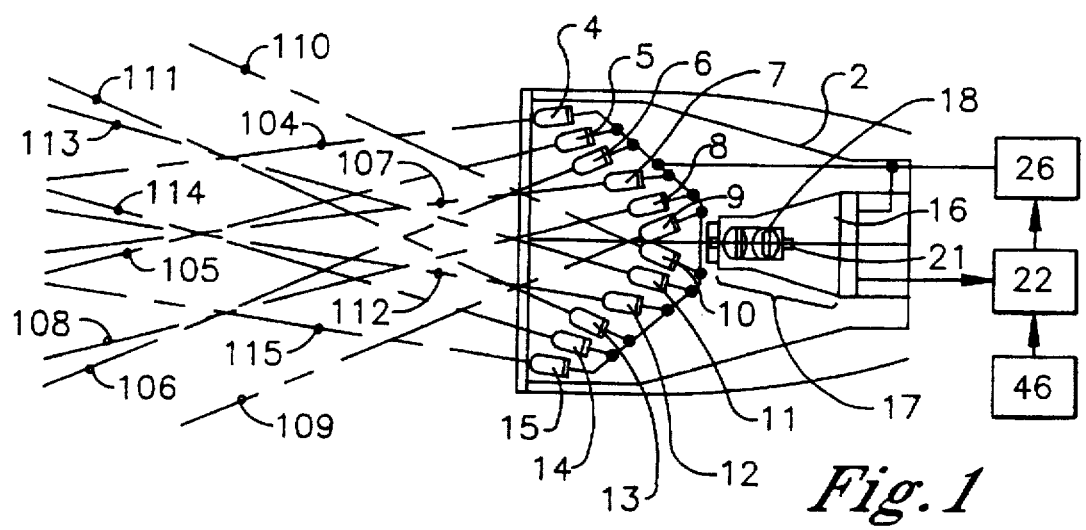
FIG. 1 is a diagrammatic view of the relative layout of the LEDs, optical module, and detector on a printed circuit board.
Figure 5:
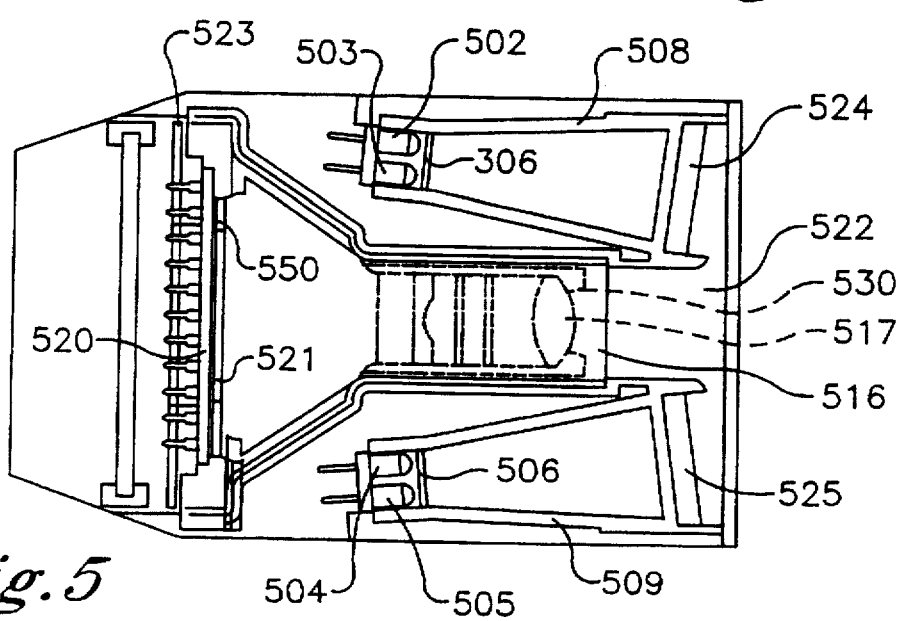
FIG. 5 is a diagrammatic top view of a second exemplary embodiment of the scanning head.

The scanning head module illustrated in FIG. 1 comprises the printed circuit board (PCB) 2 configured as a generally "U"- or "Y"-shaped surface onto which is mounted a plurality of LEDs arranged in an orientation that results in projection of a light ray by each LED in a direction to create a diverging beam consisting of the combination of the light from of all LEDs of the plurality. In the embodiment of FIG. 5, four LEDs (LEDs 502–505) are used, with two on either side of an optic module, and in the embodiment of FIG. 17, two LEDs (LEDs 1702 and 1704) are used. Forward of the LEDs is window/diffuser/lens 24 which is light transmissive and provides homogenization and focusing of the light path of the illuminating beam incident upon the bar code to be scanned. As illustrated in the embodiment of FIG. 5, a separate window 524, 525 can be provided for each side of the PCB, placed in front of the corresponding LED(s) on that side. Reflected light carrying the intensity modulated symbol is directed back to the optic module and to the detector. Similarly, for the embodiment of FIG. 17, separate windows 1724, 1725 are provided for each LED 1702, 1704.

The scanning head configuration illustrated in FIG. 1 has 12 LEDs mounted on the PCB 2 in a "V"-shape. These are identified as LEDs 4 through 15, which emanate rays of light 104 through 115. The portion of printed circuit board 2 from which LED light emanates will be considered the front of the board. A line of reference for describing the orientation angles of the LEDs runs perpendicular to the front of the PCB 2. At the approximate center of the board, behind the LEDs, an optical module 17 consisting of one or more light shields (dark room 16), in which is contained lens assembly 11 which filters and focuses light reflected from a scanned bar code onto CCD detector 20, is disposed behind the optical module at its focal plane. The detector 20 can be disposed directly on the PCB 2, or on a separate printed circuit board 523, mounted on and electrically connected to PCB 522, as shown for detector 520 in FIG. 5. A signal generated by activation of the CCDs by the reflected light is conveyed to signal converter 22 which consists of an analog filter and an analog-to-digital circuit.

The scanning head may also include a decoder module 26 which decodes a multiple-digit representation of bar code symbols such as UPC, EAN, JAN, Code 39, Code 2/51, Code 2/5, Code 128, Codabar, Plessey, and other optical encoding systems. (It should be noted that, while most optical encoding techniques of this nature are generically called "bar codes", some types of printed codes exist which may not be in the form of parallel bars. For example, a concentric target-type code is in use which involves alternating concentric rings of varying widths. The code systems that incorporate non-bar-type codes are also appropriate for measurement by the optical scanning system described herein and are considered to be included in the general category of bar codes for purposes of this description.) In some instances in the present disclosure, the images or symbols may be referred to as "optical symbols", which includes bar codes as well as other types of symbologies in which data is encoded and two-dimensional images.

Figure 2A:
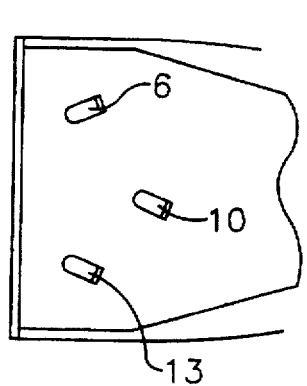
FIGS. 2a, 2b and 2c are diagrammatic views of relative locations of LEDs for one trio, two trios and three trios of LEDs, respectively, in a first exemplary embodiment of the scanning head.
Figure 2B:
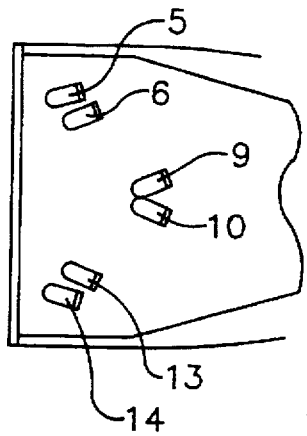
Figure 2C:
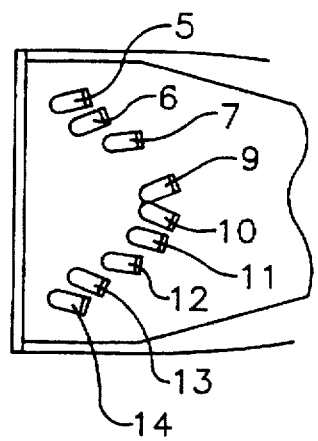

A first exemplary embodiment of the light source illustrated in FIG. 1 consists of 12 LEDs which are mounted in a generally V-shaped configuration on the PCB 2 so that they point outward at angles such that groupings of three on a single leg, e.g. LEDs 4, 5 and 6 or 13, 14 and 15 form substantially a single beam of light which expands at increased field depth. An example of the groupings of the LEDs are illustrated in FIGS. 2a, b and c, showing 3, 6 and 9 LEDs respectively. The 12 LEDs shown in FIG. 1 are divided into groups of three, or trios, of LEDs. From this, and FIGS. 2a–2c, it can be seen that a given trio of LEDs is not determined by serial progression of the LED's location in the V-configuration, but rather that the combined illumination of the trio substantially fills the window 24 or exit opening and expands therefrom to form a fan of light to facilitate detection of bar codes which are wider than the window itself. This general principle is applied to any configuration of the LEDs, i.e., that the combined light of the LEDs substantially fills the window or exit opening and expands into an increasingly wider beam.

Figure 18A:
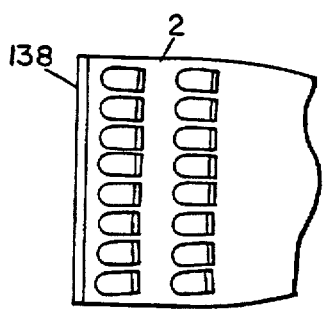
FIGS. 18a through 18h are diagrammatic views of LED orientation for two-dimensional scanning.
Figure 18B:
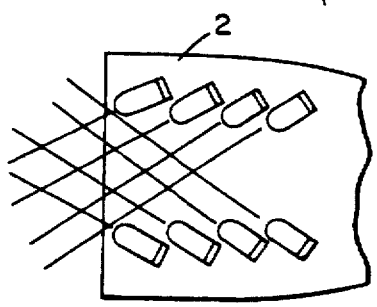
Figure 18C:
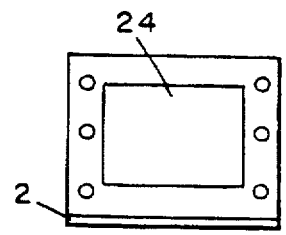
Figure 18E:
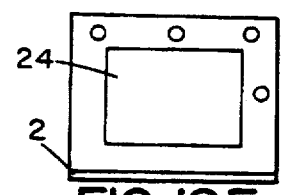
Figure 18D:
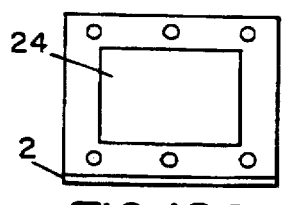
Figure 18F:
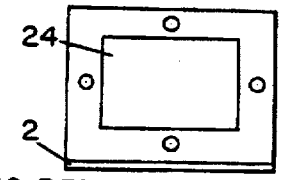
Figure 11:
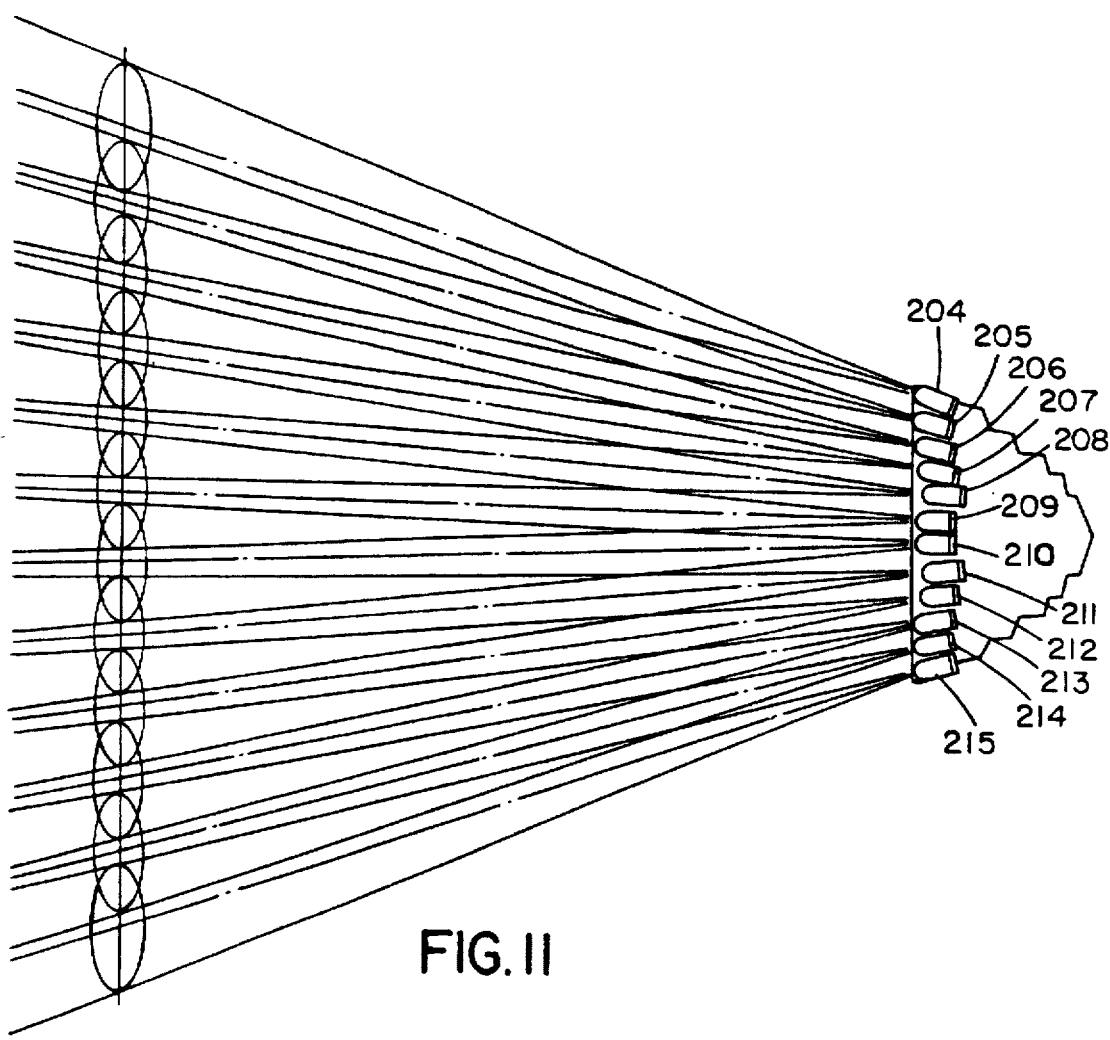
FIG. 11 is a diagrammatic view of a third alternate LED layout and its corresponding light distribution.
Figure 18G:
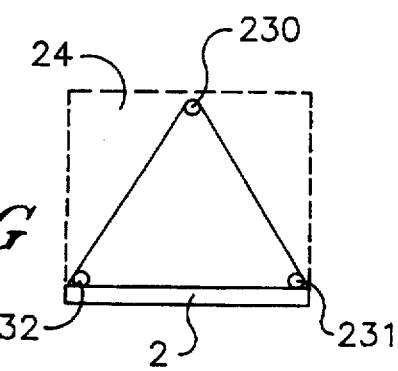
Figure 18H:
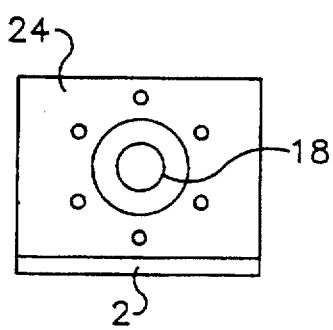

Other alternate configurations for arrangement of the LEDs can be a "U"-shape or generally straight line across the front of the board, as illustrated in FIG. 11. For two-dimensional bar code scanning, the variations can include two linear rows of LEDs, parallel to the front of the PCB 2, or two linear rows of LEDs perpendicular to the front of the board, as illustrated in FIGS. 18a and 18b, respectively. Combinations of parallel and perpendicular rows may also be used. A multi-tiered arrangement can be used for positioning the LEDs; with, for example, one row above the other, as in FIG. 18c, or with two vertical rows extending upward from PCB 2, as in FIG. 18d, or any combination thereof. In FIG. 18e, a possible combination consists of one row of LEDs running across the upper row, and a single LED on one side, and in FIG. 18f, a single LED is located on each of four sides in a vertical plane. In FIG. 18g, the LEDs are configured in a vertical plane in a triangular distribution, with LEDs at each corner of the triangle. In this configuration, the upper LED 230 may be mounted on the upper interior wall of the housing and the lower LEDs 231,232 can be mounted directly on the PCB 2. In FIG. 18h, the LEDs are arranged in a circular pattern in the vertical plane with the circular pattern generally concentric with the optical axis of the lens assembly 18, which provides homogenized light to the target. In each case, the fan of light is created by orienting the LEDs so that they project their light at different angles to combine to create a divergent beam. In the straight line configuration of FIG. 11, the centermost LEDs 209 and 210 are turned to point away at an angle of 1.625 degrees from a line normal to the front of the board. Progressing outward, each LED is 3.25 degrees from the inner adjacent LED.

In the embodiment of FIG. 5, the LEDs are grouped in pairs 502–503, 504–505, and mounted on opposite sides of the PCB 522. A horizontal slit 506 is disposed in front of the LEDs to enhance beam uniformity. The combined beam of each LED pair is collected and redistributed by a single lens element 524, 525 to define a square region corresponding to the wide field of view with a uniform illumination profile. In the preferred embodiment, the single lens element is a diffractive optical element (DOE), although a holographic optical element (HOE) may also be used. The LED pairs and single lens elements are positioned to emit light so that the beam diverges at greater distances from the front of the scanning head.

Figure 32:
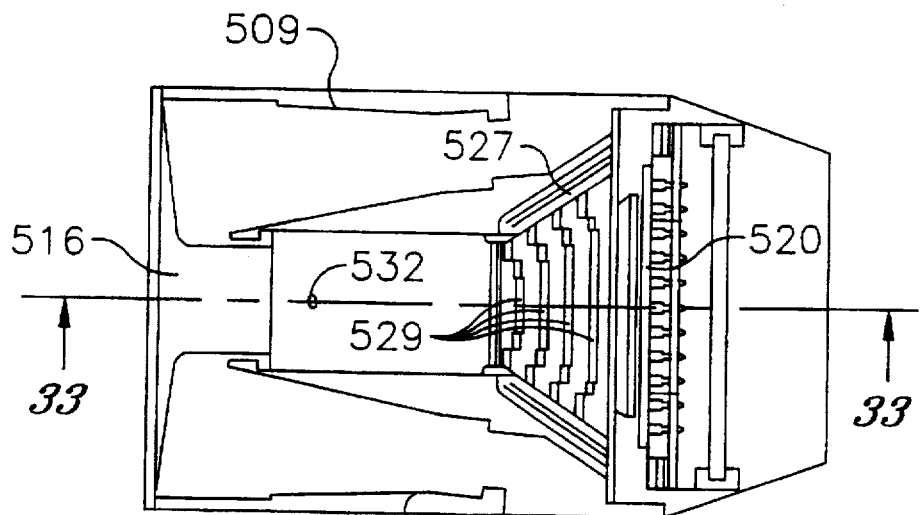
FIG. 32 is a diagrammatic view of the dark room assembly and baffles as mounted on the printed circuit board.

The LEDs 502–505, the slit 506 and the diffuser/lens 524 are all enclosed within a dark rooms 508 and 509, as shown in more detail in FIG. 32, which can either be separate from or integral with dark room 16 of the embodiment of FIG. 1 described below. If dark rooms 508 and 509 are formed integrally with dark room 516, as may be convenient for manufacturing purposes, they must be isolated from dark room 516 so that the light from the LEDs does not enter the enclosure surrounding the lens assembly 517 and detector 520.

Figure 33:
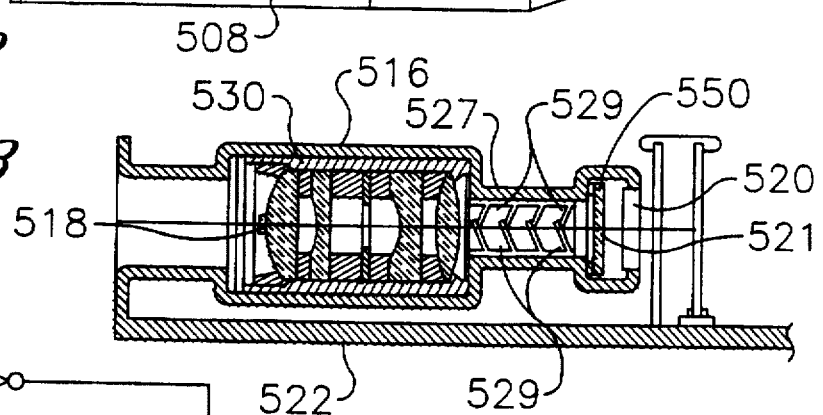
FIG. 33 is a cross-sectional view taken along line 33—33 of FIG. 32.

After the light produced by the LEDs is reflected from the target bar code it is collected by optic module 517 which comprises a number of focusing lenses mounted inside a lens support 530, all of which are retained within dark room 516. Baffle section 527 of dark room 516 extends to cover the space between the lens assembly 518 and the detector 520. The details of baffle section 527 are best shown in FIG. 33, where it can be seen that each baffle 529 runs horizontally with respect to the PCB 2, extending at an angle into the optical axis 532 and in the direction of the incoming reflected light. The use of the dark room baffle section 527 is analogous to a high power laser shingle calorimeter. The concept of the shingle calorimeter is to capture all of the energy that goes into the system. In the case of the baffles in the darkroom, all of the stray, scattered and reflected light from both the incoming signal and the reflections from the glass shield 521 over the detector 520 is captured. The baffle spacing and angle of slant towards the incoming beam allows for capture and subsequent absorption of scattered and stray light coming out of the signal beam. Analysis suggests that the absorption will be complete after three internal reflections off of the baffles 529. Light reflected back from the detector cover glass 521 will strike the baffles 529 at a 75° angle and send the light ray down into the second set of baffles. The angle of the baffles insures that reflected light will ultimately be absorbed in the baffle system and not re-reflected back to the detector 520.

Another feature which cuts down noise at the detector 520 is a light absorptive mask or frame 550 which frames the detector 520 to reduce reflections from the cover glass 521 of the detector. Mask 550 also reduces the possibility of light reflecting at an odd angle off of the baffles 529. Generally, the mask 550 becomes a primary field stop of immediate reflected light from the cover glass 521 and a secondary field stop for any stray light from the baffles 529.

Figure 17:
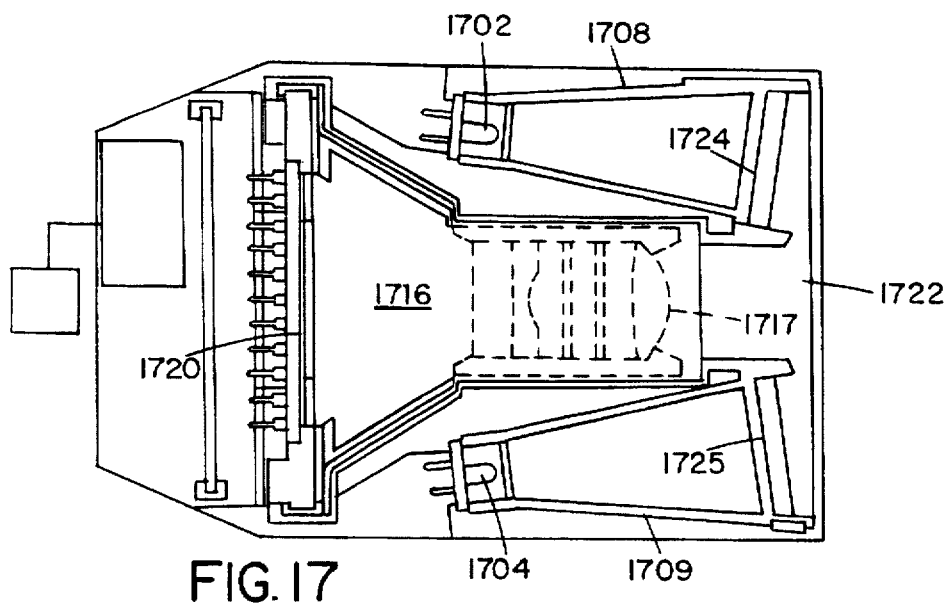
FIG. 17 is diagrammatic top view of a third exemplary embodiment of the scanning head.
Figure 27:
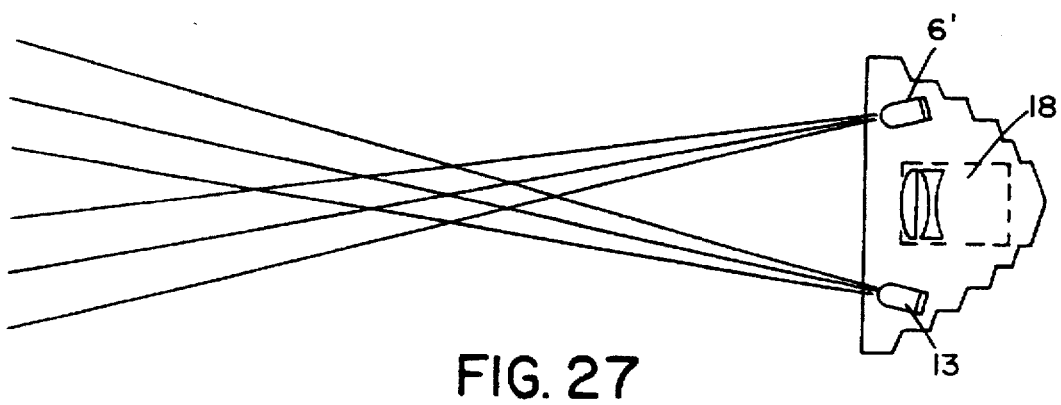
FIG. 27 is a diagrammatic view of the light distribution for the embodiment of FIG. 17.

As an alternative to the above LED distributions, FIG. 17 illustrates a configuration using only two LEDs 1702 and 1704, with one LED positioned on each of the opposite sides of the optical assembly 1717. As above, the LEDs are positioned to emit light at a non-zero angle with respect to a line running perpendicular to the front of the PCB 1722 or scanner housing opening. A single lens element 1724, 1725, such as the ones described above, for manipulation of the light from each LED, is also used. The dark room components 1708, 1709 and 1716, as well as detector 1720, are configured as in the embodiment of FIG. 5. The illumination pattern of this LED configuration is illustrated in FIG. 27.

The LEDs for one- and two-dimensional scanners are selected so that they emit light at the wavelength of approximately 660 nm, red light, or 590 nm, amber light. Generally, LEDs which emit light within the wavelength range of 400 to 700 nm may be used. This wavelength range provides optimal contrast for bar code scanning applications in which dark and light bars must be distinguished. (For three-dimensional bar codes, two or more distinct wavelengths of light are selected, one of which may be 660 nm.) Infrared light also provides enhanced contrast, so that LEDs emitting light outside of the visible spectrum may be used. LEDs of differing colors may also be used. The optimum scanning wavelength is determined by measuring several color and black and white codes of various types using a photometer. In the preferred embodiment, the LEDs have a peak wavelength of 592 nm. The incoherent light produced by the LEDs may be replaced by coherent light from by laser diodes, helium-neon lasers or other coherent light sources as long as the appropriate mechanical means, such as a rotating reflective surface, are provided to spread or scan the spot to generate the light.

Figure 28:
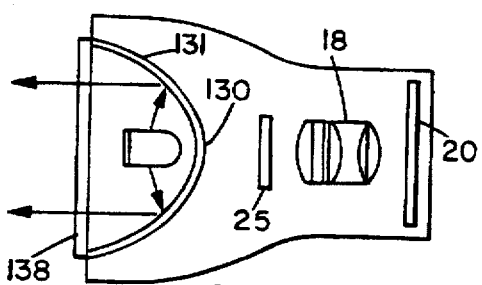
FIG. 28 is a diagrammatic view of a single light source with a parabolic reflector.

An alternate light source is a flash lamp 130, or any other intense light source, illustrated in FIG. 28. Flash lamps are available to emit light at a number of different wavelengths. The wavelength at which the selected flash lamp emits light will be determined by the color of the bar code(s) and the background, so that the best possible contrast is obtained. A parabolic reflector 132 is included within the optical scanning head assembly with the flash lamp 130 at its center. This allows the maximum amount of light to be directed forward for illumination of the bar code. The higher intensity light will permit scanning at distances greater than 35 inches.

A sample test for bar code contrast measurement involves placing the targets in uniform illumination (from a standard white light source) and measuring the photopic reflectance with the meter. In such a test, the following references were measured:

TABLE 1

| Target | Reflectance (cd/m$^2$) |
|---|---|
| Standard white card | 330 |
| Standard black card | 14.0 |
| White bar | 300 |
| Black bar | 22.0 |
| Red bar | 97.0 |
| Blue bar | 114.0 |
| Green bar | 140.0 |

Another consideration in selection of LEDs is based upon the detectors to be used. The selection of the operational wavelength of an LED with a particular type of CCD is determined by two parameters: first, the spectral responsivity of the CCD in volts/lumen (V/L) or volts/watt (V/W) and, second, the total luminous flux output F in lumens (L) of the LED. The evaluation to determine the relative figure of merit between any combination of LEDs and CCDs is given by the following equation:

$$V_{out} = \int V(\lambda) F(\lambda) d(\lambda) \quad (1)$$

where $V(\lambda)$ is the CCD spectral sensitivity in volts/lumen/micron and $F(\lambda)$ is the flux output in lumens/micron of the LED. The normalized relative spectral sensitivity is given in FIG. 4-3 of the Sony data sheet for the ILX503. The flux output F is given by the maximum luminous intensity $I_v$ (lumens/steradian) times a constant determined by the radiation pattern of the LED. The constant is the integration of the relative luminous intensity as a function of angular displacement. This constant of integration is provided in the Hewlett-Packard data book (in FIGS. 7 and 8) and is labeled as $\phi_v(\theta)/I_v(0)$. The following LEDs were evaluated to determine the highest relative output voltage:

TABLE 2

| LED | $\lambda_{ok}$(nm) | $V(\lambda)$ | $I_v$ (l/sr) | $\phi_v(\theta)/I_v(0)$ | $V_{out}$ |
|---|---|---|---|---|---|
| HLMA-CL00 | 590 | 0.9 | 1.3 | 0.180 | .22 |
| HLMP-8104 | 650 | 0.7 | 4.0 | 0.115 | .32 |
| HLMP-8100 | 650 | 0.7 | 0.7 | 0.290 | .14 |
| HLMP-8150 | 650 | 0.7 | 15.0 | 0.016 | .17 |

(* Since the CCD is optically filtered, the expression for $V_{out}$ can be approximated by a delta function.) For purposes of this exemplary embodiment, the HLMP-8104 was found to be the most efficient, offering 1.5 times the output of the next lower LED at 650 nm.

Several radiometric measurements were made on the HP-8103 LED (5 mm diameter) to make observations on the coupling efficiency of this LED with several off-the-shelf lenses. The LED was biased to 20 mA and the following was recorded:

TABLE 3

| Distance (inches) | Lens | Reading in eV Center | Line |
|---|---|---|---|
| 1.0 | no lens | 10.0 | — |
| 16.0 | no lens | 8.0 | — |
| 7.0 | 1 cylindrical | 8.5 | 5.0 |
| 1.0 | 1 cylindrical | 10.0 | 6.5 |
| 6.0 | 1 collection/cylindrical | 6.2 | 6.0 |

The cylindrical lens used is a Melles Griot 19.0 mm focal length and the collection lens is a piano-convex Germanon-Simon 15.3 mm focal length. The conversion from eV to luminance is given in Table 4 for the Minolta photometer. The units are candel/m² which is equivalent to lumens/sr-m². From these measurements, it would be reasonable to assume a luminance of 10.0 cd/m² for distances of 7" or less.

TABLE 4

| eV | cd/m² |
|---|---|
| 1 | 0.28 |
| 2 | 0.56 |
| 3 | 1.10 |
| 4 | 2.20 |
| 5 | 4.5 |
| 6 | 9.0 |
| 7 | 18.0 |
| 8 | 36.0 |
| 9 | 72.0 |
| 10 | 144.0 |

In a second exemplary embodiment, the LEDs were selected with the following criteria:
Peak output wavelength: 592 nm
Input voltage: 5V
Current draw: 50 mA max.
Luminous efficacy: 480 lumens/W
Peak intensity: 6000 mcd
LED lens: untinted and undiffused
Collection lens: single element refractive/binary diffraction lens of fused silica, glass or photopolymer
Input source intensity distribution: 7–8 degree lobe
Output illumination distribution: 80% uniformity over a wide field of view; 90% uniformity over a narrow field of view
Area fill: coverage over the wide field of view of the imaging lens Table 5

The objective of the optical system design is to achieve sufficient resolution on the object distance within the depth of field. These parameters may be obtained with a number of different lens combinations ranging from three to five or more lenses. After computer simulation of ray traces, a combination of four lenses was selected to provide the desired performance. In first exemplary embodiment, the overall optical system specification calls for an object distance of 175 mm, a nominal magnification of 0.32, a nominal f/number of 26.0, effective focal length of 36.52 mm, total field of 26.5 degrees, track length of 19.49 mm and overall length of 46.89 mm. The MTF at best focus is >0.5 at 25 lines/mm.

The optic module 17 of the first exemplary embodiment of FIG. 1 consists of four lenses mounted inside a slidable lens support 21, all of which are retained within dark room 16. The selection of the four lenses of which the lens assembly 18 is formed depends upon the desired reference plane, i.e., the desired depth of field, defined as the distance between the front window or diffuser and the bar code being scanned. The lens assembly, illustrated in the ray trace in FIG. 3, consists of a bandpass filter 34, a bi-convex lens 32 and piano-concave lens 38, a biconcave lens 36 followed by a bi-convex lens 40. The lenses may be coated with an anti-reflection coating and/or a pass-band coating to minimize reflectance at the interfaces between the adjacent lenses and at the ends of the lens assembly, as is known in the art.

Figure 26:
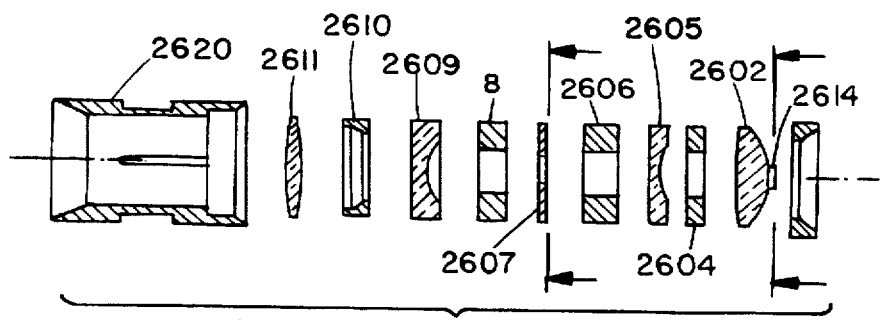
FIG. 26 is an exploded view of a second exemplary embodiment of the lens assembly.
Figure 39:
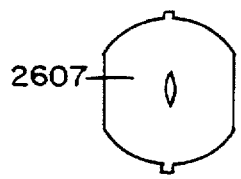
FIG. 39 is a diagrammatic view of a cat's eye aperture.
Figure 40:
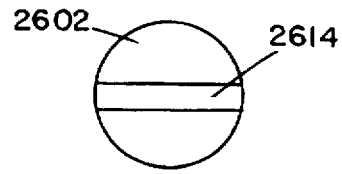
FIG. 40 is a diagrammatic view of a rectangular obscuration for use with the cat's eye aperture.

A second exemplary embodiment of the lens assembly 2618 is illustrated in FIG. 26 and consists of a bi-convex lens 2602 followed by a first spacer 2604, a biconcave lens 2605, a second spacer 2606, an aperture 2607, a third spacer 2608, a biconcave lens 2609, a fourth spacer 2610 and a bi-convex lens 2611, all of which fit into lens support 2600. Different lens combinations may be used with the object of focusing the incoming beam to provide the maximum useable light at the detector.

Table 6 lists the individual specifications that were identified for each lens in the first exemplary embodiment.

TABLE 6

| Lens | Focal Length | Total Track |
|---|---|---|
| 32 | 14.20 mm | 3.63 ± .03 mm |
| 38 | −32.11 mm | .60 ± .03 mm |
| 36 | −12.86 mm | 1.66 ± .03 mm |
| 40 | 35.18 mm | 1.41 ± .03 mm |

All lenses are made from BSC7 with a refractive index of 1.514 at 660 nm, have an aperture stop diameter of 1±1 mm with a tolerance of ±0.05 mm and have a single layer anti-reflective coating at 660 nm. The values will vary if different combinations of lenses and/or material are to be used, and the above specifications are provided as an example of one way of achieving the desired optical performance. Selection of appropriate lens combinations is within the level of skill in the art so long as the guidelines provided herein are followed. The following descriptions of the plots provided in the drawings are intended to emphasize the numerous considerations in selecting the appropriate optical system.

FIGS. 20 through 25 provide plots which assist in selection of appropriate lens combinations. FIG. 20a, a plot of field curvature/distortion, illustrates the position away from the plane of the CCD of best focus for all field angles expressed as distance in millimeters. For example, for a field angle of ±13° off-axis, the position of best focus is 2.00 mm behind the CCD array. For all other angles, the plane of best focus corresponds very closely to the CCD location.

Figure 20A:
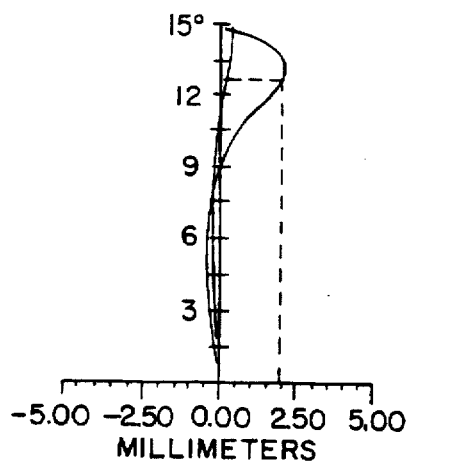
FIG. 20a is a plot of field curvature with field angle and FIG. 20b is a plot of percentage distortion with field angle.
Figure 20B:
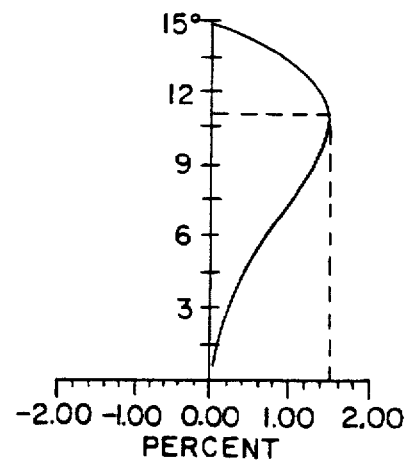

FIG. 20b plots percentage compression or expansion with field angle and provides the amount of compression or expansion of a bar width at the image plane in comparison with the true bar width expressed as a percentage. For example, if the true bar width on-axis is 6 mils wide, then at 11° off-axis, the bar width is 1.5% greater than 6 mil.

Figure 21:
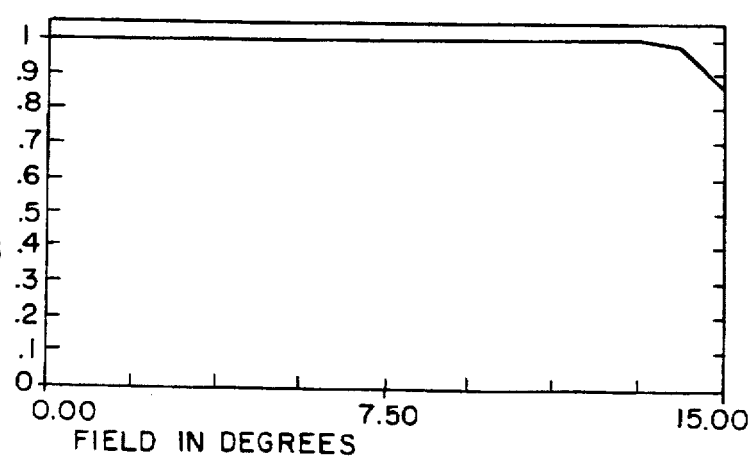
FIG. 21 is a plot of illumination uniformity as a function of field angle at the CCD.

Illumination uniformity as a function of field angle is charted in FIG. 21. The field angle values given in the plot are positive or negative angles with respect to "on-axis", so that the total field of view would be twice that value plotted, e.g., for 15°, the total field of view is 30°. The loss of illumination at increased field angle is due to aperture blockage or lens constraints.

Figure 22:
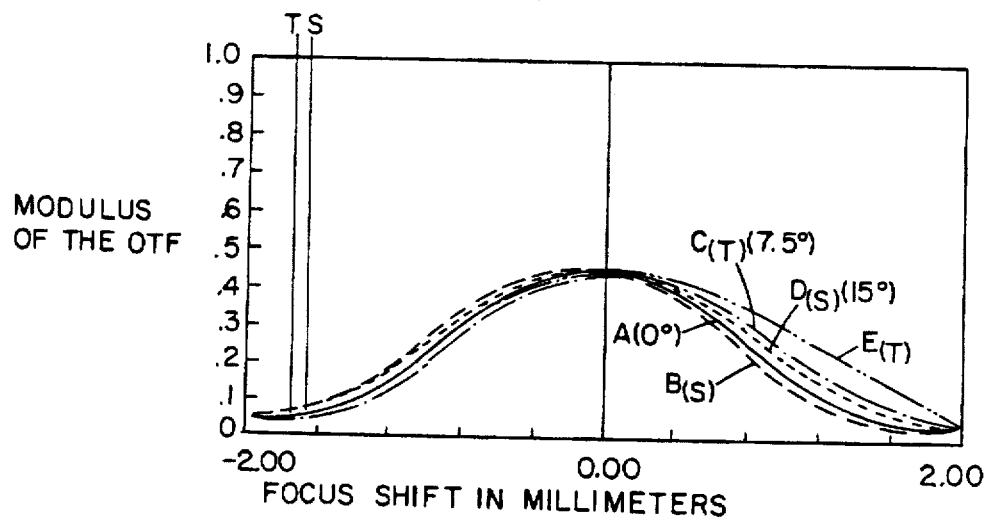
FIG. 22 is a plot showing contrast reduction with depth of focus for various field angles.

FIG. 22 is a plot of the diffraction through focus modulation transfer function (MTF). Five separate lines are drawn to indicate variation with field angle. Curve A shows the contrast reduction as the object is held at best focus while the image plane is moved in and out of focus for a field angle of 0°. (The x-axis of the plot is focus shift in millimeters.) For example, for a 30 line/mm resolution bar target, the contrast goes to zero when the image plane is moved in or out by more than 2.00 mm. Curves B and C are for a field angle of ±7.5° off-axis. Curve B is for sagittal rays and curve C is for tangential rays. Tangential rays only are images for the one-dimensional scanner, while two-dimensional scanner images use tangential and sagittal rays. Curves D and E are similar to curves B and C, respectively, but are for a field angle of ±15° off-axis.

Figure 23:
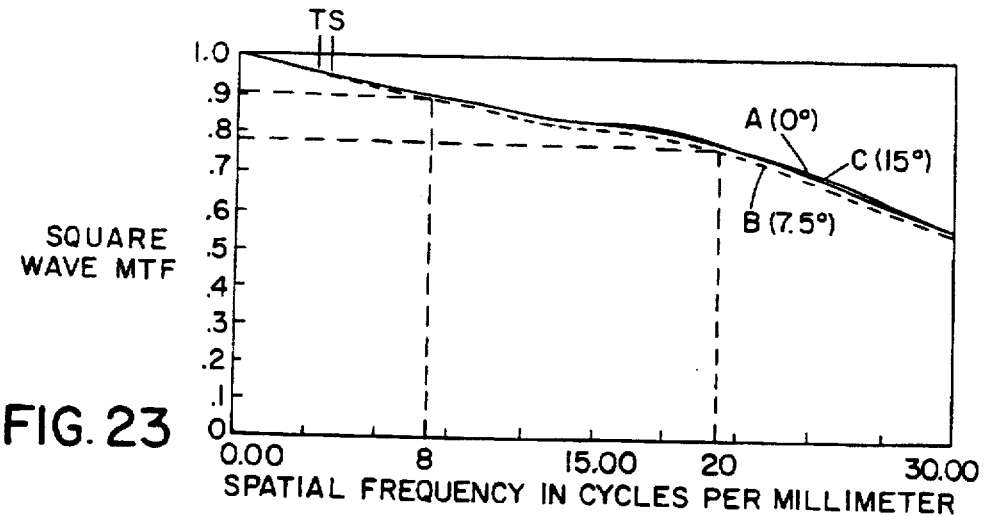
FIG. 23 is a plot showing contrast for all spatial frequencies at a distance of 5.5" from the scanning head.

FIG. 23 is a plot of diffraction square wave MTF with spatial frequency of the symbols (bar codes, etc.) to be read. Curve A provides the contrast of the optical system for all spatial frequencies at a distance of 5.5" for objects on-axis (0°). The plot is the same for tangential and sagittal rays for the on-axis case only for rotationally symmetric systems. Curve B is for a field angle of ±7.5° and curve C is for a field angle of ±15°.

Figure 24:
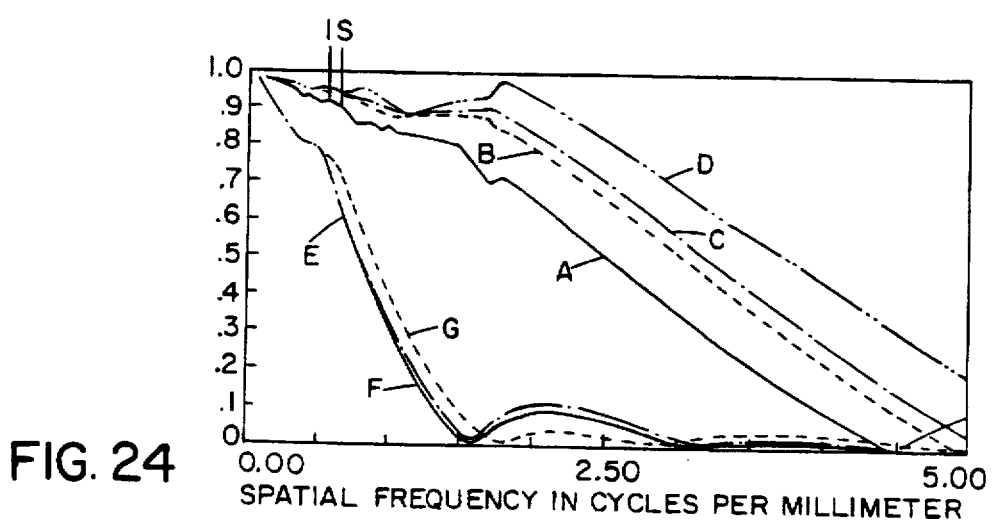
FIG. 24 is a plot showing resolution at various field angles at a given distance from the scanning head.

FIG. 24 is a plot of diffraction square wave MTF with spatial frequency of the symbol. Curve A is resolution with the scanner 20" from the symbol, on-axis (0°). Curves B,C and D are for on-axis, ±7.5° and ±15°, respectively at a distance of 16 inches from the code. Curves E, F and G are for on-axis (0°), ±7.5° and ±15°, respectively at a distance of 0.5" from the code which is being scanned.

Figure 25:
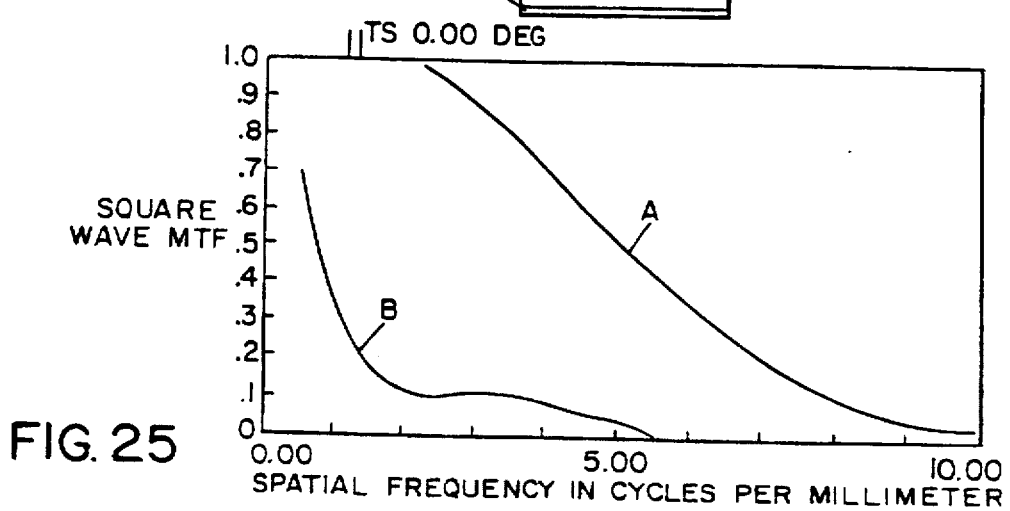
FIG. 25 is a plot of resolution at given distances from the scanning head.

FIG. 25 is a plot of resolution on-axis at 8.5" and 2" from the symbol, respectively.

Figure 3:
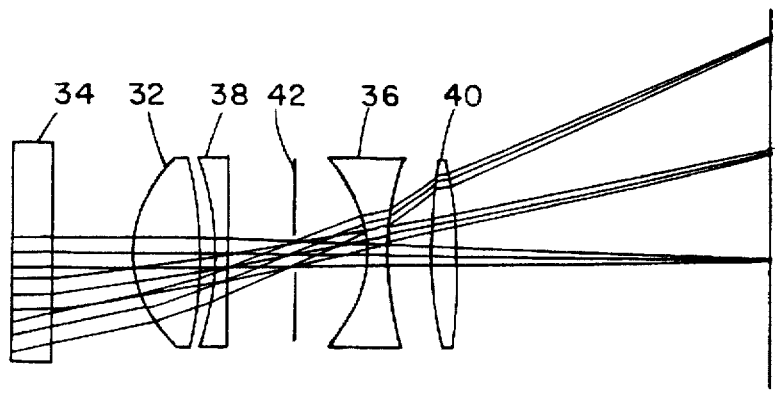
FIG. 3 is an exploded view of a first exemplary embodiment of the lens assembly.
Figure 13A:
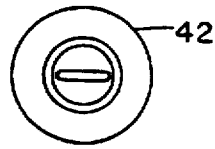
FIGS. 13a and 13b are front views of air slits/apertures for one-dimensional and two-dimensional applications, respectively, in a first exemplary embodiment.
Figure 13B:
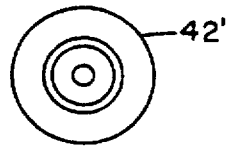

A spatial filter or aperture may be included within the optical module, disposed adjacent to, or even integral with, the lens assembly, as illustrated in FIGS. 3 and 26. In a first exemplary embodiment of FIG. 3, the spatial filter 42 is an air slit with an orientation and configuration corresponding to the shape of the bar code being scanned, or can be a circular aperture 42' as illustrated in FIG. 13b. For a one-dimensional bar code, a single slit, illustrated in FIG. 13a, is used. The slit is oriented vertically so that it is perpendicular to the direction in which the bar code is scanned. Alternatively, for a one-, two- or three-dimensional (multi-color, superimposed code) scanner, a single circular aperture 42' may be used. The bandpass filter 34 serves to block any radiation which falls outside of a wavelength range centered around 660 nm for red light, 590 nm for amber light, or wavelengths surrounding infrared light for the infrared scanner. For the visible light system, it is particularly desirable to filter the infrared and other visible portions of the light spectrum which may reach the window from the sensing region to provide optimal contrast. This improves resolution of bar codes read at a distances other than the best focus object distance of 5.5 inches. In the first exemplary embodiment, the filter specifications call for a center wavelength of 655 nm±6 nm, half bandwidth points (HBWP) of 50 nm±5 nm, average transmittance (HBWP) greater than 70%, leakage of less than 2% below 600 nm and above 700 nm, and coverage to 1 mm from all edges. The substrate material can include BK7, fused silica, quartz or Corning 7059.

Figure 41:
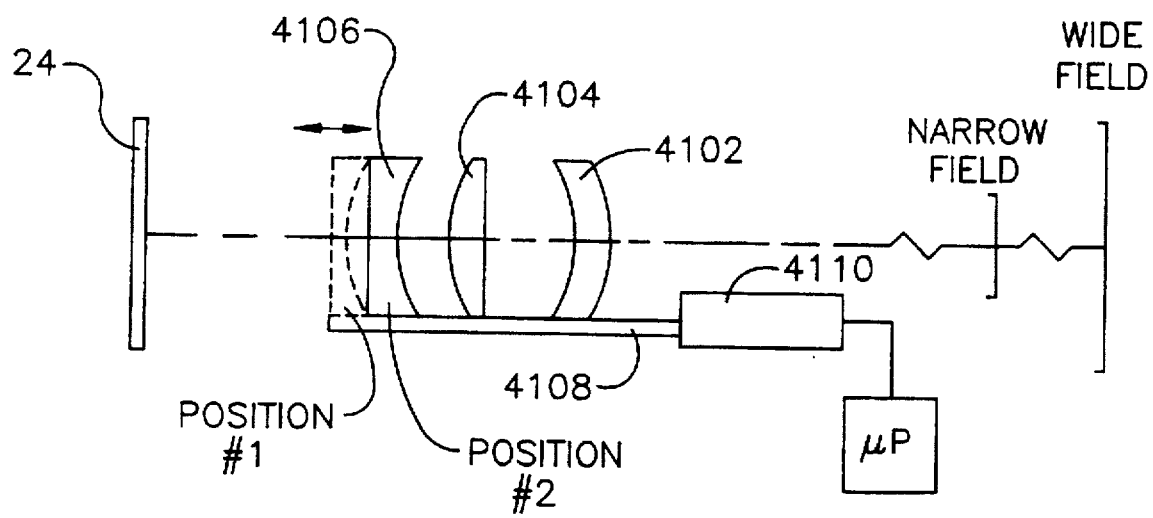
FIG. 41 is a diagrammatic view of the imaging optics for the dual focus embodiment.

In an embodiment which provides enhanced capability to read a wide range of depths of field, variable imaging optics are provided, as illustrated in FIG. 41. The imaging optics automatically change their effective focal length and f/number and, hence, the magnification, to capture, with sufficient resolution, symbologies having a variety of feature sizes that are frequently found in bar codes. The imaging optics may have several distinct, pre-determined positions. In the exemplary embodiment, two distinct depths of field, i.e., a short depth for focus of symbologies of small extent and high spatial density, and a long depth of focus for symbologies of large extent and low spatial density but distinctly different and single images, are used. This is distinguishable from the extended focus optical scanner disclosed in U.S. Pat. No. 5,210,398 of Metlitsky, which simultaneously collects the image at two distinct focal lengths. A dual field of view lens changes the effective focal length of the imaging optics from 7 mm to 21 mm and covers a semi-angular field of 10 to 30 degrees, varying the magnification with the changed focal length. Other designs can be derived having the same 3:1 ratio of focal length and field of view. Magnification at zoom position #1 is on the order of $\frac{1}{5}\times$ and the focal length is 21 mm. At zoom position #2, magnification is $\frac{1}{15}\times$ and the focal length is 7 mm. The field of view at zoom position #1 is 10° and 30° at position #2.

The optical design of the imaging optics, illustrated in FIG. 41, comprises the simplest possible zoom lens having three or four elements, and is a design of a reversed telephoto-type with a negative front singlet. Here, three elements are shown, consisting of a negative meniscus lens 4102, plano-convex lens 4104 and piano-concave lens 4106. Zoom capability is provided by movement of lens 4106 away from or toward lens 4104. This design is well corrected for apertures varying from f/8 to f/16. In a first exemplary embodiment, the aperture optically adjusts from f/11 to f/16. The lenses have optical aberrations corrected over the depth of field for both fields of view with respect to the minimum feature size anticipated. The zoom lens obeys the optical invariant as follows:

$$f_{min} \tan (\omega_{max}) = f_{max} \tan (\omega_{min}), \qquad (2)$$

where f is the focal length, and

ω is the half angle field of view.

The zoom lens further obeys the relationship that as the angular field of view coverage increases, the entrance pupil increases. It can either have a circular or square aperture. A circular aperture can be used for hexagonal symbologies, such as UPS bar codes (tradename "Maxi-Code"), while the square aperture can be used for PDF bar codes.

The lenses of the imaging optics may have an anti-reflection coating such as BBAR coating to reduce reflectance of light of the desired bandwidth from the lens surfaces and interfaces. An optional sunlight filter can be provided to eliminate noise from ambient light. Exemplary filters include Corning™ photochromic filter glass and a 20 nm bandpass filter centered at 590 nm.

Automatic variation of the focal length of the imaging optics is accomplished by attaching the zoom lens, specifically, lens 4106, to a shaft or track 4108 which is centered within the optical path so that no change occurs in the axial position of the focal plane. The drive means 4110 for the zoom function is provided by the same type of mechanism as would be included in a commonly available motorized zoom lenses for cameras, e.g., a small, light-weight DC servo motor or simple solenoid with a spring mechanism. Such mechanisms are well known in the art. Activation of the DC motor or solenoid (with dimensions on the order of 8 mm×10 mm×20 mm) is controlled by the microprocessor that controls the scanner. In a first exemplary embodiment, the zoom mechanism is a 3V DC motor with minimum 7.0 g-cm stall torque, or an equivalent solenoid, such as a magnetically latching or permanent magnet solenoid. Essentially, the control signal consists of a timing signal which periodically causes the zoom lens to move to one of two pre-set positions corresponding to the two fields of view at pre-determined intervals which may be set within the microprocessor. A triggering event for activating the change command can be failure to obtain a "good read". At a pre-determined time after attempting but failing to obtain a good read, the location of lens 4106 is changed to the other zoom position.

Alternatively, the focal length can be manually selected by the user by providing an input mechanism to the microprocessor to designate the desired position of the two options and to discontinue the automatic timed movement of the zoom lens.

In a second exemplary embodiment of the zoom lens, including the adjustment mechanism, the following parameters were selected:

Wavelength of operation: 450–650 nm

Aperture: Optically adjusting - f/11–f/16

Zoom function: Optically compensated - movement of front negative element

Zoom mechanism: 5V DC Magnetic latching solenoid, 7 W total power, 1 sec. charge time and 50 msec discharge, reversible voltage Solenoid size: 0.44" dia.×0.75" (including shaft) with 5 mm stroke Solenoid weight: 18 gm Magnification: 3:1—Zoom position 1: 1/5.5×; Zoom position 2: 1/15×

No. of elements: 3 or 4 with a sphere

Lens element diameters: 10 mm

Lens element coatings: BBAR coating; <1% reflectance from 450 nm to 650 nm

Focal length: Zoom position 1: 21 mm; Zoom position 2: 7 mm

Horizontal field of view: Zoom position 1: 10°; Zoom position 2: 30°

Nominal object distance (from window): 4.5"

100% ensquared energy: <40 microns

Allowable vignetting: <10%

Allowable distortion: <10%

Overall barrel length: 25 mm

Barrel diameter: 12 mm

Optical lens assembly weight: 28 gm

Overall length (lens to CCD): 60 mm

Inaccessible distance (from lens to scanner window): 1.0"

Total length from CCD to window: 2.5"

Standard filter: CM500 or equivalent

Optional sunlight filter: Corning photochromic filter glass or custom 20 nm bandpass filter with center at 590 nm Apodizer filter: Fresnel Phase Zone Plate made of polymethylmethacrylate (PMMA).

Table 6

The dual focus optical system provides the following depth of field performance:

TABLE 7

| Feature Sizes "s" | Depth of Field "DOF" | |
|---|---|---|
| | Position 1 = 1/15× | Position 2 = 1/5× |
| 6 mil | 1.25" | 3.00" |
| 10 mil | 3.25" | 4.25" |
| 15 mil | 4.25" | 5.25" |
| 20 mil | 5.00" | 6.00" |
| 30 mil | 7.00" | 7.00" |
| 40 mil | 9.75" | 9.75" |
| 55 mil | 12.00" | 12.00" |

A spatial filter, or apodizer, may be included to further enhance the depth of field of the scanner. The apodizer serves to decrease the irradiance of the outer parts of the Point Spread Function (PSF) without increasing the size of the pupil aperture, thus providing considerably higher overall transmission than annular apertures of the prior art. The apodization has the effect of enlarging the central part of the irradiance PSF. This PSF is the Strehl ratio of the optical system and can be evaluated with optical design software. If the irradiance PSF is thought of as the Strehl ratio versus defocusing, apodization will increase the depth of focus. However, when imaging an extended object, the Strehl ratio may not be sufficient for assessing the optical system. For this reason, the modulation transfer function (MTF) of the apodizers is evaluated. The MTF of the apodizers is obtained by numerically taking the inverse Fourier transform of the irradiance PSF. The PSF of a two-dimensional optical system with radial symmetry that has focusing errors is described by Equation 3:

$$PSF(r,W) = 2\pi \int_0^\infty (P(\rho)\exp(i2\pi W (\rho/\omega)^3)J_0(2\pi r\rho)\rho \, d\rho) \qquad (3)$$

where r is the radius of the aperture, W is the aberration as a function of defocus, P is the pupil function, $\rho$ is the pupil radius, $\omega$ is the radius of the collection optics, and $J_0$ is the zero order Bessel function.

According to the teachings of W. T. Welford in "Use of Annular Apertures to Increase Focal Depth", J. Opt. Soc. Am. 50, p.749 (1960), the irradiance distribution along the optical axis $((q(W))^2)$ where r=0 and with no defocusing can be expressed as:

$$(q(W))^2 = (PSF (r = 0, W)^2 \qquad (4)$$

or $$(q(W))^2 = \left[ \pi\omega^2 \int_0^\infty (P(\rho)\exp(i2\pi W (\rho/\omega)^3)d[(\rho/\omega)^2] \right]^2 . \qquad (5)$$

Following the above expressions, it becomes necessary to analyze the imaging properties of the apodizers which, under a suitable geometrical transformation, are the Fourier transform of Bessel functions given in Equation 3.

The desired spatial filter or apodizer uses the above approach to maximize the depth of field, i.e., determine the minima for q(W). Imaging properties can be evaluated using software to calculate MTF from the PSF of the new apodizers.

In a second embodiment of the apodizer, a cat's eye aperture shapes the central lobe of the Airy disk (the diffraction pattern) to minimize the incoming information, reducing the value of the numerical aperture. The rectangular obscuration increases the angular separation of the lines of the bar code. (The cat's eye is parallel to the individual lines of the bar code, i.e., the axis of the bar code.

Working in cooperation with cat's eye aperture 2607 is a horizontal blocking mask 2614 which is patterned onto the entrance aperture of bi-convex lens 2602, as illustrated in FIG. 5. Blocking mask 2614 is thin film coated directly onto the lens using techniques that are known in the art. Alternatively, blocking mask 2614 can be placed on an optically transparent film, then placed immediately adjacent to lens 2602. The blocking mask 2614 allows the use of longer spatial frequencies so that the modulation transfer value (MTV) increases substantially at modulation transfer function (MTF)=0.5. The cat's eye aperture 2607 provides for an increase in the light for the first bright ring of 2.76, the second bright ring of 4.15 and the third bright ring or Airy disk, of 5.19. That is, the separation goes from (0.82 λ/N.A.) to (0.72 λ/N.A.) for the first bright ring and (1.33 λ/N.A.) to (1.23 λ/N.A.) for the second bright ring. Third and fourth bright rings follow commensurately. The central obscuration prohibits the integration of the central Airy disk. Thus, the light transmission to the detector is not constant across the aperture, of the lens assembly with the transmission at the center being reduced and the relative amount of light in the surrounding rings being increased.

The analytical model for the cat's eye technique is derived from several components. First is the modification of the MTF of a basically clear aperture system to that of a Cassegrainian system, i.e., where there is central obscuration in the pupil function for the incoming signal. The technique for the cat's eye, however, requires a rectangular obscuration since the bar code is essentially rectangular. The rectangular obscuration must be set normal to the axis of the bar code target. The elliptical aperture at the focus of the lens assembly 2618, leading to the image plane, will be set in the same plane as the bar code and normal to the rectangular obscuration on the collection optic, lens 2602. The point image intensity distribution t(x,y) will follow from the transfer function:

$$\tau(\mu,v) = \int_{\infty}^{-\infty}\int (t(x,y) e^{i(\mu x + v y)} dx\, dy) \quad (6)$$

where $t(x,y) = s(x,y)s^*(x,y)$, where $s(x,y)$ is the amplitude distribution.

Equation (6) can now be written as:

$$\tau(\mu,v) = \int_{\infty}^{-\infty}\int S(\mu_o, v_o)S^*(\mu_o - \mu, v_o - v) d\mu_o\, dv_o. \quad (7)$$

The transfer function for a diffraction limited system can be evaluated either by a direct Fourier transform of the spread function (Eq. (6)), or by means of a convolution integral of the aperture function with its complex conjugate (Eq. (7)). The second equation offers the advantage of being able to evaluate the wave front characteristics without the complicated detail of the physical diffraction pattern. Nonetheless, the point energy image distribution will be evaluated as a second component of the cat's eye technique.

The following equations are used for evaluating the MTF as a function of frequency:

$$\tau(\omega) = \{\sqrt{\omega_0(1-\eta^2)}\}\{l_1 + \eta^4 l_2 - 8\eta l_3\} \quad (8)$$

where:

$$l_1 = \int_0^\infty \int_0^{2\pi} [2J_1 R]^2 e^{i\Omega R \cos\theta}(R)^{-1} d(R) d\theta \quad (9)$$

$$l_2 = \int_0^\infty \int_0^{2\pi} [2J_1 \eta R]^2 e^{i\Omega/\eta(\eta R)\cos\theta}(\eta R)^{-1} d(\eta R) d\theta \quad (10)$$

$$l_3 = \int_0^\infty \int_0^{2\pi} J_1(R) J_1(\eta R) e^{i\Omega R \cos\theta}(R)^{-1} d(R) d\theta, \quad (11)$$

where $J_1$=Bessel function of the first order R=ωr. Inserting the proper values, MTF can be evaluated so that $$\tau(\Omega) = \frac{1.0}{1-\eta^2}[A+B+C], \quad (12)$$

where: for $0 < \frac{\Omega}{2} < 1.0$, $$A = \frac{2}{\pi}\{\cos^{-1}\Omega/2 - \{\Omega/2[\sqrt{1.0 - (\Omega/2)^2}]\}\};$$

for $\frac{\Omega}{2} > 1.0$ $$A = 0;$$

for $0 < \frac{\Omega}{2\eta} < 1.0$, $$B = \frac{2\eta}{\pi}\{\cos^{-1}(\Omega/2\eta) - \{\Omega/2\eta[\sqrt{1.0 - (\Omega/2\eta)^2}]\}\}$$

for $\frac{\Omega}{2\eta} > 1.0$, $$B = 0;$$

for $0 < \frac{\Omega}{2} < \frac{1.0-\eta}{2}$, $$C = -2\eta^2;$$

for $\frac{1.0-\eta}{2} < \frac{\Omega}{2} < \frac{1.0+\eta}{2}$, $$C = \frac{2\eta}{\pi}\sin\phi + \left(\frac{1.0+\eta}{\pi}\right)\phi - \left(\frac{2(1.0+\eta^2)}{\pi}\right)\tan^{-1}\left\{\left[\frac{1.0+\eta}{1.0-\eta}\right]\tan\phi/2\right\}$$

for $\frac{\Omega}{2} > \frac{1.0+\eta}{2}$, $$C = 0;$$

$$\phi = \cos^{-1}\frac{1.0+\eta^2-\Omega^2}{2\eta};$$

where:

$$\Omega = \frac{f}{f_0}, \text{ where } f_0 = \text{cutoff frequency};$$

-continued $$\eta = \frac{D_i}{D_0}, \quad \text{where } D_i = \text{obscuring diameter} \\ \text{and } D_0 = \text{aperture diameter}$$

In a prototype scanner utilizing the apodization technique of the second embodiment, the collecting lens is 12 mm. The obscuration, blocking mask 2614, measures 2.286 mm×10.88 mm. The resulting effective diameter is:

$$D_e = \frac{4 \cdot 2.286 \cdot 10.88}{2 \cdot 2.286 + 2 \cdot 10.88} \text{ mm} \quad (13)$$

$$D_e = 3.7782 \text{ mm}$$

and the value for η will be:

$$\eta = \frac{3.7782}{12} = 0.31485$$

Using the above equations, MTF can be plotted for the design obscuration. The plot of MTF with lines per millimeter is provided as FIG. 44, with comparative curves provided for no obscuration, curve A, 0.2 obscuration, curve B and obscuration for the calculated value of η, 0.31485, in curve C. (The optical train NA is 0.1645)

Figure 44:
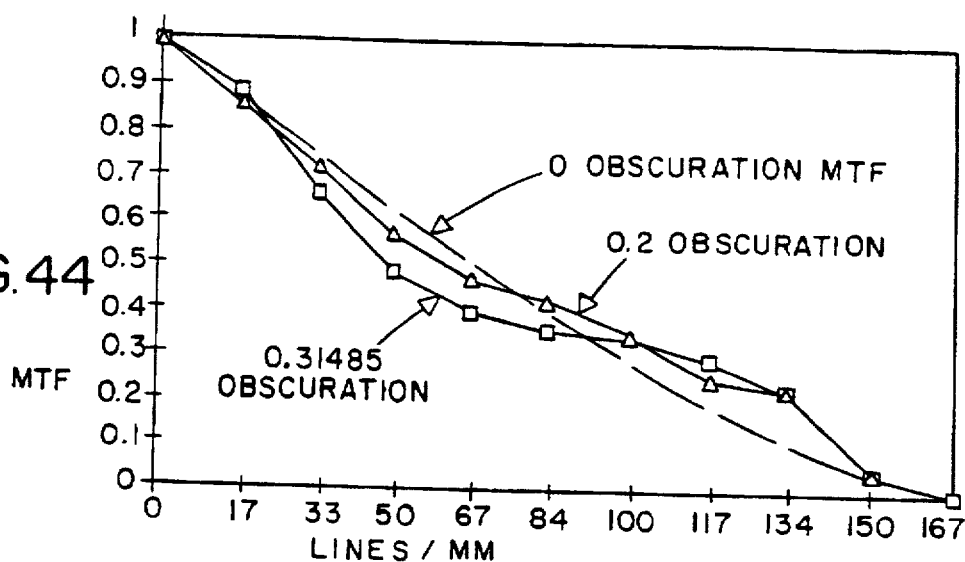
FIG. 44 is a plot of modulation transfer function versus resolution in lines per millimeter for the obscuration of FIG. 40.

It can be seen from the FIG. 44 that the obscuration gives substantially higher values at higher frequencies and somewhat lower values at the lower frequencies. This is expected from the equations. Thus, the central obscuration changes the MTF of the optical train rather dramatically and also changes the pupil function in a substantial fashion.

Now looking at the image intensity distribution as it approaches the cat's eye aperture 2607, it can be seen that the aperture will provide the contrast ratios that are needed to evaluate the lines and spaces of the bar code. The point intensity will follow from Equation 14.

$$s(r) = 2\pi \int_{\eta\omega_o}^{\omega_o} [J_o(\omega R)]\omega d\omega, \quad (14)$$

where $J_0$=Bessel function of zero order, which provides the point image intensity distribution:

$$i(R) = \quad (15)$$

$$\frac{1}{1-\eta^2} \left\{ \left[\frac{2J_1(R)}{R}\right]^2 + \eta^4 \left[\frac{2J_1(\eta R)}{\eta R}\right]^2 - \frac{8\eta J_1(\eta R)J_1(R)}{R^2} \right\},$$

where:

$R=\omega_0 r$;

$\omega_0$=outer radius of collection optics; and r=radius in aperture.

For the prototype system using the cat's eye aperture, the cat's eye 2607 has a short axis of 1.0 mm and long axis of 1.875 mm. The relative intensity distribution in the image produced at the detector is plotted in FIG. 45, going from the center of the aperture along the long axis towards its end. This is essentially an evaluation of the amount of energy in the areas that are bounded by the resultant of the two dimensions of the aperture.

Figure 45:
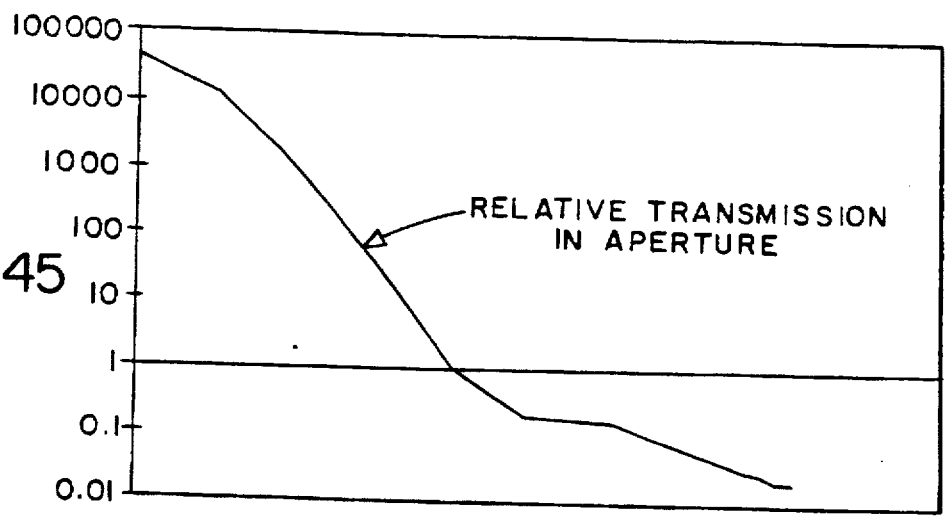
FIG. 45 is a plot of log relative transmission versus aperture height in millimeters for the cat's eye aperture of FIG. 39.

As seen in FIG. 45, the aspect ratio is large because of the area that is swept out in the progression from the value at 0 to the value at 0.99 mm. Because the change is logarithmic, the contrast between dark and light lines can be controlled as the pupil passes energy from the outer rings of the Airy disk after the center of the Airy disk has been blocked by rectangular mask 2614. This obscuration results in little information in the center and does not permit integration of the bar code lines in the center of the detector.

Figure 46:
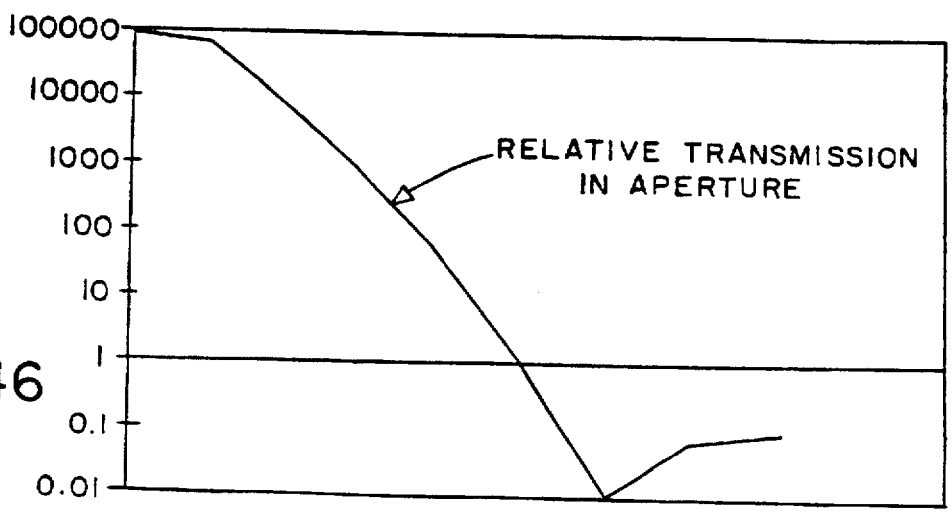
FIG. 46 is a plot of log relative transmission versus aperture width in millimeters for the cat's eye aperture of FIG. 39.

FIG. 46 is a plot of the transmission through the aperture progressing along the short axis from center to edge, again for light which has already been partially obscured by rectangular mask 2614.

It can be seen from the relationship between the obscuration and the cat's eye aperture that they can be closely coordinated. The aperture must have sufficient area to allow the signal strength necessary to read the contrast between the bar codes. The obscuration must be of sufficient dimension to apodize the pupil function and allow for the depth of field in the optical train. However, the mask is not necessary with the cat's eye aperture and the cat's eye can be sufficient to achieve the depth of focus. Also, a similar pupil shaping aperture can be placed elsewhere in the lens system. In the preferred embodiment it is at the aperture stop.

In a third embodiment of the apodizer, a Fresnel phase zone plate is used to increase the depth of field of the scanner without changing the focal length of the zoom lens. As with the previous embodiments of the apodizer, the Fresnel zone plate (FZP) is included within the optical assembly to provide a defocusing function. The defocus pupil function is given by:

$$P(u,v,z)=P(u,v,)e^{i4\pi z(u^2+v^2)} \quad (16)$$

where u and v are units of cut-off frequency, $$\frac{w}{z} = \frac{N.A.}{\lambda}$$

$N.A.$ = numerical aperture = $a/f$ $a$ = pupil radius $f$ = focal length $z$ = units of depth of field $$\delta = \frac{\lambda}{(N.A.)^2} = \frac{4}{\lambda w^2} \quad (17)$$

The OTF is the autocorrelation of the pupil along a diameter, i.e., v=0.

$$H(u,0,z) = \int P(u' - (u/2),v',z)P^*(u' + (u/2),v',z)du'dv' \quad (18)$$

$$= \int \phi(u',u) e^{-i8\pi z u u'} du' \quad (19)$$

where $$\phi(u',u)=\int P(u'-(u/2),v',0)P^*(u'+(u/2),v',0)dv'. \quad (20)$$

If the pupil is a Fresnel zone plate with N zones, each with unit side $|u|<\frac{1}{2}$, $|v|<\frac{1}{2}$, then:

$$P(u,v,z) = \sum_{n=-\infty}^{\infty} A_n e^{i4\pi n N(u^2+v^2)} \text{rect}(u)\text{rect}(v). \quad (21)$$

Equation 21 is an infinite FZP which is periodic in $\rho^2=u^2+v^2$;

$R_1$ is the outer radius of zone 1;

the period is $\frac{1}{2}N$.

Figure 42:
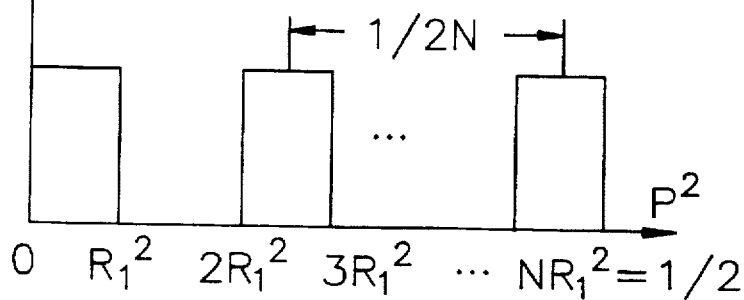
FIG. 42 is a plot of FZP zone radius versus period.

In terms of $\rho^2$, the period is $$2R_1^2+1/(2N), \quad (22)$$

as shown in the chart of FIG. 42.

Rewriting, $$\phi(u,u') = \int \sum_{n=-\infty}^{\infty} A_n e^{i4\pi Nn(u'^2+v'^2+(u^2/4)-uu')} \ . \tag{23}$$

$\Sigma A_n$(complex conj.) $\cdot \text{rect}(v')\text{rect}(u'/(1-u))dv')$, assuming u>0 or using 1–|µ|.

If N number of zones is large enough, the following approximation can be made:

$$\int_{-1/2}^{1/2} e^{i4\pi nN(n-m)v'^2} dv' = \delta(n-m) \tag{24}$$

The peak of the integral equation is at n=m, so that $$\phi(u,u')=\Sigma \ |A_n|^2 e^{-i8\pi nNuu'} \ \text{rect}(u'/(1-u)). \tag{25}$$

The OTF along v=0 becomes:

$$H(u,o,z) = \rho | A_n|^2 \int e^{-i8\pi(z+Nn)uu'}\text{rect}(u'/(1-u))du' \tag{26}$$

$$= \rho|A_n|^2 \int \frac{\sin[4\pi zu(1-u)]}{4\pi zu} \ \delta(z-Nn)dz. \tag{27}$$

In terms of the convolution integral, $$H(u,0,z) = \Sigma |A_n|^2 \delta(z+nN) * \frac{\sin[4\pi zu(1-u)]}{4\pi zu} \ . \tag{28}$$

For the first three terms, $$H(u,0,z) = A_0^2 \frac{\sin[4\pi zu(1-u)]}{4\pi zu} + \tag{29}$$

$$A_1^2 \frac{\sin[4\pi zu(1-u)]}{4\pi zu} + A_{-1}^2 \frac{\sin[4\pi zu(1-u)]}{4\pi zu} \ .$$

Figure 43A:
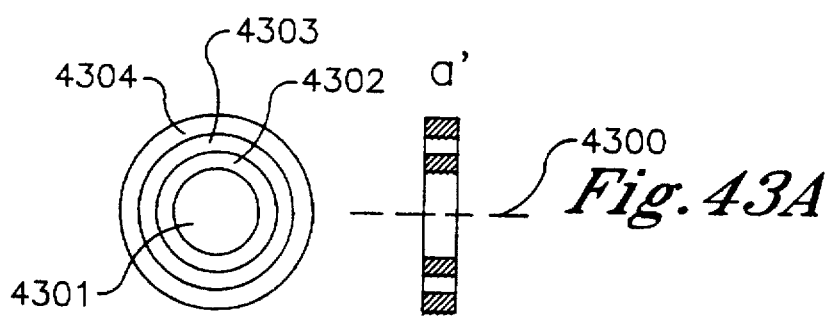
FIGS. 43a–c are variations of Fresnel zone plates (FZPs), with FIG. 43a showing a conventional FZP, FIG. 43b showing an improved FZP and FIG. 43c showing a Fresnel phase zone plate.
Figure 43B:
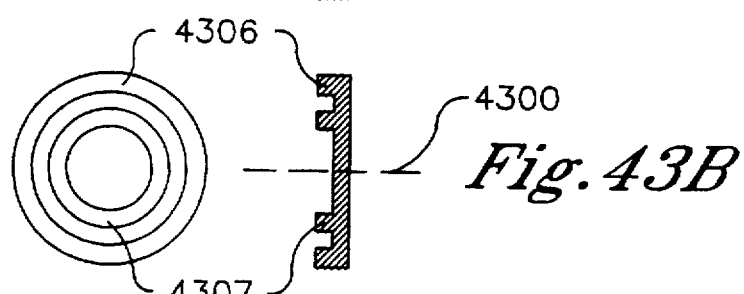
Figure 43C:
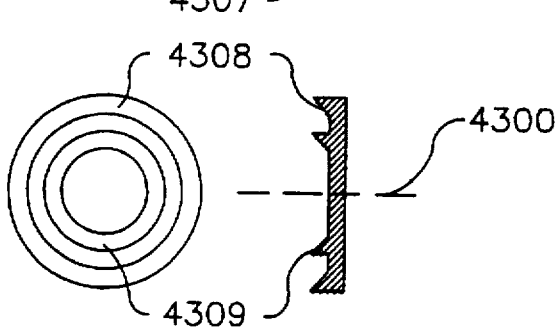

FIGS. 43a–c provides a comparison between conventional FZPs, such as are disclosed in "Imaging with Fresnel Zone Pupil Masks: Extended Depth of Field", Applied Optics, 23, (1984), p.4299–4302, and illustrated as FIGS. 43a and a', a first improvement comprising the Fresnel phase zone plate (FIGS. 43b and b'), and a further improvement (FIGS. 43c and c'). In the conventional FZP of FIGS. 43a and a' (43a' shows the cross-section of the FZP), there are four zones, 4301–4304, with zones 4301 and 4303 acting to block portions of the light passing through the FZP. The optical axis 4300 runs through the center of each FZP. In the FZP of FIGS. 43b and b', which is a first Fresnel phase zone plate (FPZP), the steps 4306 and 4307 have a thickness and refractive index to introduce a 180° phase change in the light passing through the steps, so as to result in constructive interference, intensifying the total light passing through the FZP. In the FZP of FIGS. 43c and c', the steps 4308 and 4309 are higher order aspheres which modify phase depending on the radial point of entry of the light into the FZP.

Figure 47:
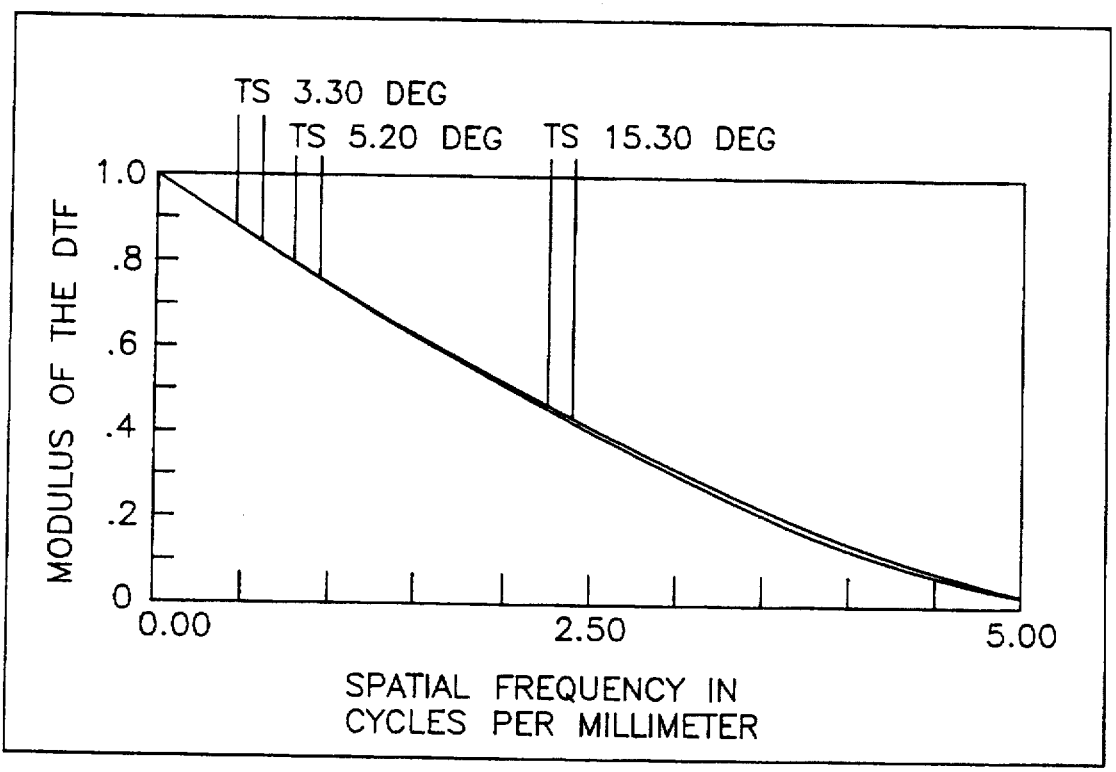
FIG. 47 is a plot of the modulation transfer function for a defocused paraxial lens only.
Figure 48:
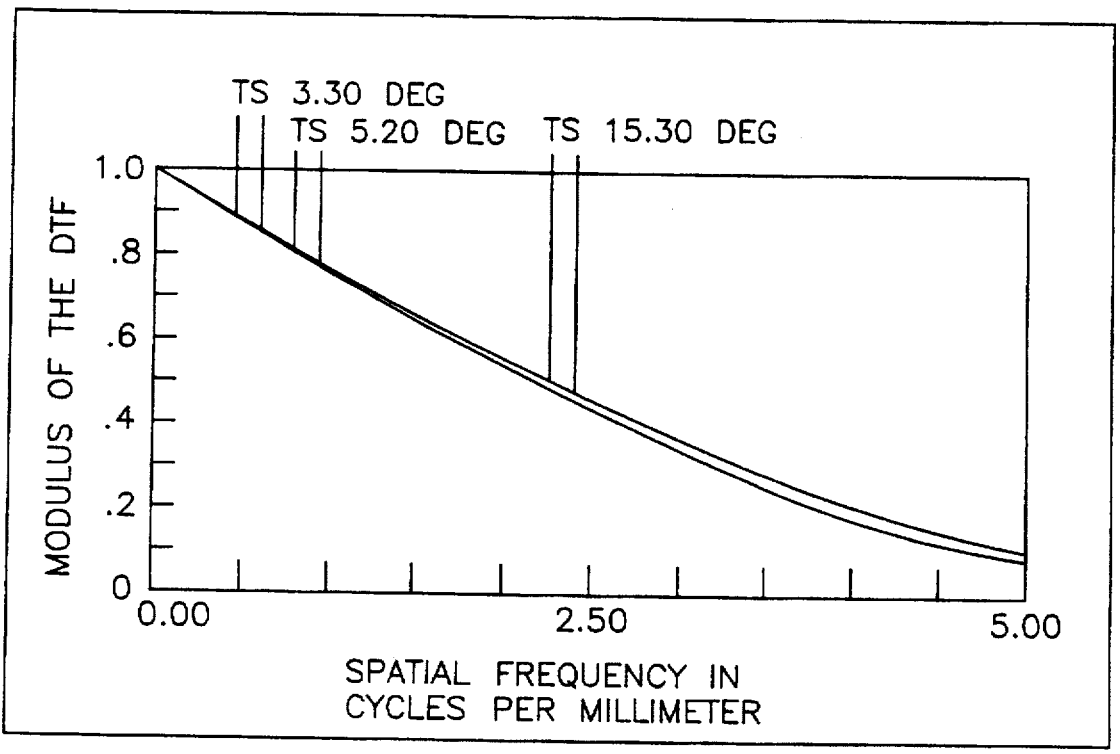
FIG. 48 is a plot of the modulation transfer function for a defocused Fresnel zone plate with a paraxial lens.
Figure 49A:
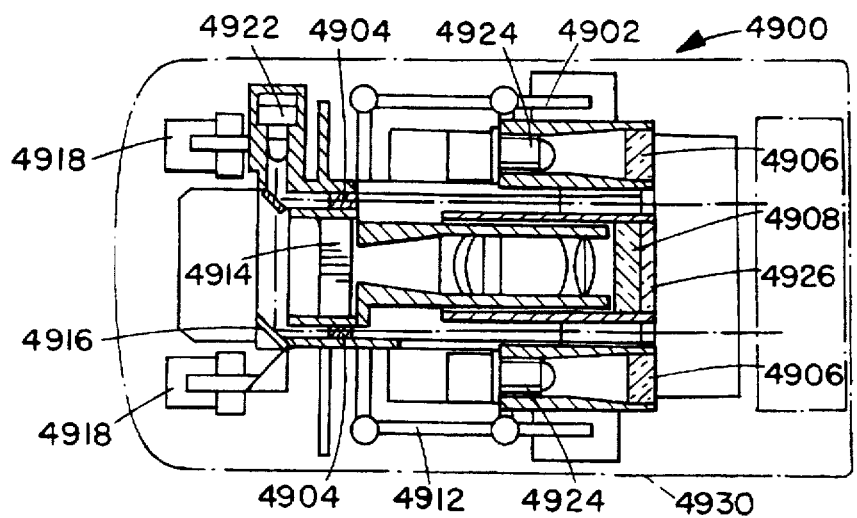
Figure 49B:
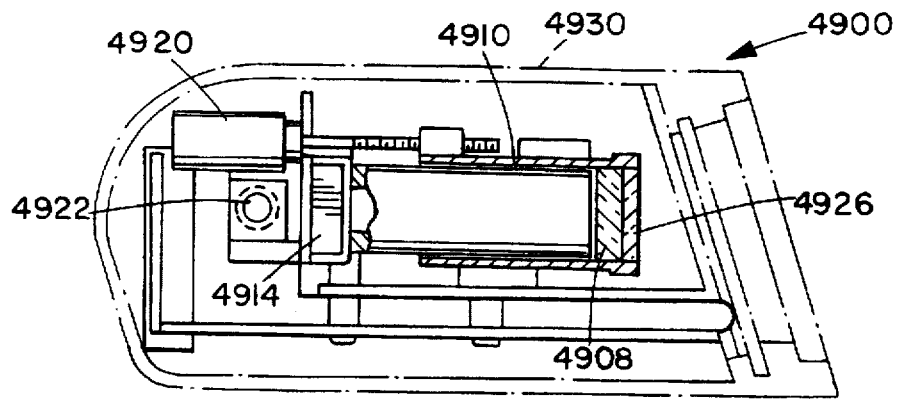
Figure 49C:
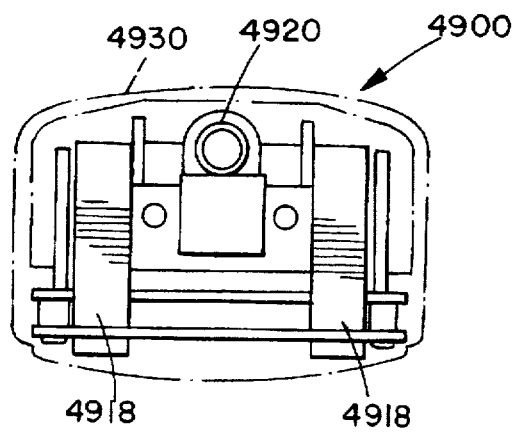
Figure 49D:
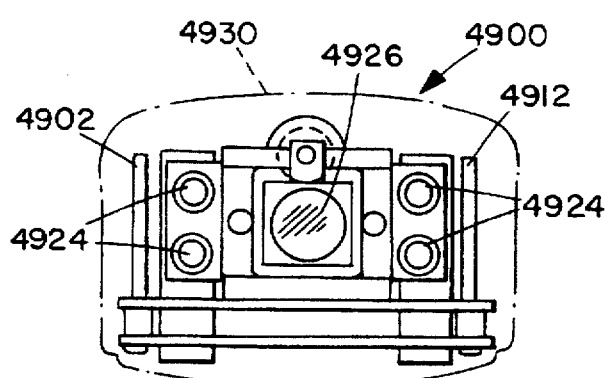

In order to verify the effect of the use of a Fresnel Phase Zone Plate (FPZP) for extending the depth of field in a CCD scanner such as in the inventive system, a computer simulation of a FPZP was run as an even order aspheric plate with three coefficients having zero power. A paraxial lens was located behind the FPZP and three imaging properties were examined. First, the off-axis imaging quality for rays 15° off-axis were examined and compared to those on-axis. The spot diagrams indicated that the image quality does not degrade. Next, the axial chromatic image shift for white light (450 nm to 650 nm) was examined and compared to single wavelength coherent light. The analysis showed that the image plane does not shift with color, indicating that the FPZP works with incoherent as well as coherent light. Lastly, the extension of the depth of field was examined by changing the object distance by an arbitrary amount and examining the modulation transfer function with and without the FPZP in the optical path. The comparison of the modulation transfer function for a lens system without and with the FPZP is provided in FIGS. 47 and 48, respectively, demonstrating an approximate 10% increase when the FPZP is added according to the present invention.

In the preferred embodiment, the FZP has fewer than ten zones and will have an internal transmission of 100%. The FZP can have modulations on the even periods and is described according to the following generalized equation:

$$FPZP_s=(c_s r^2)/(1+(1-(1+k_s)c_s^2 r^2)^{1/2})+\alpha_1 r^2+\alpha_2 r^4+\ldots, \tag{30}$$

where $c_s$ is the curvature of the Fresnel surface, r is the radius of the curvature of the zone plate, k is the conic constant of the Fresnel surface, and $\alpha_n$ are the constants of the coefficients in radians.

The window 24, as illustrated in FIG. 1, consists of a bandpass filter centered at the selected illumination wavelength, e.g., approximately 660 nm (for the visible light scanner), and a light homogenizer/diffuser, and may be combined with, or separate from, a cylindrical lens, which focuses the light along one axis to form a plane of light, with a line of light being created at its focal point. For example, the lens\filters of FIGS. 5 and 17 provide the multiple function of homogenizing, diffusing and focusing by way of a cylindrical lens. When the bar code is scanned at the precise focal point of the cylindrical lens 38, the maximum possible light will be reflected to the detector. The window's function is to suppress radiation noise from the LEDs, to form a homogeneous incident beam for illumination of the bar code, to collimate the beam, and to filter the reflected light by removing extraneous light which falls outside of the predetermined acceptable bandwidth range of 660 nm.

In an exemplary embodiment, the window 24 is formed from water white float glass and is coated on both entry and exit sides for less than 1% reflectance within the wavelength range of 450–650 nm. The window should be durable, and tolerant of incidental contact without marked degradation. The size of the window is on the order of 1"×0.75", with a thickness of 0.9–1.0 mm. The window may be mounted with a slight tilt of about 5°–7° from normal incidence with respect to the PCB.

Figure 4:
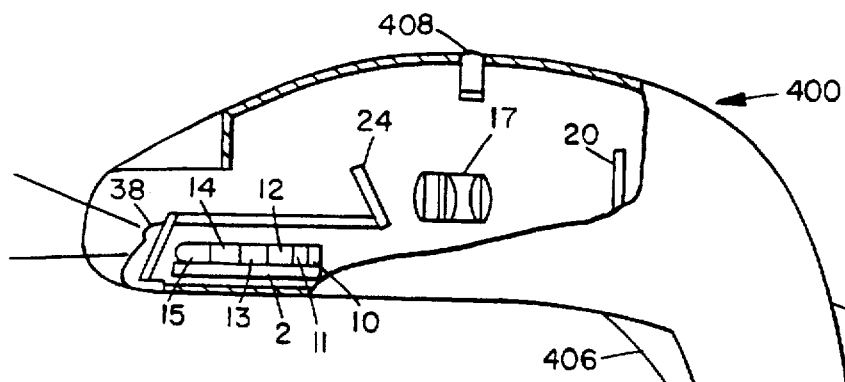
FIG. 4 is a side elevation, partially cut away, of an assembled optical scanning head including a housing.

The cylindrical lens 38, as seen in FIG. 4, may be modified to provide a uniform distribution of light at the focal point. This "homogenization" is provided by knurling or scalloping the input side 90 of the lens, as shown in FIG. 14. Each step 92 in the knurled edge 90 acts as a "mini-lens" which spreads the light entering the cylindrical lens at that point. The spread light from each mini-lens overlaps other spread light to homogenize the light at the focal point of the cylindrical lens. The focal point of the cylindrical lens is determined by the outer side 94.

Figure 14A:
FIGS. 14a and 14b are diagrammatic views of a knurled cylindrical lens with a concave and convex output edge, respectively.
Figure 14B:

In conjunction with the knurled input edge, the output edge of the cylindrical lens can be either concave or convex. The concave edge 94' is shown in FIG. 14a, and the convex edge 94 is shown in FIG. 14b. The concave edge 94 is selected for scans of two-dimensional bar codes at distances from contact to 3 inches. The convex edge 94 is used for scan distances greater than 3 inches.

Figure 15:
FIG. 15 is a diagrammatic view of a double radius cylindrical lens.

Another modification of the cylindrical lens is illustrated in FIG. 15. The double radius creates, in effect, two separate cylindrical sub-lenses 96 and 98, each with a different focal length. The light emitted by the LEDs will be focussed by both sub-lenses 96 and 98 so that two different lines of focussed light are created at different angles from the lens, as shown in FIG. 17. This lens provides greater variability in the distance at which a bar code can be accurately read without requiring a change in the cylindrical lens or a compromise in the strength of the signal.

Frame locators may be provided to enhance the user's ability to correctly aim the scanner at the symbol or image to be scanned by the addition of one or more laser diodes which emit light in the visible spectrum to the optical scanning device. These laser diodes are mounted on the PCB with the other optical and electrical components, with voltage for powering the laser being provided by means similar to that for the LEDs, as is known in the art.

Figure 34:
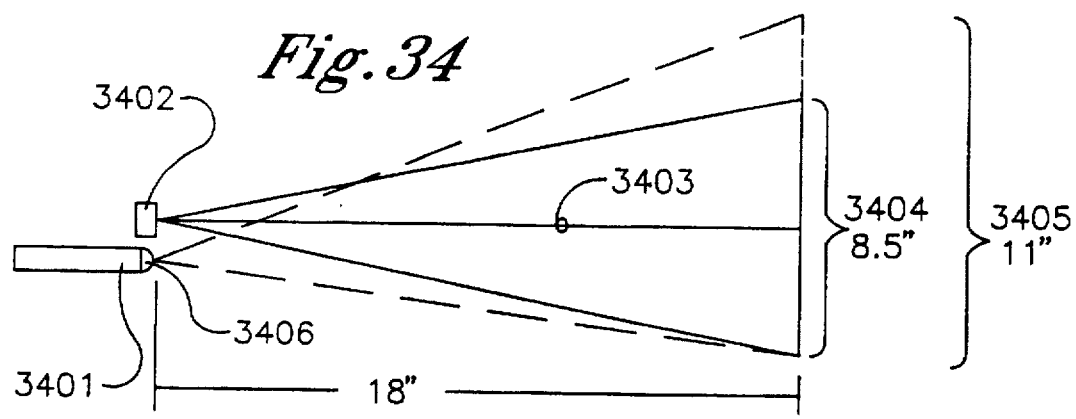
FIG. 34 is a diagrammatic view of a first embodiment of a frame locator for the present invention.

A first variation of the frame locator using a laser diode is illustrated in FIG. 34. Laser diode 3401 is placed offset from the optical axis 3403 of detector 3402. A diffractive optic 3406, either a diffraction grating (or pair of diffraction gratings) or a binary optic is located in the beam path of the laser diode 3401 to divide the beam into a plurality of beamlets, preferably four, expanding the effective beam path, i.e., the spacing between the beamlets, at substantially the same rate as the divergence of the field of view of the detector. Four beamlets are created by crossing two diffraction gratings at 90° to each other to create a two-dimensional diffraction grating. (The beamlets are indicated with dashed lines.) The expansion provided by optic 3406 causes the beamlets to define the edges of the field of view at the closest focus position of 2 inches, thus indicating the general area of the field of view to allow the scanner to be aimed correctly. For this purpose, the laser diode 3401 is offset from the detector 3402 by 0.5 in.. While this variation has the advantage of using only a single laser and minimal optics, the offset from the optical axis 3403 results in the dimensions of the illumination area 3405 being larger than the area of the field of view 3404, so the indication of the frame is not completely accurate. (As illustrated, there is a 2.5 inch difference toward the upper portion of the illumination area for a field distance of 18 inches.)

Figure 35:
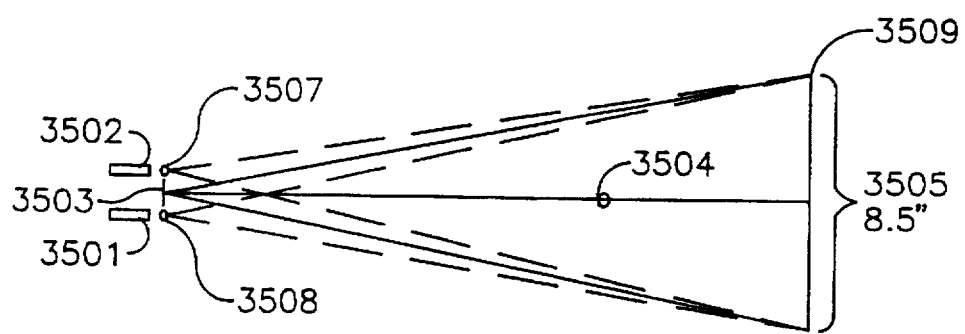
FIG. 35 is a diagrammatic view of a second embodiment of a frame locator for the present invention.

In FIG. 35, two laser diodes 3501 and 3502 are placed on either side of the detector 3503 so that they are centered on the detector's optical axis 3504. The beams emitted by lasers 3501 and 3502 are divided into beamlets by diffractive optics 3507 and 3508 to coincide with the field of view 3505 of the detector at the field distance of 18 inches. In this case, each of the diffractive optics is oriented in the same direction so that laser 3501 provides marks indicating the upper edge 3509 of the field of view 3505, and laser 3502 provides the marks for indicating the lower edge 3510 of the field of view 3505. However, when the field distance is shortened, the area defined by the spots of light produced by the beamlets will be larger than the detector's field of view, and the illumination is not uniform across the target area and may interfere with scanning. In order to avoid errors in the detected signal, the variation in brightness should be 2:1 or less.

Figure 36:
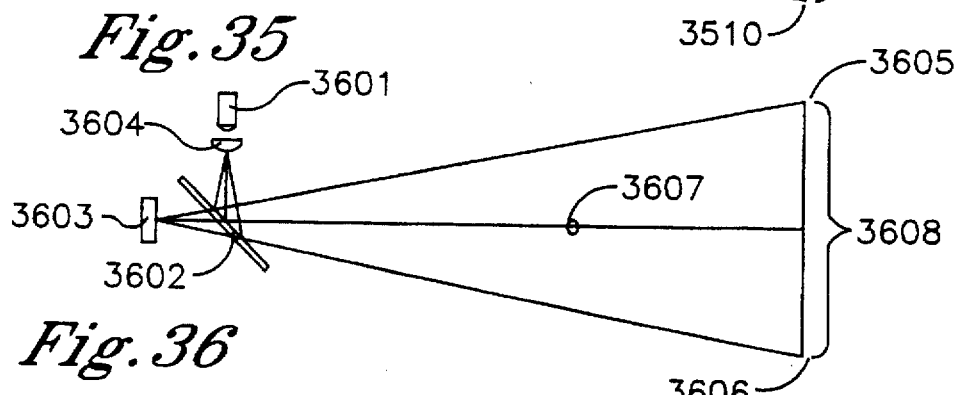
FIG. 36 is a diagrammatic view of a third embodiment of a frame locator for the present invention.

The variation of FIG. 36 provides a beam splitter 3602 to overlay the laser beam on the field of view 3708 by aligning the beam with the optical axis 3607 of detector 3603. The beam emitted by laser diode 3601 is divided and expanded by diffracting optic 3604 before being redirected by beam splitter 3602. This system allows the diverging beamlets to match the edge of the field of view of the detector 3603. An identifying mark could be placed at the edge of the detector field by including an additional diffraction grating on or near the beam splitter 3602 to form another point along the edge of the beam, e.g., at 3605 and/or 3606. A custom binary optic can be created to generate five beamlets, with the fifth beamlet providing the marker. A disadvantage of this system is that the beam splitter reflects 50% and transmits 50% of the light, so compensation should be made by selecting a sufficiently bright laser that 50% or less of the light intensity is sufficient to make the edge markers clearly visible.

Figure 37:
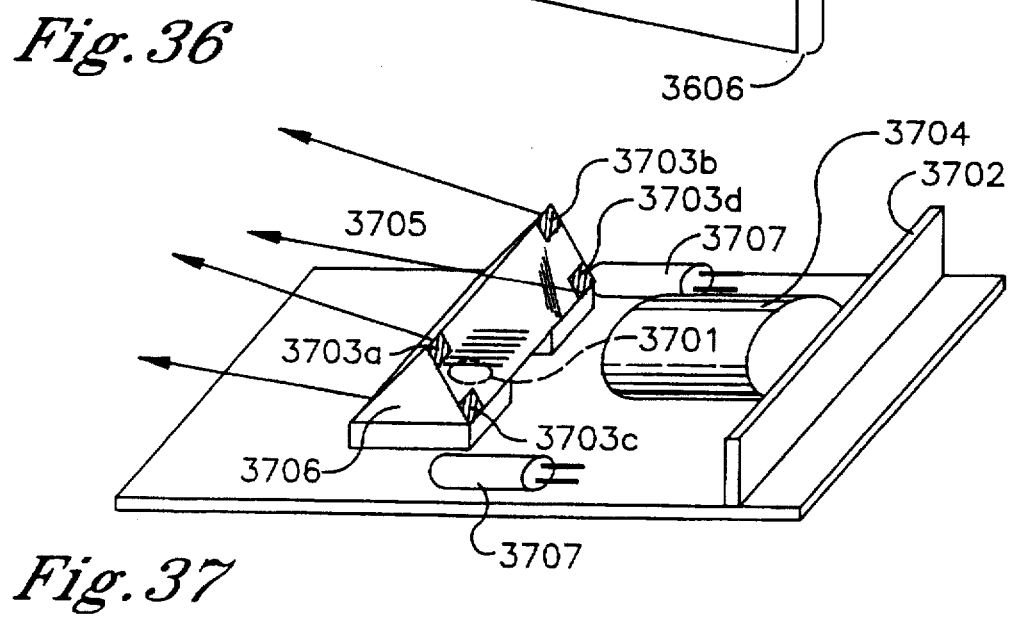
FIG. 37 is a perspective view of a fourth embodiment of a frame locator for the present invention.

The fourth variation, illustrated in FIG. 37, combines diffractive or binary optics 3705 with a mirror combination 3703a–d to create four spots for identifying the corners of the target area. The laser diode 3701 is expanded by optics 3705 (illustrated here as crossed diffraction gratings) at an angle of ±13.3°, to match the corners of the field of view. The mirrors 3703a–d are disposed on a plane of a transparent base mounting 3706 which allows reflected ambient and/or illuminating light to be transmitted through the base to the focussing optics 3704 and the detector 3702 with no or minimal loss. The plane on which the mirrors are mounted is angled so as to direct the diverging beamlets along a path centered along the optical path. The optical coatings by which the mirrors 3703a–d are formed can be selected to optimize reflection of the laser beam's wavelength, as is known in the art. In this variation, illumination for reading the scanned image may be provided by infrared LEDs 3707 mounted on either side of the frame locator assembly, so that the light from the frame locator can be readily filtered from the signal received by the detector by the appropriate bandpass filter. In the above variations, infrared LEDs may also be used in combination with the visible laser light of the frame locator. By using IR, the illumination is invisible to the user, so that it is no difficulty in matching the field of view exactly, as long as the entire field of view is covered by the frame locator.

For each of the above variations in which the laser beam is divided into diverging beamlets, the binary optics, Fresnel zone plates, i.e., a plate with four distinct zones—one for each beamlet, and/or diffraction gratings are conventional optical devices which are known in the art. All that is required is the transformation of a single collimated beam into a plurality of, and preferably four, collimated beams that are diverging from the optical axis at an angle to match the expansion of the field of view at increasing distance from the device, i.e., fixed angular distribution. A diffraction grating is ideally suited for this application since the first order beams should be of sufficient intensity to provide a pair of spots diverging in opposite directions. To provide four spots, two diffraction gratings can be overlaid at 90° to each other, using the first order beams generated by each grating. In order to align the spots with the corners of the field, the grating assembly should be rotated 45° with respect to the rows and columns of the detector array.

Figure 38A:
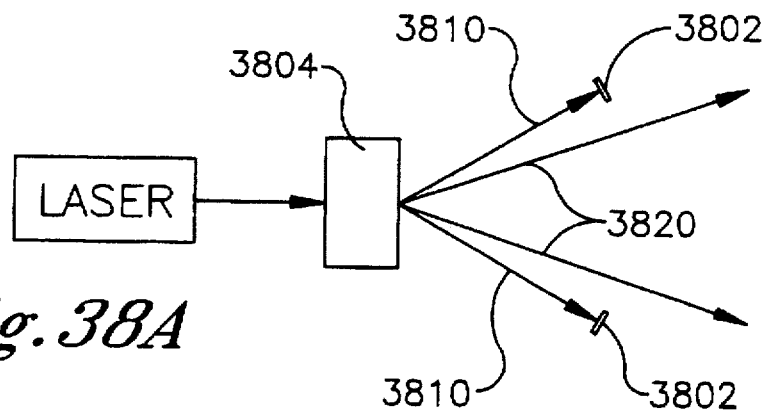
FIGS. 38a and b are diagrammatic views of a fifth embodiment of a frame locator for the dual focus embodiment, with FIG. 38a showing the narrow field frame locator and FIG. 38b showing the wide field frame locator.
Figure 38B:
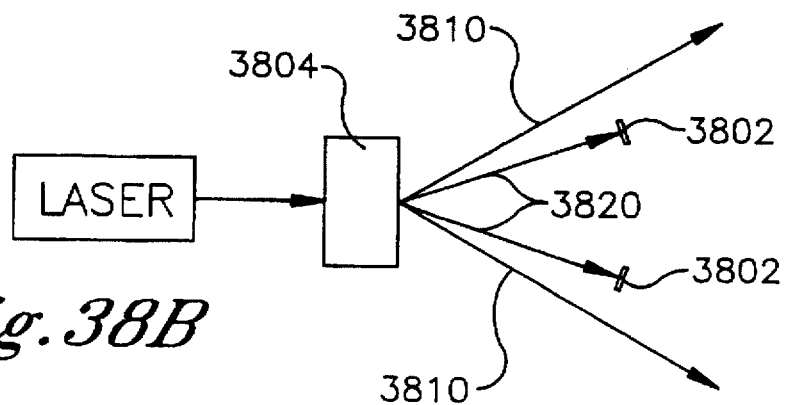

In the embodiment having dual field of view optics, two separate sets of diffractive elements can be provided to assure optimal correlation with the edges of the field of view at the two positions of the zoom lens. The separate sets of diffractive elements may be located on the same substrate 3804, as shown in FIGS. 38a and b, to simultaneously generate two sets of four beamlets, each set at different angles of diffraction to form a wide field and a narrow field. To avoid confusion to the user resulting from the presence of two sets of framing spots, as the zoom lens is adjusted to one field, for example, the wide field, the framing beamlets for the narrow field are blocked or deactivated. In an exemplary embodiment, blocking mask 3802, or perforated mask with holes to permit transmission of the beamlets, is in the form of a pivotable louver which has back-and-forth motion tied directly the motion of the zoom lens. As shown in FIG. 38a, when zoom position #1 is selected, blocking mask 3802 is positioned within the path of beamlets 3810 formed by diffractive element 3804, which provide framing for the wide field of view. This permits only beamlets 3820 for the narrow field of view to be projected forward. When zoom position #2 is selected within the dual focus optics, blocking mask 3802 is positioned within the path of beamlets 3820, permitting only beamlets 3810 to project forward to define the wide field of view, as illustrated in FIG. 38b.

In an exemplary embodiment, the laser diode and aiming indicator optics have the following characteristics:

Packaging: 7.0 mm dia.×19 mm

System weight: 7.5 gm

Supply voltage: 3–12 VDC

Input current: 75 mA max.

Peak output wavelength: 670 nm

Peak intensity: 3.0 mW, laser diode

Source distribution: circular

Beam diameter: 1.3 mm dia.

Projection lens: fanout grating device (Dammon type)

Lens design: refractive cylindrical/binary diffractive

Lens material: fused silica, glass or photopolymer

Diffractive orders: first only

Diffraction efficiency: >87% total, all beams combined

Number of first order beams: 8

Diffracted angle: equal to wide angle field of view and narrow field of view

Projected spot size: 1.3 mm dia.

Table 8

Figure 19:
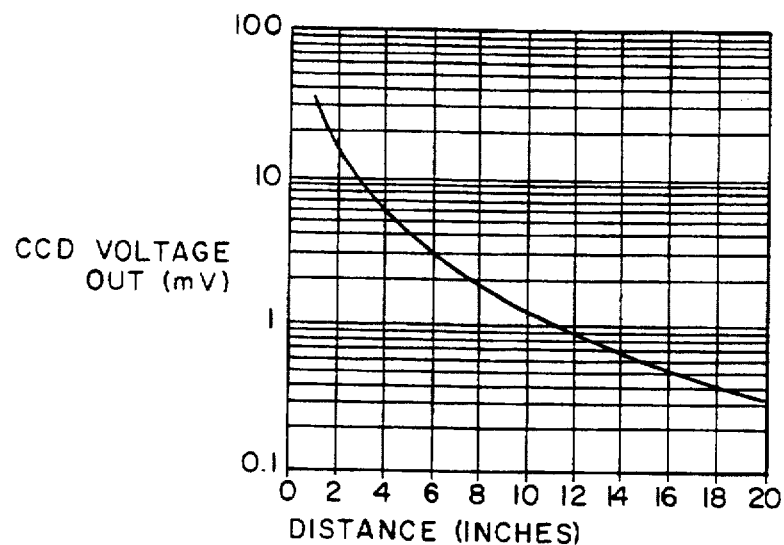
FIG. 19 is a plot of output signal voltage versus scanner distance from bar code.

The detector 20 consists of an array of charge coupled devices (CCD) which are arranged in equally spaced pixels, and may include additional processing elements such as shown in FIG. 19. The spacing of the pixels determines the limit of the resolution of the detector, so it is necessary to match the CCD resolution to the required spatial resolution in the image plane in which the detector lies. The magnification of the lens system is selected so that the received reflected light fills the detector array and so that at least 2 CCD pixels cover the minimum bar width to be resolved in the image plane. This is especially important for bar codes printed with a dot matrix printer.

The arrangement of the CCD array will depend on the application. For a one-dimensional bar code, a single linear array of CCDs is acceptable. For two-dimensional bar codes, a single linear array can be used by moving the scanning head from the top to the bottom of the bar code. However, to provide better resolution, two parallel lines of CCDs or a full area array of CCDs can be used. The use of multiple rows of CCDs permits use of an auto-correction technique in which the signal read by one row of CCDs can be double-checked by a second row. In the preferred embodiment, the CCD detector array has pixel elements with a 1:1 aspect ratio, i.e., square, for decoding symbologies regardless of orientation. This CCD array selected for this scanner has the following characteristics:

Pixel size: 7.4×7.4 microns

Packaging: 12.2×11.4 mm

Voltage: 5V

Format: ⅓"

Aspect Ratio: 4/3

Nominal sensitivity (with CM500 filter): >60 mV/lux

Dark current voltage: 2 mV

Saturation voltage: 500 mV

Shutter: variable ⅟30 to ⅟10,000 (does not require vertical synch signal)\Progressive Scan CCD Table 9

Figure 12A:
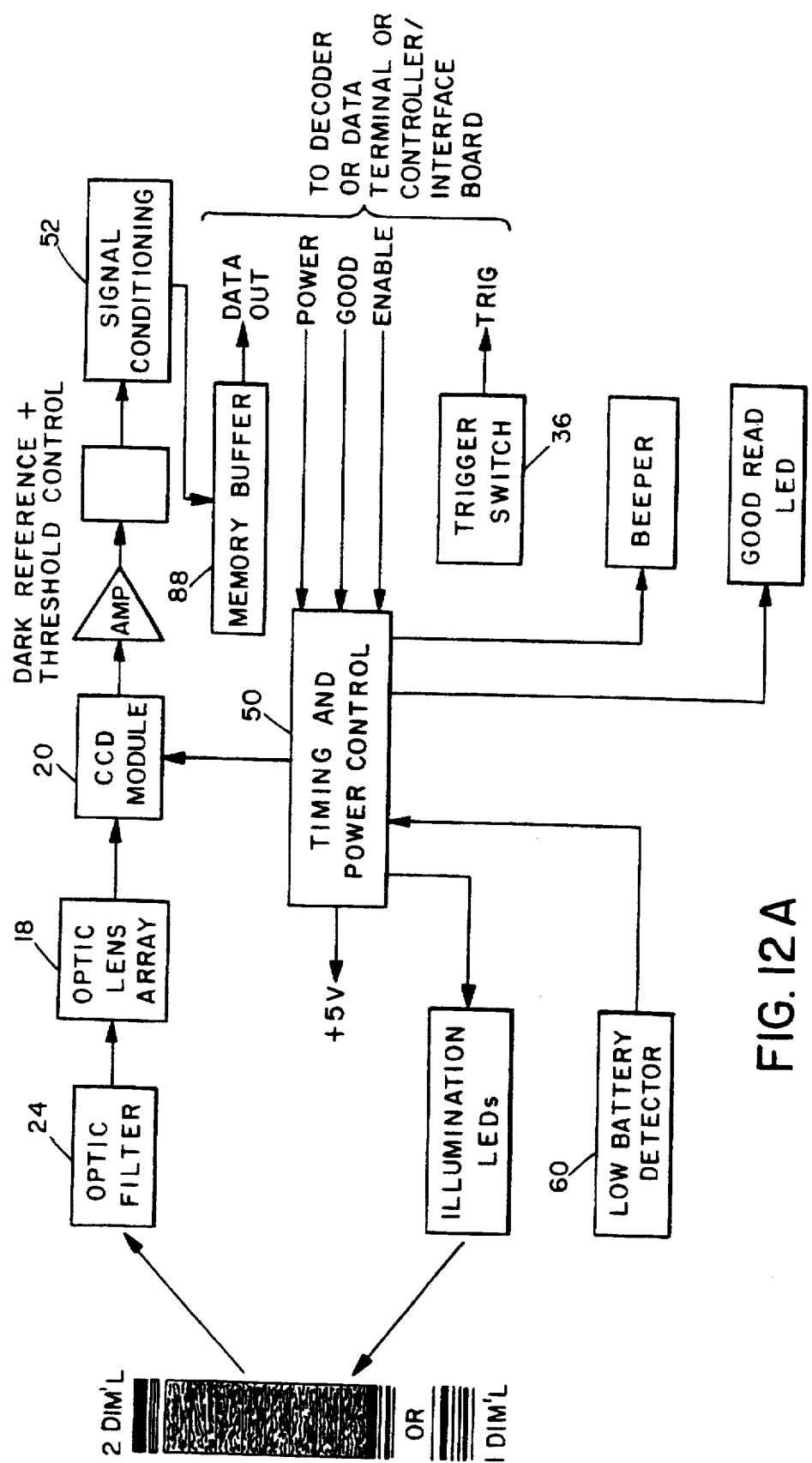
FIGS. 12a and 12b are alternate block diagrams of the scanning sequence.

In two-dimensional bar code readers, a memory buffer 88, shown in FIG. 12a, will store the two-dimensional image prior to decoding by decoder module 26.

Portions of the double line CCD array or the area array can be selectively turned on and off by connecting the CCD module controller to an external trigger or switch which has multiple selections. This will allow a one-dimensional bar code to be read by a two-dimensional scanner, while conserving power by using only as much of the CCD array as needed.

Further, the scan rate and the integration time of the CCD array is variable, established by programmable control of the number of clock cycles permitted for scanning and integration. Variation of scan and integration time is determined by feature size, density, clarity and distance of the symbol, as well as ambient light and other possible noise inducing factors. In the preferred embodiment, the scanner can read symbologies ranging from 6 mils up to 72 mils, with overall symbol dimensions of 0.25"×0.25" to 5"×5".

Four types of CCDs, which are known in the art, may be used for the area array of the two-dimensional bar code reader. The first type is the full frame CCD which has a single parallel register for photon exposure, charge integration and charge transport. A shutter is used to control the exposure and to block light from striking the CCD during readout.

The second type, the frame transfer CCD, has a parallel register which is composed of two CCDs that are arranged in tandem. One of these CCD registers is the storage array which is covered with an opaque mask and provides temporary storage for collected charge during readout. The other CCD register, the image array, is identical in capacity to the storage array and is used to collect the image. After the image array is exposed, the electronic image it generates is shifted into the storage array for readout. While the storage array is read, the image array can collect charge for the next image.

The third type of CCD is the interline transfer CCD. This CCD has a parallel register that is subdivided so that the opaque storage register lies between the columns of pixels. The electronic image accumulates in the exposed area of the parallel register. For readout, the entire image is shifted under the interline mask. The CCD shift register also lies below the interline masks. The readout occurs the same as in the frame transfer CCD.

The fourth type of CCD is the progressive scan CCD. The progressive scan CCD reads rows sequentially, e.g., top to bottom and left to right. This differs from interlaced CCD sensors, which, since they scan alternating frames or fields must scan the entire image more than once, accumulating the different frames or fields in a parallel register until the entire image is collected before a usable signal can be output. In the progressive scan, since the signal generated provides a complete image of the scanned region in a single scan, the electronic image is available as it is scanned and can be sent for processing, instead of waiting until integration of the frames or fields. However, if desired, the electronic image from a progressive scan CCD can still be stored in a buffer before transmitting the signal for processing.

Figure 16:
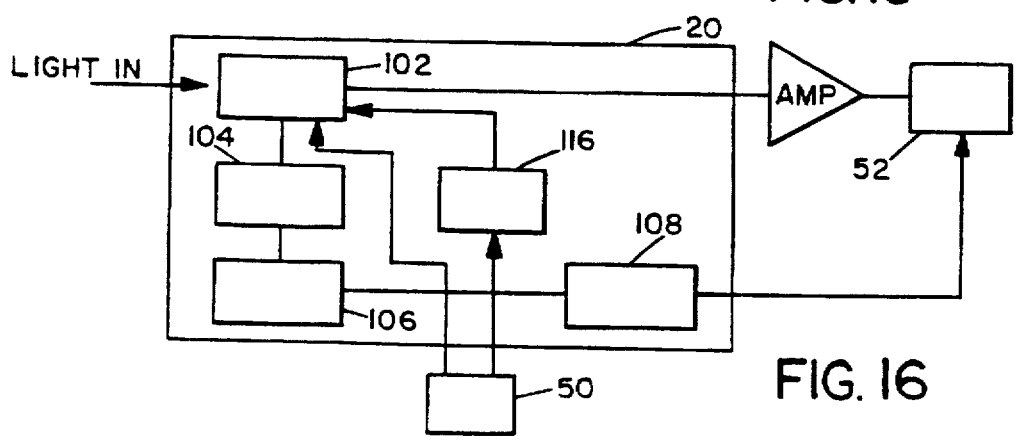
FIG. 16 is a block diagram of the CCD module.

The area array 102, which is included in the CCD module 20 illustrated in FIG. 16, operates in an interlaced mode.

This mode consists of shifting the potential wells by one-half pixel in alternate fields, "fields" referring to the field of view of the scanning head. This shift is possible due to the multiple phase arrangement of gate structures in the CCD which allows sequential propagation of the collected charges in the potential wells, as is known in the art. This results in two successive fields containing different information, given a certain number of line images with reduced aliasing. During the exposure or integration period, charge is accumulated on each pixel in proportion to the incident illumination. Every line includes a certain number of pixels. A transfer pulse will "readout" the charge on each line to generate an analog signal. The combined readouts of each line represent the two-dimensional bar code. The information will be conditioned and stored in memory buffer 88 in order to be decoded by decoder 26. After the transfer has occurred, the area array 102 will return to its integration state to accumulate charge for the next field.

In order to obtain the optimum performance, a calibration of the dark levels and shading correction must be made. A dark frame is stored and subtracted from an image to yield a zero reference.

A shading correction frame, or flat field, is required to make correction for variations in system responsivity. Because the CCD has excellent linearity, only one flat field must be taken to correct an image anywhere within the available dynamic range at a specific wavelength (660 nm). Shading varies with wavelength, and flat fields are often obtained at many wavelengths. A calibration sequence requires taking the image of interest $I_R$, a dark frame, $I_D$, and a flat field, $I_F$. An arithmetic pixel-by-pixel computation yields a corrected image with photometric integrity $$I_C = (I_R - I_D)/(I_F - I_D). \tag{31}$$

Selection of the CCD array is also influenced by the signal-to-noise ratio of a given device. In the first exemplary embodiment, a Sony ILX505 is used. The system parameters using the ILX505 are:

CCD sensitivity S: 21 V/lx-s at 3200K light source;
CCD relative spectral response: 1.0 at 475 nm, 0.65 at 650 nm;
Read out rate t: 36 frames/sec or integration time of 27.7 msec;
Dark voltage: 0.3 mV;
LED area $A_{LED}$: $2 \times 10^{-5}$ m$^2$;
LED intensity I: 4000 mcd at 650 nm;
LED solid angle illumination $\omega$: 8.0 deg or 0.015 steradians;
Diffuser transmittance $T_D$: 0.9
Diffuser area $A_D$: $1.5 \times 10^{-4}$ m$^2$;
Bar code reflectance $R_B$: 0.50;
Total Optical System Transmission (at 650 nm) $T_O$=0.70;
Optical system f/number: 22.0.
The applicable conversions are:
The CCD sensitivity at 650 nm is 21 V/lx-s×0.65=13.65 V/lm/m$^2$/s;
the total intensity I of the LEDs is 8.0 lumens/sr for two LEDs only.

The total brightness onto the diffuser is:

$$\begin{aligned} B &= (I\omega/\pi A_{LED}) \\ &= (8.0)(.015)/\pi(2 \times 10^{-5}) \\ &= 1{,}905 \text{ lumens/m}^2\text{-sr.} \end{aligned} \tag{32}$$

The total lumination onto the bar code is given by:

$$\begin{aligned} L &= T_D B A_D / R^2, \\ &= (.9)(1905)(1.5 \times 10^{-4})/(.177)^2 \\ &= 8.21 \text{ lumens/m}^2\text{-sr} \end{aligned} \tag{33}$$

where R is the distance from the diffuser to the bar code.

The luminance L is, therefore, about 8.2 lumens/m$^2$-sr at a distance of 7 inches away.

When the optical system images the bar code onto the CCD, the final illuminance is given by:

$$E_{CCD} = \frac{\pi L T_o}{4 \, (f/no.)^2 \, (1+m)^2}, \tag{34}$$

where m is the system magnification. The illumination at the CCD is about 6.0E-3 lumens/m$^2$ for a magnification of 0.3.

The CCD converts the illumination into a voltage signal given by the following equation:

$$V_{out} = E_{CCD} \, S \, t, \tag{35}$$

where S is the sensitivity and t is the integration time. The result above indicates a signal of about 2.0 mV and, therefore, a SNR of 6.67 for a readout rate of 36 frames (scans) per second. A plot of voltage output of the CCD with distance of the scan is provided in FIG. 19.

The end-to-end simulation of an imaging CCD array reading a high spatial resolution target can be simulated by treating the individual system components as a Fourier transform operator on the input optical signal. The four main components are the input bar code, the optical lens, the readout decoder electronics and the CCD array. Since operations occur in the spatial domain, the overall system transfer function is the product of the individual components. Expressed mathematically, $$O(f) = I(f) L(f) R(f) CCD(f) \tag{36}$$

where:

O(f) is the output signal in spatial domain for a degraded bar target;
I(f) is the input bar target spatial frequency dependent on the smallest bar code;
L(f) is the lens spatial resolution or MTF;
R(f) is the readout electronics or transfer MTF; and
CCD(f) is the CCD spatial frequency or CCD MTF.
From the geometry of the CCD array, $$MTF = \text{sinc}\left(\frac{f\pi x}{f_{max} p}\right) \tag{37}$$

where:

p=cell periodicity
x=cell dimension in the x-direction
$f_{max}=1/p$ when p=x.

From detection theory, the output signal in spatial frequency must have a value of 0.1 for useful discrimination, i.e., O(f)=0.1. Therefore, if I(f)=0.55 (the contrast of the dark to light bars at 0.660 μm), R(f)=0.95 and CCD(f)=0.95 then L(f) must be >0.20 for all positions of the bar code object position.

The above includes all system components that can degrade the resolution of a perfect bar code. A term is added to include the magnification effect that occurs for a finite object as its distance to the first lens surface is varied. The limiting discernable image bar size is equal to its object size times the optical system magnification. For example, for a 0.006 inch (0.150 mm) object bar and a system magnification of 0.5, the image bar size is 0.075 mm. This is the same as 26.66 l/mm. Therefore, the lens must have the response L(26.66)=0.2, which can be expressed mathematically as:

$$L\,(2/obj \times mag) > 0.2 \tag{38}$$

where:

obj is the x-dimension of the smallest bar to be read; and mag is the magnification for the optical system.

The image of a point formed on an x,y plane can be calculated as a modulation transfer function in spatial frequency. If P(x,y) is, by definition, the point spread function, that is the distribution of points of ray intercepts at the image plane, then the line spread function is the integral of the point spread function in one direction. Therefore, $$L(x) = \int P(x,y)dy \tag{39}$$

The modulation transfer function (MTF) which determines the spatial resolution in one direction is given by:

$$MTF(f) = [A_c^2(f) + A_s^2(f)]^{1/2} \tag{40}$$

where, $$A_c(f) = \frac{\int L(x)\cos(2\pi f x)dx}{\int L(x)dx} \tag{41}$$

$$A_s(f) = \frac{\int L(x)\sin(2\pi f x)dx}{\int L(x)dx} \tag{42}$$

If the origin of the x,y coordinates is placed at the centroid of P(x,y), then the function $A_s(f) \to 0$. The expression for MTF can be approximated by:

$$A_c(f) = 1 - 2\pi^2 f^2 \left[ \frac{\int L(x)x^2 dx}{\int L(x)dx} \right] \tag{43}$$

or $A_c(f)=1-2\pi^2 f^2 B_x^2$, where $B_x^2$ is the rms blur of L(x). The relation between the point spread function P(x,y) and the rms blur of the image point is given by:

$$B=(B_x^2+B_y^2)^{1/2}. \tag{44}$$

The range over which an imaging bar code reader can function is dependent upon four variables, which are: 1) input bar code spatial frequency, 2) resolution of the optical lens, 3) resolution of the CCD, and 4) contrast of the bar code. With the assumption that high quality bar codes will be read, the contrast can be considered to be 1.0 over all spatial frequencies. (For poor quality bar codes, the contrast can drop to a value of 0.5 over all spatial frequencies.) The CCD with an 11 micron pixel pitch and spacing has an MTF of approximately 1.0 over the spatial frequencies that correspond to commonly used bar codes. (For a CCD with an 8 micron pitch and spacing, the MTF would be slightly higher but almost the same, because bar codes are being read with a spatial frequency of less than 20 line pairs per millimeter.) The two variables left as a function of each other are the bar code spatial frequency at the image plane and the degraded resolution of the lens as a function of object position. Since we are concerned with imaging objects over finite extents, we must compute the magnification (or reduction) at the image plane over the expected object distances.

The magnification of a lens system having a focal length of f=35 mm and with a nominal 30 degree total field of view used with a 28.5 mm CCD was computed from exact ray tracing over a range of object distances corresponding to 0.5 inches to approximately 20 inches from the front surface of the scanner. The magnification is selected so that, for a given distance, the complete area of the CCD array is filled up with the bar code image. This efficient use of the detector allows the maximum possible depth of field. These magnifications are listed in Table 10. The resulting spatial frequency in lines per millimeter is given by:

$$F_s=1/(\text{magnification})(\text{bar width}). \tag{45}$$

This, in effect, determines the minimum spatial resolution that must be decoded. For example, for a 13 mil (0.013") bar code at a distance of 4 inches from the scanner head, the optical resolution must be greater than 1/(0.38)(0.33 mm), or, 8 line pairs/mm. See FIG. 23 which shows that at 8 line pairs/mm, the contrast for a square wave (bar code) input of 0.91 meets the criteria of having a contrast greater than zero.

The resolution of the optical system for any object distance is determined from a square wave modulation transfer function calculation. This is the Fourier transform of the image spot size for a square wave input (i.e., bar target or bar code), which yields the spatial frequency of the spot size in lines/mm. This degraded resolution (for an object not at best focus) must be greater than the minimum required resolution. For example a maximum resolution in excess of 20 lines/mm for an object distance of 4 inches is shown in FIG. 23. This would mean that all bar codes are capable of being decoded at this object distance, since the highest minimum resolution required is 17.5 lines/mm (for a 6 mil bar code). Table 10 shows that the maximum number of the highest resolution necessary to decode a bar code of 6 mil or lower density should be 17.5 line pairs at 4 inches. FIG. 23 is the imaging diffraction square wave MTF at 5.5 inches from the scanning head, which shows the spatial resolution for all frequencies (or bar densities) at 4 inches for a 20 line pair/mm code is 0.78, which is greater than zero and can thus be decoded at 4 inches. As another example, at 2 inches away, the maximum resolution is zero at approximately 5.5 lines/mm. Point B on Table 10 shows all bar codes can be decoded except the 6 mil bar code because it has a minimum necessary resolution of 11.3 line pairs/mm, whereas all other bar codes have a minimum necessary resolution less than 5.5.

TABLE 10

| Distance (inches) | minimum resolution required (lines/mm) | | | | | |
|---|---|---|---|---|---|---|
| | mag. | 6 mil | 13 mil | 30 mil | 44 mil | 72 mil |
| 0.5 | 2.1 | 3.1 | 1.4 | 0.6 | 0.5 | 0.3 |
| 1.0 | 1.1 | 6.0 | 2.7 | 1.2 | 1.0 | 0.5 |
| 1.8(B) | .59 | 11.5 | 5.1 | 2.2 | 1.9 | 0.9 |
| 2.4 | .51 | 13.1 | 5.9 | 2.6 | 2.2 | 1.1 |
| 3.4 | .42 | 15.9 | 7.2 | 3.1 | 2.7 | 1.3 |
| 4.0(A) | .38 | 17.5 | 8.0 | 3.4 | 2.9 | 1.4 |
| 4.4 | .36 | 18.5 | 8.4 | 3.6 | 3.1 | 1.5 |
| 5.4(nominal) | .31 | 21.5 | 9.8 | 4.2 | 3.6 | 1.8 |
| 6.4 | .28 | 23.8 | 10.8 | 4.7 | 4.0 | 2.0 |
| 7.4 | .25 | 26.7 | 12.1 | 5.3 | 4.5 | 2.2 |
| 8.4 | .23 | 29.0 | 13.2 | 5.7 | 4.8 | 2.4 |
| 9.4 | .21 | 31.7 | 14.4 | 6.3 | 5.3 | 2.6 |
| 10.4 | .19 | 35.0 | 15.9 | 6.9 | 5.9 | 2.8 |
| 11.4 | .18 | 37.0 | 16.8 | 7.3 | 6.2 | 3.0 |
| 12.4 | .17 | 39.2 | 17.8 | 7.7 | 6.6 | 3.2 |
| 13.4 | .16 | 41.7 | 18.9 | 8.2 | 7.0 | 3.4 |

TABLE 10-continued

| Distance | minimum resolution required (lines/mm) | | | | | |
|---|---|---|---|---|---|---|
| (inches) | mag. | 6 mil | 13 mil | 30 mil | 44 mil | 72 mil |
| 14.4 | .15 | 44.4 | 20.2 | 8.8 | 7.5 | 3.6 |
| 15.4 | .14 | 47.6 | 21.6 | 9.4 | 8.0 | 3.9 |
| 16.4 | .13 | 51.3 | 23.3 | 10.1 | 8.6 | 4.4 |
| 17.4 | .125 | 53.3 | 24.2 | 10.5 | 8.9 | 4.6 |
| 18.4 | .12 | 55.5 | 25.2 | 11.0 | 9.3 | 4.6 |
| 19.4 | .115 | 58.0 | 26.4 | 11.4 | 9.7 | 4.8 |

By utilizing the information provided in Table 10 and in FIGS. 20–25, it is possible to determine the criteria for acceptable resolution of any given bar code or similar symbol at distances of up to 20 inches and field angles up to ±15° (total field of 30°). This wide field of view also allows bar codes to be read at a range of pitch and skew angles without requiring perfect alignment of the scanner with the surface on which the code is affixed.

In an exemplary embodiment, cost was added to the above-stated factors in selecting the CCD detector. Further, in order to permit scanning at any orientation, the detector array required square pixels.

Four CCD arrays were considered in making an initial selection: 1) Texas Instruments TC 237, Sony ICX084AL, Philips FT12 and Thompson-CSF THX 7887A. Based upon cost criteria, the first two were examined. Following this, the single most important criterion in selecting the array was that it was a black and white sensor, since this type of CCD has greater sensitivity. For colored symbologies, a different sensor would be used. Comparing the Sony black-and-white versus color sensors, the former had a sensitivity of 600 mV while the latter had responsivity of 450 mV.

For illuminating light which is red, e.g., 660 nm, the responsivity at this wavelength is of prime importance. Texas Instruments provides a spectral responsivity plot with a 2.0 V/W/m² for their CCD measured with a CM500 filter. For the Sony CCD, the total spectral responsivity stated is 700 mV, which is also covering the entire spectral band. Sony uses an illumination box with a 3200 K white light source having 706 cd/m², or 706 lumens/sr/m², with an f/8 lens (0.0156 sr) having an IR cut-off filter. The total sensitivity through the lens is then 706×0.0156 or 11.0 lumens/m² or lux. The sensitivity is the total responsivity divided by the total illumination, or 700/11=63 mV/lux. To convert lumens to watts, it is necessary to divide the sensitivity by 1/680 lumens/W, which yields 42 V/W/m². However, this is the sensitivity at the green wavelength, and a factor of 0.6 is necessary to reflect the relative response curve for the CCD at 660 nm. Additionally, another factor of 30/250 must be used to convert the 30 frames/sec and the shutter speed of 1/250 seconds to the effective integration time. Doing this yields an effective spectral responsivity at 660 nm of 42×0.6×30/250=30 V/W/m². The Sony CCD is, therefore, more sensitive to red LED light. Furthermore, it is even more sensitive at 590 nm, which is the preferred illumination wavelength.

The Sony CCD has a dark current voltage of 2 mV, while the Texas Instruments device has a value of 1 mV. This noise floor for either device is acceptable for the scanner of the preferred embodiment.

The resolution of the Sony and Texas Instrument devices are determined by the element spacing and the total number of pixels. Both the Sony and the Texas Instruments CCDs have 7.4×7.4 micron pixels. The Sony device has a total of 659 (H)×494 (V) pixels, while the Texas Instruments device has 658 (H)×496 (V), making them virtually equivalent. The modulation transfer function (MTF) of the two devices, which is based upon fill factor, pixel size and charge transfer efficiency, was the same.

The saturation voltage of the two devices was compared, with Texas Instruments having a value of 330 mV and the Sony having 500 mV. Since scanning in sunlight or other high ambient light conditions is a potential saturation problem, the higher saturation voltage was deemed more desirable.

The dynamic range of the two devices was calculated by taking the logarithm of the dark current voltage divided into the saturation voltage and multiplied by 20. The Sony device had a range of 48 dB and the Texas Instruments device had 50 dB, making them substantially equal.

Based upon the above considerations, the Sony device was identified as being more desirable for use in the scanner of the preferred embodiment. An additional factor favoring the Sony device was the it has a random shutter function so that it does not require a vertical synchronization signal and can reset itself after the first complete clock cycle. Further, it requires only a single driver device, therefore minimizing packaging space.

Now looking to the electrical components of the scanner, the drive clock sequencer and synchronization module 106 utilizes a single quartz crystal or external clock to provide all necessary logic and synchronization signals. A TTL/MOS buffer 104, as is known in the art, is included as an interface between the area array 102 and the sequencer module 106.

A pixel defect corrector 108 is included in the CCD module to manage pixel defect correction. It operates by replacing the signal of the defective pixel or pixels on a line with the signal produced by the last non-defective pixel.

Electrical power is provided to the CCD array by D.C. source or battery 46. In a first embodiment of the invention, the supply of power to the CCD array is coordinated by a clocking signal with the sequential or graduated illumination of the LEDs. Specifically, as seen in FIG. 7e, a clock signal (from clock 50) is provided to the CCD array to clear it in coordination with the activation of the LEDs. The CCD array can be scanned at a variable rate, from 36 to 200 scans per second, with the rate being determined by the density of the bar codes being scanned and the optical signal-to-noise ratio. The scan rate is set by the system clock which then modifies the illumination sequence of the LEDs so that the coordination illustrated in FIGS. 7a–7e will be maintained. The determination of scan rate can be pre-programmed and can be initiated by scanning a bar code with the scanning rate set-up information, or other relevant information, prior to measurement of the bar codes of interest.

The processing sequences are shown in FIGS. 8 and 12. The signal provided by the CCD array will be amplified then processed through a low pass two pole filter and a high pass (25 KHz–30 KHz) five pole filter (shown combined as filter 52) which will extract the useful signal any noise generated either by the incoming light or by the CCD array itself. An optional automatic gain control (AGC) 54 will adjust the level of the signal to a pre-determined level. The level of the signal entering the AGC is a function of the distance at which the bar code is scanned. The greater the distance that the scanner is held above the scanned code, the weaker the signal will be. A filtered signal will then provide a voltage to a circuit which determines the real time center point ("zero crossing") reference level to a comparator with a gain of 500,000 which will convert the analog video output signal to a digital signal representing the bar code. The use of an automatic comparator control (ACC) 56 will avoid noise generated by hysteresis and will avoid missing the white guard and the first commutation which represents the first bar in the video signal. The signal is then converted from analog to digital by A/D converter 58 and sent to decoder 26. The reference voltages to the A/D converter are selected to maximize the full scale range of the A/D converter for the offset voltage from the CCD array. The $-V_{REF}$ for the A/D converter may be made programmable to maximize the sensitivity for low light level situations. The output of the A/D converter will be latched for reading by the microprocessor, so the output value may be read while the next conversion is in progress. The analog voltage data received from the CCD array is processed by the software executing on the microcontroller. The software provides an edge detection algorithm utilizing dynamic hysteresis based upon a histogram sampling method. The interpreted edges of light and dark are output in real-time to a TTL output pin that feeds the processed signal to the bar code detector. A video signal processing module, as is known in the art, may also be used to process the analog signal to provide a digital output data stream and/or to decode and provide a signal representing the decoded information within a two-dimensional bar code.

In an alternate embodiment, rather than sequentially illuminating the LEDs, the voltage to the LEDs is regulated in response to the signal level in the detector. The stronger the received signal, the lower the intensity of light required from the LEDs. The strength of the signal is dependent upon the distance between the scanner and the bar code, so, at the maximum scanning distance, the LEDs will receive full power. This conserves power by only demanding the power that is necessary. It also avoids saturating or distorting the detected signal if the bar code is read at a short distance from the scanner with high intensity light.

Figure 6:
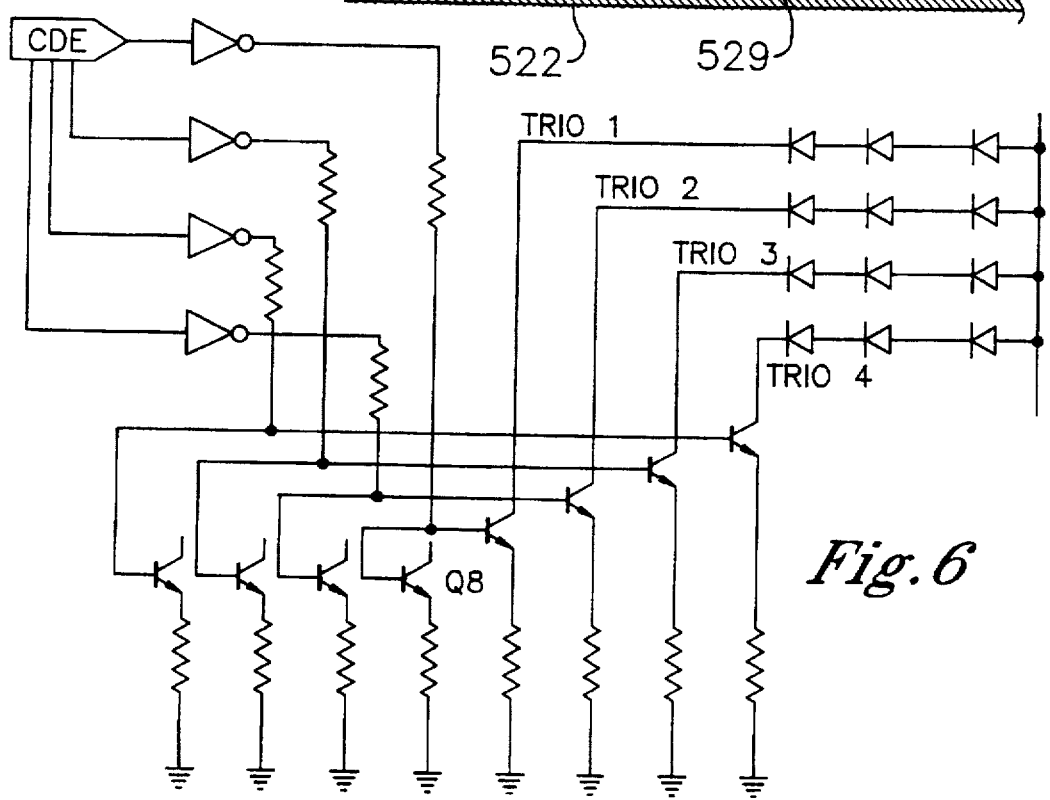
FIG. 6 is a circuit diagram of the LED board for the 12 LED configuration of FIG. 1.

The optical scanning head of the present invention provides for conservation of power supply energy by using a system clock to control a scanned, progressive illumination of the LEDs in coordination with clearing of the CCD array. The circuit diagram in FIG. 6 is provided to illustrate the sequential control of the four different LED trios which are illustrated in the embodiment of FIG. 1. For example, the clock driver provides a signal to activate amplifier U2A which then provides a signal to the first trio, identified as TRIO 1, to illuminate LEDs 5, 6 and 12. TRIO 1 is connected so that it will be on at all times that the scanner is activated, regardless of which other trios are on (note the base-collector short at transistor Q8).

FIG. 7 provides samples of pulse patterns for activation of the LEDs of the embodiment illustrated in FIG. 1. FIG. 7a illustrates the activation of the scanner at the beginning of a first clock pulse, i.e., the power is turned on. According to the pulse pattern illustrated in FIG. 7b upon application of the "turn on" signal, first trio of LEDs (TRIO 1) is illuminated. At the beginning of the second clock cycle a second trio (TRIO 2) is illuminated. Also at this time, a signal is provided to the CCD array to reset it to initiate its detection function, shown in FIG. 7e. At the beginning of the third clock cycle a third trio of LEDs (TRIO 3) turns on, and during a fourth clock cycle a fourth set of LEDs (TRIO 4) turns on. During the fifth clock cycle TRIO 2, TRIO 3 and TRIO 4 turn off and only TRIO remains on. This step up/drop down sequence is continued until the trigger is turned off at the point illustrated in FIG. 7a. In FIG. 7c a second possible pulse pattern is illustrated in which the first trio of LEDs turns on during the first clock cycle and a second LED trio turns on the second clock cycle, then turns off in the third clock cycle so that the first trio remains on until the seventh clock cycle when the second and third trios turn on for a single clock cycle. The first trio of LEDs remains on during the entire procedure and in the twelfth clock cycle, all four trios of LEDs turn on for one cycle. After a single clock cycle, where only the first set of LEDs remain on, the sequence repeats. In FIG. 7d the pulse pattern alternates between two trios of LEDs being on and turning on four trios of LEDs, with one trio being on at all times. For comparison of the inventive method to prior art practices, FIGS. 7f and 7g are provided. In FIG. 7f, a simple alternation occurs between on and off. In FIG. 7g, any combination of the LEDs remains on at all times that the trigger is activated.

Figure 9:
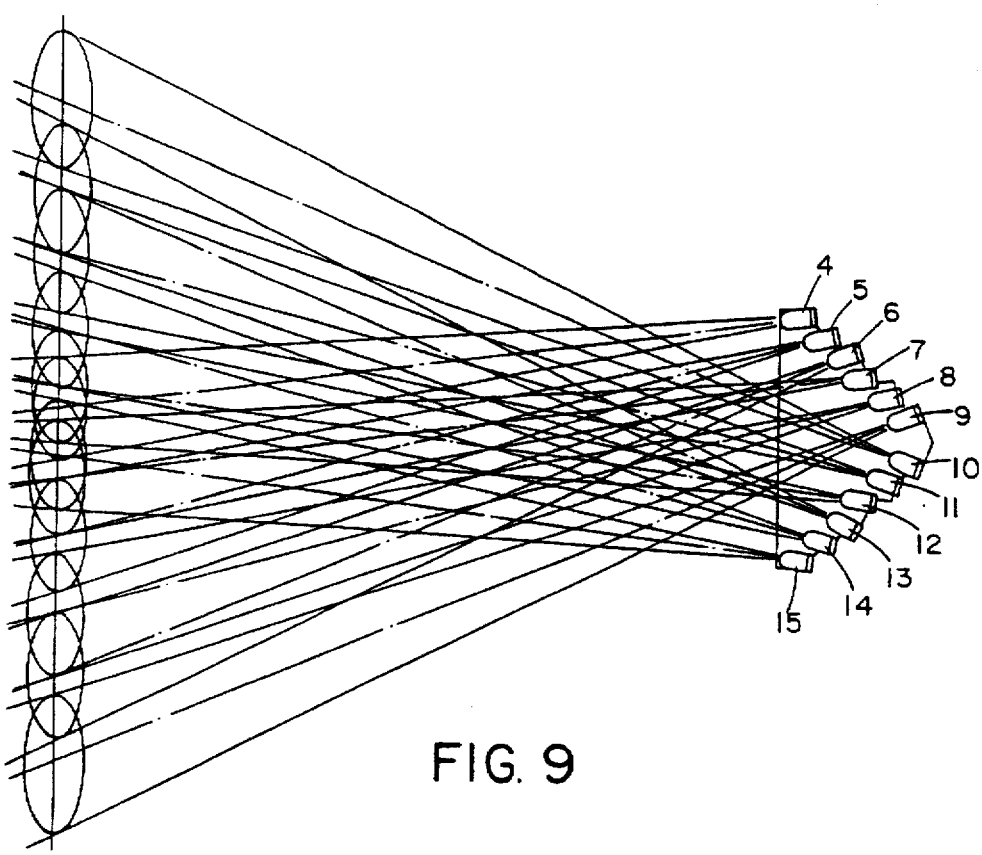
FIG. 9 is a diagrammatic view of an alternate LED layout and the corresponding light distribution.

In an alternate embodiment, power conservation is achieved by regulating the voltage supplied to the LEDs in response to the level of the signal generated by the detector array. As above, the detector signal level is dependent upon the distance at which the bar code is scanned. For greater distances, the signal level will be lower. In response to this lower signal, the voltage supplied to the LEDs will be increased. When the signal level is above a pre-determined limit, the voltage supplied to the LEDs will be less, since less light is needed to provide an acceptable signal. As an example, if the bar code is read at close range, the LEDs will be supplied with a 25% of the maximum current drain, which, in the prototype device, is 5 mA. If the bar code is read within the middle of the total field depth, the LEDs receive 50%, or 10 mA. At the outer limits of the field depth, the supplied current will be 20 mA. The percentage of power applied to the LEDs may change with the color of the bar code as needed to obtain the optimal light intensity for scanning. This power management technique will use the level of the video output signal to command and control the current on the LEDs through an appropriate clocking function The light path of the incident beam at the front region of the scanner will generate a beam of light through angular distance over a field of view across the bar code symbol located in the vicinity of the reference plane. The width of the light transmissive window 24 represents a limiting factor for the width of the incident beam. For this reason, the LEDs are mounted as close as possible to the window 24 to optimize the field of view and the incident beam power. Despite this limitation, the field of view of the incident beam is generally independent of the width of the PCB 2 or of the housing. This permits the field of view, i.e., the transverse beam dimension of the incident beam to be larger than the width of the window 24. This is due to the fact that the LEDs emit the incident beam at different directions from each side of the device within the scanning head. The LEDs are oriented to provide parallel beams in pairs. For example, a first pair of LEDs, LEDs 4 and 7 are oriented at a 7.5° angle on the y-axis (a line normal to the front of the PCB 2), 5 and 8 are oriented at 150, and LEDs 6 and 7 are oriented at 22.5°, as illustrated in FIG. 9. The LEDs on the other leg of the "V" are similarly oriented in the opposite direction. As can be seen in the figure, the fan of light which results from this orientation provides an intensity distribution which is higher within a narrow region at the center of the fan, as determined at a distance of 7 inches from the scanner.

Figure 10:
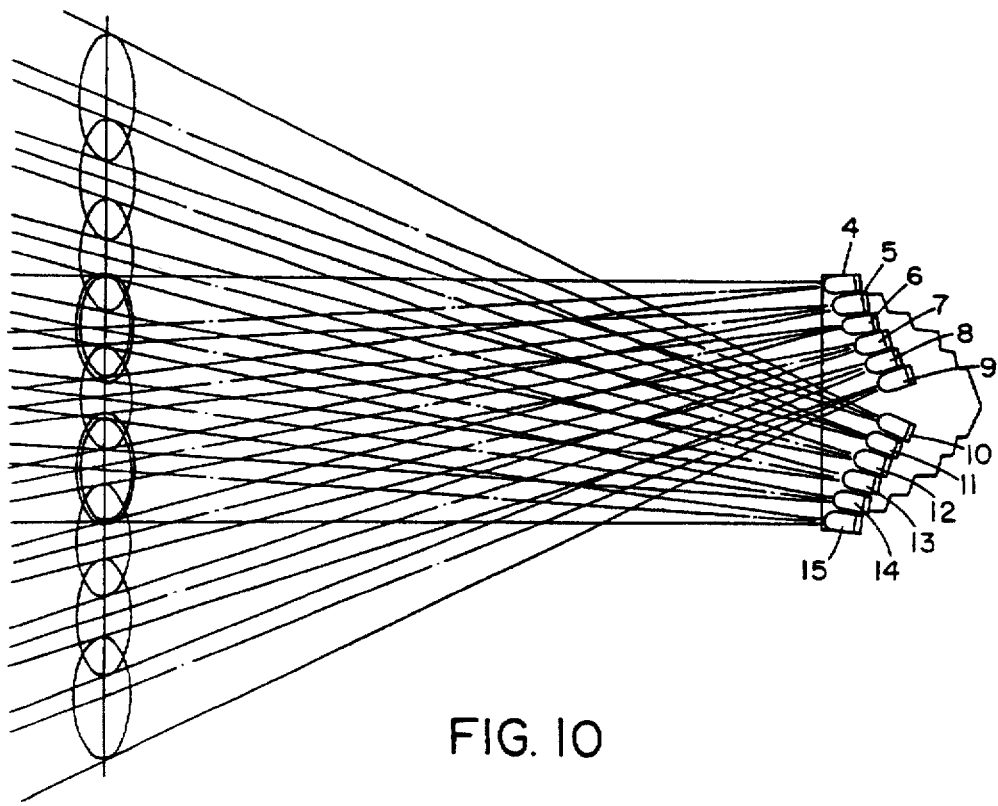
FIG. 10 is a diagrammatic view of a second alternate LED layout and its corresponding light distribution.

The alternate LED arrangement shown in FIG. 10 places the centermost LEDs at an angle of 3.75° from a line normal to the front of the scanner, with the other LEDs being oriented at 3.75° increments as they progress outward along the legs of the "V". This LED configuration results in a slightly wider region of higher intensity as compared to the above-described embodiment. It should be noted that the cylindrical lens 38 should be positioned at a distance from the LEDs corresponding to the location where the beams cross to provide the highest intensity, e.g., location 120 in FIG. 10.

A third configuration of the LEDs is illustrated in FIG. 11, which shows a line of LEDs at varying orientations. This configuration is described above, as is the fourth configuration illustrated in FIG. 27.

Other electrical sub-circuits can also be provided on PCB 2, including the analog filter 50 and A/D converter 52. However, in order to configure the housing of the scanner in desired position, it may be necessary to provide a second circuit board oriented at some angle to the first circuit board onto which additional subcircuits can be placed including a decoder chip and a memory device. For example, two circuit boards can be configured so that one abuts the other at approximate right angles to create an "L"-shaped arrangement. This arrangement would allow placement of one of the boards in the barrel of a scanning gun with the other board extending partially into the handle portion.

Figure 12B:
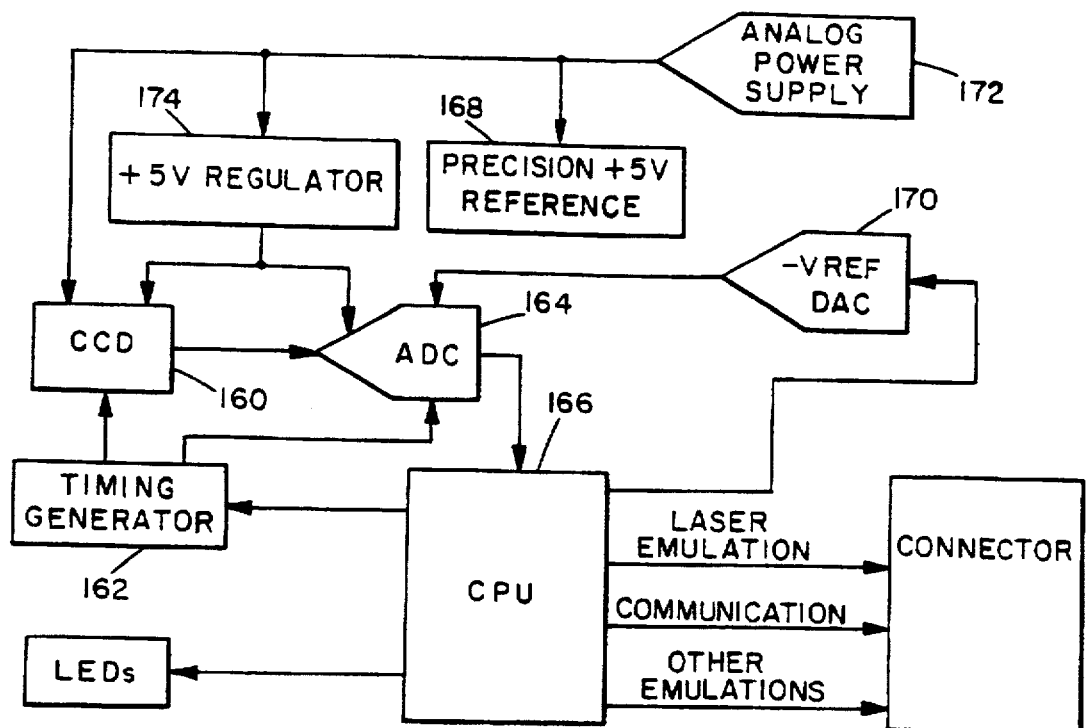

Now providing a more detailed description of an alternate embodiment, the scan sequence for which is illustrated in FIG. 12b, the optical scanning head will utilize a CCD linear image sensor array 160 for converting the bar code image into electrical impulses. In the exemplary embodiment, the image sensor is manufactured by Sony. The fixed lens assembly will focus the bar code image onto an M×N array of photosensitive sensors that accumulate an electric charge on those cells that are exposed to light. The brighter the illumination on a cell, the greater the charge accumulated over time. The sensor operates by transferring the accumulated charge in the sensor array to a charge-coupled device (CCD), which can be thought of as a shift register than can contain discrete analog voltage values. The contents of the CCD may be shifted out serially to the output pin of the device by clocking the CCD. As part of the clocking of the CCD, the charge in each CCD cell is transferred to an output stage. The charge in the output stage must be reset, otherwise the output stage would accumulate the charge from multiple pixels over time, in effect decreasing the resolution of the device.

A zero-programmable logic device is used to generate the clocks for the CCD and the A/D converter write pulse and A/D converter data latch clock. The zero-power GAL (generic logic array timing generator) 162 enters a near zero-power standby mode when the inputs of the device stop toggling. The CCD linear sensor array and the A/D converter 164 are operated in lock-step synchronization for optimum signal-to-noise characteristics.

Each pixel is comprised of two data samples. The first sample is the precharge voltage of the previous pixel in the CCD as it was being reset. This sample is made available when the external reset mode of the CCD is used, and the internal sample and hold in the CCD linear sensor is disabled. This is a sample of the low frequency noise level. The second sample is the actual pixel charge value. By subtracting the pixel charge value from the previous pixel precharge value, the low frequency noise can be effectively eliminated from the pixel signal.

Due to the limited number of product terms in the GAL 162, the state machine implemented in this GAL clocks the extraneous CCD precharge value into the output data latch immediately after the READ GATE is fired. Thereafter, the first data value that becomes available is discarded. The next subsequent data value is the real precharge value, which will then be followed by the first dummy pixel from the CCD.

The timing generator 162 supports a special mode to rapidly dump and reset the contents of the CCD. When the CCDDUMP-signal is asserted, the CCD clock becomes a "divide by 2" of the input clock (446,836 Hz). It is assumed that the CCDDUMP-signal is also connected to the CCD EXSW input, so that when the CCDDUMP-value is a zero, EXSW is zero, putting the CCD into internal reset mode. In this was, the entire contents of the CCD may be reset in approximately 4.7 ms, compared to 37.347 ms for a normal read. Even faster reset times may be achieved by programming the timing generator clock output to be a higher frequency during the reset period.

Using this feature will allow the simulation of an electronic shutter with an adjustable exposure time between 4.7 ms ($1/213$ of a second) and 60 ms ($1/16$ of a second). Even longer exposure times may be programmed by delaying the read gate between scans. When in the CCDDUMP mode, no A/D conversions take place, and no data is latched.

The timing parameters for the Sony linear sensor arrays ILX-503/703 and the ILX-505 that were used in the exemplary embodiment are provided in Table 11.

TABLE 11

| | |
|---|---|
| CPU External Crystal Frequency | 19.6608 MHz |
| CPU Internal Clock Frequency | 9.8304 MHz |
| Timing Generator Clock Divisor | 11 |
| Timing Generator Clock | 893.67 Khz |
| CCD Clock Divisor (read) | 16 |
| CCD Clock Frequency (read) | 55.854 Khz |
| CCD Clock Divisor (dump) | 2 |
| CCD Clock Frequency (dump) | 446.84 KHz |
| ILX-503/703 Total CCD Cells | 2086 |
| Time required to read ILX-503/703 | 37.347 ms |
| Maximum scans/second (503/703) | 26 |
| Time required to dump ILX-503 | 4.668 ms |
| ILX-505 Total CCD cells | 2630 |
| Time required to read ILX-505 | 47.087 ms |
| Maximum scans/second (ILX-505) | 21 |
| Time required to dump ILX-505 | 5.885 ms |

The outputs of the timing generator are buffered to CMOS levels by an external 74HC368 Hex Driver. This tri-state device provides the necessary clocking drive that the CCD linear sensor array device requires. The analog SHUTDOWN signal will tri-state the outputs of the hex driver, further minimizing power consumption.

The microcontroller 166 controls the power to two LEDs connected in series for illumination of the bar code. In addition, the microcontroller 166 will be capable of controlling the power to the CCD sensor array 160 and analog circuitry. The microcontroller 166 may optionally control the power on an external interface board so that external interfaces may be shutdown when not required. For example, the microcontroller 166 is normally in a REST mode, where all system clocking has been stopped. The microcontroller 166 will then power up and immediately enter the bar code acquisition mode when the illumination enable input is asserted.

An 8-bit A/D converter 164 is used to convert the pulsed analog pixel and precharge voltages that are output by the linear sensor array. The multiple-sources AD0820A highspeed 8-bit A/D converter using a modified "flash" technique is operated in a stand-alone synchronous conversion mode, where the built-in track-and-hold amplifier is used to sample discrete pulses of analog voltage from the CCD linear sensor array. The track-and-hold amplifier will only sample during periods of time that the output of the CCD is stable, with a wide margin stable signal prior to and after sampling. In this way, all digital switching noise generated by the CCD will be completely eliminated from the sampled pixel and precharge output voltages.

The $V_{REF+}$ positive voltage reference input will be connected to the REF02+5V positive voltage reference 168. The $V_{REF}$ negative voltage reference input will be adjustable under program control to maximize the sensitivity of the A/D converter 164. The $V_{REF-}$ Adjust reference 170 is implemented using a low cost D/A converter, specifically, a multiple-sourced AD7524 8-bit multiplying D/A converter. The AD7524 will be operated in a voltage mode by using the REF input as the output to an operational amplifier configured as a voltage follower with a gain of 2. The $I_{OUT}$ output is connected to a low impedance 2.5V voltage reference and acts as an input. This configuration allows the D/A converter to be operated from a single supply and produce a full-range output voltage swing, from 0 to the input reference voltage. Additional benefits are gained including low noise, low power, low cost, and low glitch.

The linear sensor arrays require two power supply voltages to operate. A 9V analog supply 172 is required plus a 5V timing and control power supply. The power supplies to the sensor arrays must be sequenced to prevent permanent latch-up. The 9V supply 172 must rise before the 5V supply, and the 5V supply must fall before the 9V supply. If the 9V supply is ever greater than 500 mV less than the 5V supply, permanent latch-up may occur. There is also concern about the signal degradation that may be incurred by utilizing a single +5V supply for both the analog and digital sections of the optical scanning head. High frequency digital noise injected into the power and ground planes may exceed the analog signal level, severely impacting the maximum resolution of the scanner.

To mitigate these potential problems, three separate power supplies are derived from the input +5V to the optical scanning head. The +9V supply is generated from the +5V input supply using a Linear Technology LT1111 Micropower DC-to-DC converter. The internal spar Op-Amp in the LT1111 is used as a post-regulator to minimize output ripple. A passive LC filter is also employed to reduce output ripple to a maximum of 2 mV. A TTL-compatible shutdown input is provided to the +9V supply through the use of a p-channel MOSFET high-side driver. When the shutdown input is driven above 4.5V, power to the LT111 is cut off, thereby shutting down the +9V supply. Quiescent current is limited to the leakage current from the Gate input of the MOSFET to the Drain output—approximately 100 nA.

The 9V supply provides a maximum of 140 mA of power. The +9V supply powers the sensor array, the $V_{OUT}$ transistor, a +5V band-gap reference voltage generator, and a +5V linear regulator 174.

The 5V reference voltage is generated by the industry standard REF02 band-gap voltage reference 168. The +5V voltage reference 168 is used for the $V_{REF+}$ voltage reference to the A/D converter 164, and as the voltage reference to the D/A converter 170. The +5V reference voltage is passed through a voltage divider network to derive a 2.5V reference input to an Op-Amp configured as a unity-gain follower. The output of the Op-Amp drives the D/A converter $I_{OUT}$, configuring the D/A converter 170 as a voltage output D/A converter. The Op-Amp $V_{cc}$ supply input is connected to the +5V reference supply, to minimize power-supply induced errors in the output.

An analog +5V supply is derived from the +9V supply with a Linear Technology LT1121-5 Micropower Low Dropout Regulator. The analog +5V supply is reverse-polarity shunted to the +9V analog supply by a low forward voltage Schottky barrier diode. The IN5817 diode has a forward voltage drop of 320 mV, well below the maximum 500 mV differential voltage that may cause the sensor array to permanently latch-up. The analog +5V supply powers the linear sensor array, the A/D converter, and the D/A converter.

The power supply grounds are split into 3 different ground nets. The digital ground plane is connected directly to the input ground pins on the optical scanning head connector. The +9V ground has a single-point connection to the input ground pins on the optical scanning head connector. The analog +5V ground has a single-point connection to the ground pin of the LT1121-5, which joins it to the +9V ground net. The separate routing and single-point ground net tie points are critical to minimizing coupling of digital ground noise throughout the analog section.

The decoder module 26 may be either inside or outside of the scanning head housing and will process the digitalized signal generated in the scanning head to calculate the desired data, e.g., the multiple digit representation or code represented by the bar code symbol in accordance with the algorithm contained in the software program. The decoder module includes a random access memory (RAM) for temporary data storage, and EPROM or PAL for holding the control program and a microprocessor which controls the RAM and EPROM or PAL. The decoder module will also include circuitry for controlling the scanning head and the communication circuitry for communication with different functions of the scanning head or with a host system to which the scanning head can be connected, such as a hand held terminal data screen personal computer for computer network.

A low battery detector 60 is included in the housing to provide an indication of insufficient power for further scans. This will provide advance warning so that the user will be aware of the problem before having scanned a number of items without realizing that the items cannot register properly due to the insufficient power.

An electronic shutter 16, shown in the block diagram of FIG. 16, is activated by the clock signal from clock 50 to periodically block the light impinging upon the detector 20. This creates "snapshots" of the bar code image to preserve the integrity of the bar code pattern signal as one of the scanning head and the bar code is in motion with respect to the other.

The circuitry, with or without the power supply of a portable configuration, of the optical scanner is protected within a housing 400 which is contoured to easily fit into the user's hand. The user will grip the housing 400 by its handle portion 402, illustrated in FIG. 4, with the window portion 404 aimed at the bar code symbol to be read. The trigger 406 is built within the handle 402 for easy, one-handed operation of the scanner, with the trigger 406 being positioned at a short distance from the user's fingers so that activation is simply a matter of depressing the trigger. A dual trigger, multi-position trigger or additional switch, is provided for selecting between one-dimensional and two-dimensional scanning, so that only as much power is used as is necessary to assure a high quality signal. An indicator lamp or LED 408 can be included to provide a visual signal of a "good read". Audio indicators may also be included. The window portion can be placed anywhere from 0 to 22 inches above or in front of the bar code to be scanned. With a scanning distance of less than seven inches, it is desirable to center the fan of light over the bar code since different intensities due to the sequential limitation of the LEDs may illuminate some portions of the bar code more brightly than others, and due to the higher density of light at the center of the fan. For scans greater than 22 inches, the LEDs can be replaced with a flash lamp.

The optical scanning head of the present invention provides a device for building a small or self-contained portable device, a portable component of a multi-component scanner, or the optical portion of a built-in scanning unit, for bar code scanning which uses LED and CCD technology making it an economical device. The scanning head is capable of reading bar codes up to 22 inches away from the detector with LED illumination and even more with a flash lamp, so that it is versatile for either portable or fixed implementation. The variably pulsed activation of the LEDs and CCD array, or the graduated illumination of the LEDs, makes the device capable of operating at low power with minimal power drain during illumination, a significant factor in portable scanners. The lens system and diverging beam of incoherent light produced by the LED array permit the reading of wide range of bar code densities and widths. For point-of-sale use, or industrial applications, where the scanner is fixed and the object imprinted with the bar code is moved past it, a number of optical scanning heads of the present invention can be used in combination and mounted at different angles so that, regardless of the orientation or position of the bar code, the bar code can be read. For example, a crossed or starburst pattern can be made by combining two or four scanning heads, respectively. The signal generated by each individual scanning head will be compared with signals from the other scanning heads, and the signal with the least error will be used. The signals from each scanning head may also be used to double check the signals provided by other scanning heads.

It is important to note that in this invention, an optimization of useful illumination from the LEDs is accomplished by a combination of focusing and diffusing the light to shape the beam to cover the field of view of the lens system. In the case of one-dimensional bar codes, it is a uniform linewidth of an extent which matches or overlaps the length of the bar code. In the case of two- or three-dimensional codes, it is a uniform circle, square or rectangle circumscribing the extent of the code in height and width.

FIGS. 49a–d and FIG. 53 show another exemplary embodiment of a scanning device 4900 with zoom means for varying fields of view, and including diffractive optical elements 4904 and a phase filter 4908. FIGS. 49a, 49b, 49c, and 49d show simplified plan views of device 4900, and more particularly show a top view, side view, back view and front view respectively. Housing 4930 encases the device's electronic and optical elements. The electronic elements collectively form an optical system and a microcomputer including memory and a central processing unit for executing software, each element discussed with reference to illustrations below. Preferably housing 4930 is composed of a lightweight, rigid material such as an impact-resistant plastic.

Housing 4930 includes shock mount bumpers 4918 for absorbing inadvertent impact forces for preventing shock damage to the optical elements of device 4900.

Optical elements disposed within the housing include diffractive optical elements 4904, illumination diffusers 4906, a phase filter 4908, which may be a Fresnel Phase Zone Plate (FPZP) or an Aspheric Phase Optical Element (APOE) and a movable lens system 4910 for providing two distinct fields of view. The phase filter 4908 increases the depth of field by eliminating spurious resolution degradation caused by defocusing when an operation captures the images at distances other than the optimum. Use of the phase filter eliminates the need to incorporate a focusing mechanism, which many prior art scanning devices require.

General understanding of the optical elements may be gained with reference to general discussion above. Nevertheless, in the embodiment of device 4900, these elements include modifications which are described with reference to drawings below. General discussion of diffractive optical element 4904 is provided above with reference to FIGS. 34–37. The diffuser 4906 is described generally with reference to FIGS. 1 and 17 above and the FPZP 4908 is generally described above with reference to FIG. 43. General discussion of the moving lens system 4910 is described above with reference to FIGS. 38a–b and 41. The optical elements also include a mirror 4916 for reflecting coherent light, for the framing locator system, discussed below. Lens system 4910 is driven by drive means 4920 which may be a 5 volt DC magnetic latching solenoid or DC motor driven with 5 Watts.

Device 4900 incorporates two sets of paired target illumination LEDs 4924, each pair disposed one on each side of the lens system and operating with a peak output wavelength of 590 nm. In the prototype device, each LED selected is HLMT-CL00 with 5 mm packaging. Each LED preferably has a peak luminous intensity of 6.5 lumens/steradian with a wide angular output of 23 degrees. Preferably, each pair of LEDs 4924 are oriented one on top of the other such that the total height is approximately 10 millimeters. Each pair of LEDs is disposed with a holographic optical element or diffuser 4906 in its light path that homogenizes the combined light beam to illuminate a target area corresponding to the wide field of view.

Each diffuser includes a surface relief hologram on the planar side nearest the LEDs. The LED illumination is homogenized to provide uniform intensity in the output beam. The exit face of the diffuser is formed as an asymmetric cylindrical lens to provide the output beam with an elliptical shape. The major axis of the ellipse is parallel to the optical axis 5000, and the minor axis is normal to the major axis. The elliptical aspect ratio is about 2:1 (major to minor axis). The asymmetric cylindrical lens has an elliptical angular distribution in the range of 20°×10° to 17°×7°. The preferred specifications for the diffuser are provided in Table 12a.

TABLE 12a

| | DIFFUSER 4906 | |
|---|---|---|
| Feature | Entrance Face | Exit Face |
| Radius | Plano | \(−20.7490 CX) |
| Radius Tolerance | OO | \0.2075 |
| POW/IRR | 2.0/0.5 | \2.0/0.5 |
| C.A. Diameter | 15.0 × 7.0 | \15.0 × 7.0 |
| EDGE Diameter | 15.5 | |
| Material | BK7 (Per MIL-G-174) | |
| Thickness | 4.60 | |
| Thinness Tolerance | 0.10 | |

All dimensions above are in millimeters. The final dimensions of lens should be cut to 15.5 mm×7.5 mm with a maximum bevel of 1.0 nm at 45 degrees.

Each diffuser is paired with and s paced from the two LEDs to capture the LED illumination over the entire angular output range of the LEDs. Each LED is arranged so that the full width half maximum (FWHM) of the spatial intensity of each light beam on the surface relief hologram side of the diffuser does not overlap with the other. Instead, the tails of the spatial intensity curve overlap so that the edge of the FWHM of one LED abuts, or is close to, the FWHM of the other LED. The combination of the vertically-positioned LEDs and the diffusers results in an illumination "box" at the target surface that is generally square.

The CCD sensor 4914, activated by light reflected from the optical symbology, generates an electrical charge representative of the symbology. An A/D converter converts the charge to a digital signal that is processed and segmented by machine-executed means, such as software. Eventually each segment is decoded and scanned back to the image field in memory. The maximum peak sensitivity of the CCDs corresponds approximately to the LED peak output wavelength of 590 nm. The CCD 4914 is preferably a one-third inch two-dimensional CCD having a sensitivity in the visible light spectrum from 400 to 700, with a peak sensitivity at 550 nm. The CCD array has a pixel aspect ratio of 1:1, and the overall image height to width aspect is 3:4. The CCD has an adjustable electronic shutter creating exposures in 1/60 second to 1/2500 second. As automatic gain control allows images to be captured in ambient conditions ranging from total darkness (but with LED illumination) to direct sunlight.

A band pass filter 4926 blocks radiation falling outside of a predetermined wavelength range, generally centered around the peak sensitivity of the CCD array, and at least substantially overlapping the range of the CCD array's sensitivity, to improve resolution of symbology read at CCD sensor array 4914.

In the prototype, the bandpass filter has a center wavelength of 590 nm to match the peak output wavelength of the LEDs. The bandpass filter's bandwidth as defined by the FWHM is greater than the FWHM of the illuminating LEDs. Preferably, the bandpass FWHM is 50 nm while the LED FWHM is 20 nm. The bandpass filter should transmit sufficient reflected light so that a minimum 1/60 sec. exposure can be made in normal ambient light conditions of at least 450 foot-candles or 4800 lux without LED illumination.

Laser diode 4922 comprises the aiming or framing locator portion of the optics. The frame locator function is generally described above with reference to FIGS. 34, 35, 36 and 37; however, device 4900 incorporates an alternate embodiment of the refractive optical elements. Control of zoom drive means 4920, LEDs 4924, laser diodes 4922 and other related hardware is provided by a CPU operating with software that will be described in detail below. Nevertheless, the hardware including memory for storing such software is contained on at least two printed circuit boards including printed circuit board 4902 and printed circuit board 4912. It will be apparent to those skilled in the art that the number of printed circuit boards is a design choice and depends upon mechanical and electrical constraints. For example, all the hardware could be contained on one board or four boards—whatever quantity permits the device's components to be fitted into the dimensions of the intended housing.

Figure 50A:
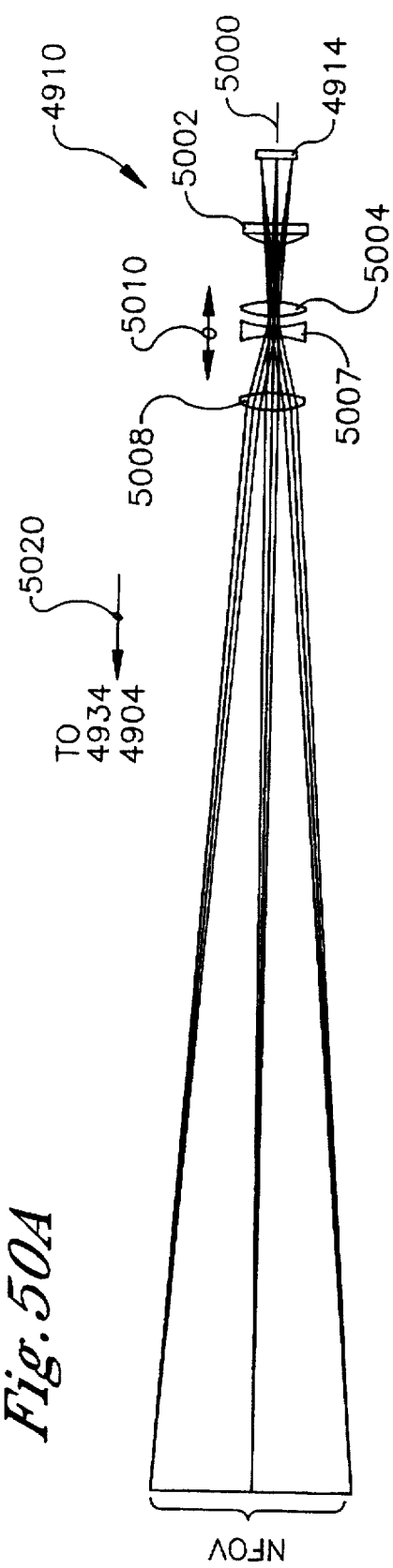
FIGS. 50a and 50b are diagrammatic views of another alternative embodiment of a frame locator for a dual focused moving lens assembly included with the scanning device of FIGS. 49a–d, with FIG. 50a showing the narrow field frame locator and FIG. 50b showing the wide field frame locator.
Figure 50B:
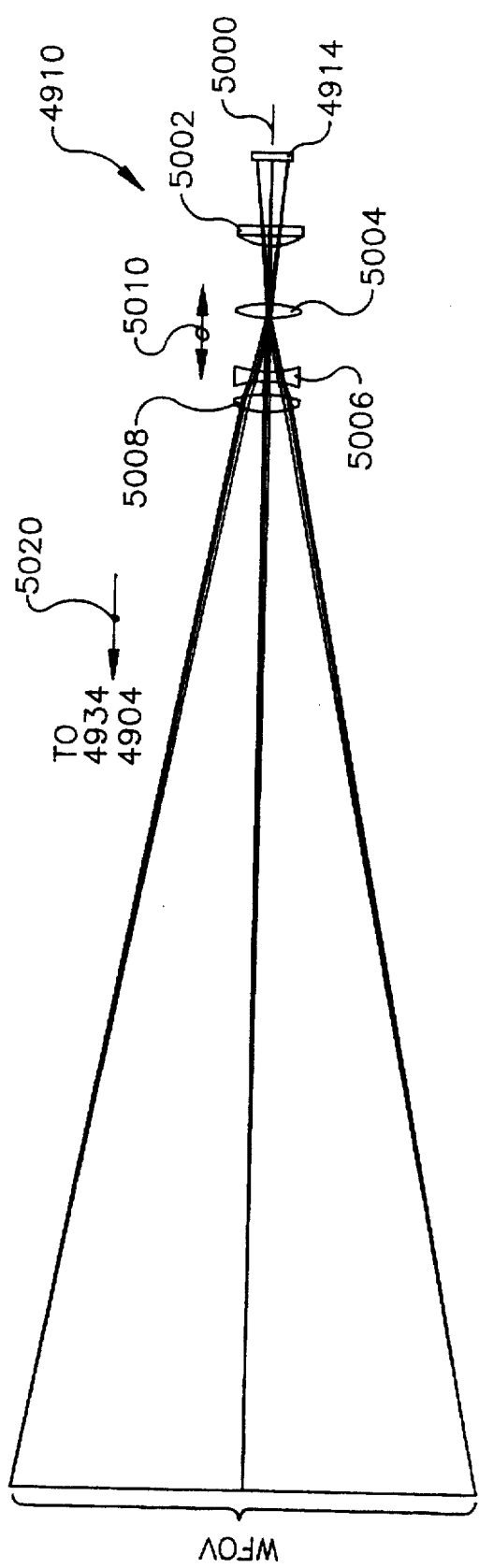

Referring to FIGS. 50a and 50b, the optical design of the imaging objects including movable lens system 4910 provides similar results as provided by the system of FIG. 41 using a combination of four lenses. Lens 5006 moves or zooms between lens 5008 and lens 5004. The preferred specifications for each lens element of movable lens system 4910 is included in Tables 12b–14. In this embodiment, lenses 5008 and 5002 are positive, and lenses 5006 and 5004 are negative. Lens 5008 is disposed farthest from CCD sensor array 4914, measured along optical axis 5000, and closest to window 4934. Lens 5006 is bi-directionally displaceable by motor or solenoid drive means 4920 along optical axis 5000. Lens 5002, near CCD sensor 4912 is stationary. An aperture stop (not shown) is placed between lens 5002 and 5004 to limit the pupil diameter in a manner apparent to those skilled in the art. When lens 5006 is positioned closest to the CCD sensor, the lens assembly provides the narrow field of view (NFOV) illustrated in FIG. 50a. When lens 5006 is moved closer to window 4934 and diffractive element 4904, this corresponds to the widest field of view (WFOV) illustrated in FIG. 50b. For the WFOV and the NFOV, the effective focal length are 10 nm and 22 nm, respectively.

The following distances produce the best results for the preferred embodiment of lens system 4910:

TABLE 12b

| POINT-TO-POINT | DISTANCE |
|---|---|
| Lens 5008-Window 4934 | 17 mm |
| Lens 5008-NFOV | 165 mm |
| Lens 5008-DOE 4904 | 8.22 mm |
| Lens 5002-CCD 4914 | 16.41 mm |
| Lens 5008-CCD 4914 | 36.22 mm |

Lens system 4910 is a four element lens system having diffraction limited performance for apertures from f/16 and greater, over the wavelength of bandpass filter 4926. The f/number remains a constant over the full movement path of the lens system. The ratio of the field of view between the two fields (NFOV & WFOV) is 2.5:1 (28 degrees horizontal, i.e., parallel to optical axis 5000, by 21 degrees vertical and 11 degrees horizontal by 8.25 degrees vertical).

The moving of zoom lens system 4910 has no vignetting at either of the two zoom positions, as described by the following:

$$EFL_1 < BFL < EFL_2 \tag{46}$$

where $EFL_1$ is the wide angle effective focal length, $EFL_2$ is the narrow angle effective focal length, and the BFL is the back focal length. Further, the zoom system is described by:

$$EFL_1 < TOTR < EFL_2; \text{ and } TOTR/BFL < EFL_2/EFL_1 \tag{47}$$

where TOTR is the distance from the surface of the lens 5002 closest to the CCD sensor unit to the surface of lens 5008 disposed closest to the target symbology. The zoom lens 4910 further obeys the following:

$$1.0 < EFL_1/EFL_{zoom} < 2.5, \tag{48}$$

where $EFL_{zoom}$ is the effective focal length of the zoom lens. Zoom lens 4910 gives the device 4900 the ability to decode bar codes with element sizes ranging from 4 mils to 72 mils.

The following tables provide the geometry and other characteristics for each lens as incorporated in the prototype device. All dimensions are in millimeters and the lenses are preferably coated for protection and to reduce reflections per MIL-C-48497.

TABLE 12c

| LENS 5008 | |
|---|---|
| Radius | 11.3494 CX\(−284.47 CX) |
| Radius Tolerance | 0.1135\2.8447 |
| POW/IRR | (−0.5)\(−0.5) |
| C.A. Diameter | 7.50\7.50 |
| Edge Diameter | 9.0 |
| Material | BK7 (per MIL-G-174) |
| Thickness | 2.00 |
| Thinness Tolerance | 0.02 |

TABLE 12d

| LENS 5006 | |
|---|---|
| Radius | (−21.1542 CC)\9.0071 CC |
| Radius Tolerance | 0.211\0.090 |
| POW/IRR | (−0.5)\(−0.5) |
| C.A. Diameter | 4.00\4.00 |

TABLE 12d-continued

LENS 5006

| | |
|---|---|
| Edge Diameter | 6.0 |
| Material | SF4 (per MIL-G-174) |
| Thickness | 1.20 |
| Thinness Tolerance | 0.05 |

TABLE 12e

LENS 5004

| | |
|---|---|
| Radius | (−910.98 CC)\(−13.8202 CX) |
| Radius Tolerance | 9.11\0.14 |
| POW/IRR | (−0.5)\(−0.5) |
| C.A. Diameter | 6.00\6.00 |
| Edge Diameter | 9.0 |
| Material | BK7 (per MIL-G-174) |
| Thickness | 2.00 |
| Thinness Tolerance | 0.05 |

TABLE 12f

LENS 5002

| | |
|---|---|
| Radius | −17.1726 CC\−7.1542 CX |
| Radius Tolerance | 0.20\0.01 |
| POW/IRR | (−0.5)\(−0.5) |
| C.A. Diameter | 7.00\7.00 |
| Edge Diameter | 9.0 |
| Material | SF4 (per MIL-G-174) |
| Thickness | 2.00 |
| Thinness Tolerance | 0.05 |

Table 13a provides a depth of field chart with an appropriate respective field of view for WFOV and NFOV.

TABLE 13a

| MEW (mils) | Narrow FOV DOV (in.) | WIDE FOV. DOF (in.) |
|---|---|---|
| 4.0 | 2.5 | N/A |
| 6.6 | 5.0 | 3.25 |
| 10 | 7.0 | 4.75 |
| 15+ | 12.00 | 10.00 |

Table 13b gives the image size in inches as measured along the optical axis from window 4934 and for each respective NFOV and WFOV.

TABLE 13b

| Distance from Window | Narrow FOV | WIDE FOV |
|---|---|---|
| Nose | .32 × .24 | .80 × .60 |
| 3.0 | .80 × .60 | 2.0 × 1.50 |
| 8.5 | 2.0 × 1.50 | 5.0 × 3.75 |
| 12.0 | 2.75 × 2.00 | 6.75 × 5.00 |

An alternate embodiment of the frame locator is illustrated in FIGS. 51 and 53. This embodiment provides the same function as that of the locator of the embodiment of FIG. 37 using a combination of diffractive optical elements and a plurality of refractive optical elements mounted on a rotating ring.

Referring to FIG. 51, laser diode 4922, which is mounted on a PCB near the rear of the device, emits beam 5118 which is carried by light pipe (fiber optics) 5110, where it is divided by beamsplitter 5112 into beams 5118a and 5118b. Mirror 5116 re-directs beam 5118a so that the two beams 5118a,b are parallel to each other and to the optical axis 5000 of the lens assembly. Beams 5118a,b impinge upon the entrance sides of diffractive optical elements (DOE) 4904. Each DOE 4904 divides the incoming beams into two beamlets—5118a into beamlets 5144 and 5146, and beam 5118b into beamlets 5140 and 5142. Each beamlet 5140, 5142, 5144, 5146, is directed toward its corresponding refractive optical element (ROE) 5130a–h of refractive optical rotary mechanism (RORM) 5335, which is shown in more detail in FIG. 53.

Now referring to FIG. 53, RORM 5335 is formed by mounting a plurality of ROEs on the edge of barrel 5450. Barrel 5350 rotates in response to movement of zoom lens 5006 (in FIG. 51) via a linkage provided by cam mechanism 5325, which includes cam plate 5340 and cam follower 5330.

Movement of lens 5006 between positions 5132 and 5134 (shown in FIG. 51) causes barrel 5350 to rotate, thus placing the appropriate ROE, which extends radially from the barrel 5350, in front of the beamlets 5140, 5142, 5144, 5146. There are two ROEs provided for each beamlet, with one ROE of each pair corresponding to the NFOV, and the other to the WFOV. The ROEs are positioned on the barrel at a distance from the DOEs to provide the correct divergence angle of the beamlets for the selected field of view.

Each ROE 5130a–h is a prism which diverts the path of the corresponding beamlet so that the beamlet impinges upon the target surface at a point corresponding to the edge, in this case, the corner, of the selected field of view (wide or narrow). To illustrate, when lens 5006 is moved forward to position 5134, to provide the WFOV, cam plate 5340 also moves forward within cam follower 5330, causing barrel 5350 to rotate, positioning ROEs 5130e–h in the paths of their corresponding beamlets, e.g., ROE 5130g in the path of beamlet 5144.

The DOEs 4904 are selected and positioned within the device 4900 to cause the beamlets to diverge at an angle to provide the correct vertical spacing for framing the WFOV. Therefore, further refraction of the beamlets in the vertical direction for framing the WFOV is not needed, and only the horizontal divergence requires modification.

ROEs 5130e–h provide greater refraction of the beamlets, causing them to be directed outward at steeper angles to correspond to the edges or corners of the WFOV. ROEs 5130e–h direct their corresponding beamlets 5140, 5142, 5144, 5146, respectively, to form spots 5121 at the target surface, thereby forming aiming frame 5120. Each ROE 5130e–h is a wedge formed from BK7 per MIL-G-174, Grade A in a 3 mm×3 mm (±0.1 mm) square with a wedge angle on the exit face of 23.0° (±0.1°), nominal edge thickness of 1.36 mm at the narrowest portion and 2.64 mm at the widest portion. The entrance face has no curvature or slope. The corners of both faces are beveled to 0.5 mm. The sloped face of ROE 5130e–h is directed to cause the beamlets to diverge in a horizontal plane, i.e., the sloped face is oriented vertically, facing outward.

For reading at the NFOV, when lens 5006 moves to position 5132, cam plate 5340 moves backward within cam follower 5330, causing barrel 5350 to rotate counterclockwise so that ROEs 5130a–d are positioned within the paths of beamlets 5140, 5142, 5144, 5146, respectively. ROEs 5130a–d introduce a shallower refraction of the beamlets so that the beamlets impinge upon the target surface at points corresponding to the corners of the NFOV (not shown) to define the aiming frame.

Since the divergence of the beamlets must be corrected in both directions (vertical and horizontal), ROEs 5130a–d are formed by assembling two different wedge elements. Each of the two wedge elements are formed from a 3 mm×3 mm square block of BK7 (as above for ROEs 5130e–h), with one face having no curvature or slope, and the other face being sloped to provide the wedge. As above, the edges are beveled. The two wedge elements are assembled with their slopes perpendicular to each other, and provide slightly different angles of refraction in the vertical and horizontal directions. The horizontal wedge element has a wedge angle of 10.5°±0.1°, with nominal edge thicknesses of 1.528 mm at the widest point and 0.972 mm at the narrowest. The vertical wedge element has a wedge angle of 11.6°±0.1°, with nominal edge thicknesses of 1.56 mm at the widest point and 0.94 mm at the narrowest. A single prism with a compound angle facet could also be used for this purpose.

Tables 14 and 15 provide image, aiming and illumination area dimensions at given distances from the scanner for WFOV and NFOV, respectively:

TABLE 14

WIDE FIELD OF VIEW
(all dimensions are in inches)

| Distance from Scanner | Image Size | Frame spacing (w × h) | Illumination Area |
|---|---|---|---|
| 2 | 1.72 × 1.29 | 1.96 × 1.39 | 2.0 × 2.0 |
| 4 | 2.70 × 2.03 | 2.94 × 2.13 | 3.1 × 3.1 |
| 6 | 3.70 × 2.77 | 3.94 × 2.87 | 4.0 × 4.0 |
| 8 | 4.68 × 3.50 | 4.92 × 3.60 | 4.9 × 4.9 |
| 10 | 5.67 × 4.25 | 5.91 × 4.35 | 5.8 × 5.8 |
| 12 | 6.65 × 4.99 | 6.89 × 5.09 | 6.7 × 6.7 |

TABLE 15

NARROW FIELD OF VIEW
(all dimensions are in inches)

| Distance from Scanner | Image Size | Frame spacing (w × h) | Illumination Area |
|---|---|---|---|
| 2 | 0.82 × 0.62 | 1.06 × 0.81 | 2.0 × 2.0 |
| 4 | 1.20 × 0.90 | 1.44 × 1.09 | 3.1 × 3.1 |
| 6 | 1.57 × 1.18 | 1.81 × 1.37 | 4.0 × 4.0 |
| 8 | 1.95 × 1.46 | 2.19 × 1.65 | 4.9 × 4.9 |
| 10 | 2.33 × 1.75 | 2.57 × 1.94 | 5.8 × 5.8 |
| 12 | 2.71 × 2.03 | 2.95 × 2.22 | 6.7 × 6.7 |

The visibility of the four framing locator spots described above with reference to FIG. 51 is calculated in a very straightforward manner. Preferably laser diode 4922 is a Sony SLD1121VS Laser Diode or one having similar characteristics. The beam is divided by beam splitter 4932, creating two beams, one incident on each diffractive optical element 4904. DOE 4904 divides the energy into two lobes of equal intensity. The zero order lobe is canceled due to the nature of the fill factor of the transmission grating. The calculated values for visibility or brightness are provided in Table 16.

Laser Diode Power: 3 mW (nominal)
Power Incident on each Diffractive Optical Element (DOE): 1.5 mW
Diffraction Efficiency of DOE: 0.8
Energy each diffraction lobe: 0.5
Total Power in each dot: 1.5×0.8×0.5=0.6 mW
Total Brightness of each dot: 0.6 mW×22 lumens/watt–13 mlumens.

Table 16

Generally speaking, the optical components described above may be grouped into four functional categories. The functional categories are the imaging system, the illumination system, the frame locator, and the depth of field enhancement system. The imaging system described above with reference to FIGS. 50a and 50b includes the lens system 4910 and band pass filter 4926. The imaging system preferably includes only one moving element and four lenses. All lenses are preferably are corrected for aspheres and aberrations and are made of low-cost materials that require no exotic glasses. A fixed aperture controls aberrations in the depth of field. This is accomplished by designing the lens system with first order geometrical optics. The illumination system includes the LEDs 4924 and the diffuser lens 4906. The frame locator described above with reference to FIGS. 51 and 53 includes the laser diode 4922, the diffractive optical elements 4904 and the mirrors 5116. The depth of field enhancement includes the phase filter 4908, and other optical elements as described above for optimizing the MTF of the optical system to a predetermined diffraction limit.

The phase filter 4908 may be a FPZP, which increases the depth of field of the lens system 4910 through a prescribed number of foci. While there may be some variation between individual scanners, and ideally, each scanner would be separately optimized, it is best to select a universal filter for economic and manufacturability reasons. A recommended choice is 75 mm behind the best focus in the narrow field of view. The FPZP is described by concentric annular zones, each having an appropriate optical density, such as that illustrated in FIG. 43. Additional detail is provided below. The FPZP imparts a phase delay to a selected zones of the reflected light. The FPZP does not reduce the lateral resolution below a minimum optical MTF required by the resolution of barcode symbology targets. The FPZP can have unequal zone increments with an optical thickness (metric thickness multiplied the index of refraction of the media) described by a linear monotonically increasing or decreasing function. The zone height preferably imparts a phase delay corresponding to $2\pi$ modula.

In the prototype, the lenses of the lens system 4910 were be obtained from the manufacturer Optimax, located in Ontario, N.Y. The band pass filter 4926 and the diffuser 4906 were obtained from Spectra Film and Physical Optics Corporation, respectively. The FPZP 4908 and diffractive optic element 4904 were obtained from the Lasiris, located in Canada, and the refractive optical element wedges were obtained from Newport Industrial in California. As will be apparent, the individual optical elements are conventional and will be available from a number of different optics manufacturers.

The diffractive optical element 4904 is a one-dimensional phase transmission grating. The transmission function of the diffraction optic 4904 is of the form:

$$F(x) = \exp\{i\phi(x)\} \quad (46)$$

where $\phi(x)$ is a real periodic function, whose period g, is equal to the period of the grating. Since the magnitude of $\phi$ is small compared to unity, F(x) becomes:

$$F(x) = 1 + i\phi(x) \quad (47)$$

In a Fourier Series the function is described by:

$$F(x) = \Sigma\, c_m \exp(2\pi i m x/d). \quad (48)$$

Thus, the phase of the central order is offset by one-quarter period with respect to the diffracted lobes. Therefore, the complex amplitude distribution projected to the target is altered from a distribution characterized by the coefficients $c_m$ where, $$c_o = \exp(i\pi/2). \tag{49}$$

The resulting intensity distribution is, $$|F(x)|^2 = 1 \pm 2\phi(x). \tag{50}$$

The phase changes introduced by optic element 4904 are transformed into changes in intensity. The intensity at any point on the target plane is directly proportional to the phase change due to the optic 4904.

The phase grating may be produced by evaporating a thin layer of a dielectric substance onto a glass substrate. Assume n is the refractive index of the substance and d is the thickness of the layer, for retardation of a quarter of a period, $d=\lambda/4(n-1)$. It is best to photolithographically etch the surface of the glass substrate with a predetermined period of d, a fill factor of 50%, and a corresponding linespacing g period where g is defined as:

$$g = n \sin \Theta/\lambda \quad (g(\text{lines/micron})). \tag{51}$$

The shape of the MTF curve can be changed in certain preplanned ways, typically accomplished by operating on a wavefront as it passes through an exit pupil. In order to alter the shape of the MTF curve, an apodization filter is used in a manner as generally described above. Thus, the wavefront passes through the apodization filter that either absorbs light energy and reduces amplitude, or introduces a phase delay. It has been determined that it is best to introduce the phase delay to avoid degrading the light gathering efficiency of the lens system.

It is known that aberrations of any optical system can be described by a power series expansion in polar coordinates, such that the wave aberration function requires only three variables known as Zernike polynomials. The Zernike polynomials include r, the distance from the optical axis to the object point, $\rho$ the pupil radius, and $\phi$ the angle between the tangential and sagittal axes in the pupil plane. Therefore the wave aberration function is defined as:

$$W(r,\rho,\cos\phi) = C00 + C11 r\rho\cos\phi + C00 r^2 + \ldots \tag{52}$$

$$C00 r^4 + C40\rho^4 + C40\rho'' + C60\rho 6 + \ldots$$

$$C31 r\rho^3 + \ldots$$

It is known that Hopkins derived an expression for the phase of an MTF in terms of a converging series of Bessel functions, for an optical system free of aberrations but suffering from defocus. Applying the Zernike polynomials, in view of Hopkins, the defocus of an optical system in the absence of all other aberrations becomes:

$$W(r \rho \cos \phi) = C20\rho^2 \tag{53}$$

Thus, the amount of defocusing is expressed by the coefficient C20. In terms of physical characteristics, defocusing is the radial aberration in the pupil. Thus, a radial phase profile would be constructive in canceling these defocusing aberrations. Therefore stating the coefficient C20 in terms of $\Phi$, the number of quarter wavelengths, becomes:

$$C20 = \Phi \lambda/4. \tag{54}$$

It is also recognized that the same problem can be expressed as one of determining the pupil phase profile to derive a predetermined amount of defocus as a function of object distance values (i.e., depth of field). This function may be transposed into a phase profile in an optical element. It is preferable to computer simulate the corresponding defocus versus spatial frequency over several object distances to achieve an optimum phase profile.

The Fresnel Phase Zone Plate (FPZP) 4908 is formed as annular zones of grooves of varying depths, which are multiples of quarter wavelengths of the light, in this case, 590 nm. As is known in the art, the varying depth of the annular zones imparts phase changes to corresponding zones of the light beam to correct for defocus. The preferred profile is a continuous cubic phase profile. In the preferred embodiment, the radial zones widths formed in a 1.5 mm fused silica plate (grade A per MIL-G-174) are of equal increments, with twenty-two zones $Z_n$ defined radially from the center outward. The step height, in multiples of Q.W.O.T. (quarter wave), are $Z_1=1$, $Z_2=2$, $Z_3=2$, $Z_4=1$, $Z_5=2$, $Z_6=3$, $Z_7=2$, $Z_8=1$, $Z_9=2$, $Z_{10}=3$, $Z_{11}=3$, $Z_{12}=2$, $Z_{13}=1$, $Z_{14}=2$, $Z_{15}=1$, $Z_{16}=2$, $Z_{17}=2$, $Z_{18}=1$, $Z_{19}=0$, $Z_{20}=2$, $Z_{21}=1$, and $Z_{22}=0$.

Alternatively, the phase filter may be an aspheric phase optical element (APOE) for increasing the depth of field of the lens system by importing a prescribed phase deviation to the incoming wavefront. The phase function is described by a two dimensional cubic phase term which causes the MTF to remain positive for all states of defocus. The phase mask is described by:

$$P(x,y) = P(x) P(y),$$

wherein $P(x) = \exp(i\phi x^3)$ and $\phi$ is the phase term. The APOE yields a MTF that is highly invariant to focus. The MTF of the lens system may be deconvolved from the MTF of the APOE to recover the MTF of the defocused image.

It is inefficient to increase the laser diode output significantly past three milliwatts because there is little increase in the photopic brightness as the power is increased. Instead, the most efficient gain comes from using a laser diode with a shorter wavelength. For example, the selecting of a 635 nm laser diode with an efficiency of 150 lumens/watt increases the brightness to 90 mlumens—a 7 fold increase. Significantly, this brightness is greater than the original unsplit and undiffracted laser diode beam transmitted into laser pipe 5110.

Regarding the illumination system, the CCD voltage output signal may be calculated in view of Fresnel losses introduced by the FPZP 4908. The filter 4926 has a filter transmission value of about 0.85, and the lens system 4910 has a lens system transmission value of about 0.82. When the lens aperture is optically adjusted to f/16 and the symbology or barcode reflectance is about 0.5, the following calculations can be made to account for Fresnel losses. The losses are referred to as a T factor in this example, $T = 0.85 \times 0.82 = 0.7$. Generally, the final illumination is given by $$E_{ccd} = (E\ R\ T)/(2F/no.)^2(1+m)^2 \tag{55}$$

where m is the magnification of the optical system, T is the system losses calculated above as 0.7, and R is the assumed barcode reflectance of 0.5.

The illumination at the CCD is a function of both the distance (i.e., magnification) and the final aperture setting or f/number selected for the system. Thus, the usable CCD voltage signal may be calculated by the following equation:

$$V_{out} = E_{ccd}\ S\ t, \tag{56}$$

where S is the sensitivity of the CCD and t is the integration time. For the preferred CCD the sensitivity is about 150 mV/lux. Based upon the considerations discussed above with reference to four CCD arrays considered in making an initial selection, it is preferred to use a CCD array having the characteristics of the Sony ICX084AL.

The total brightness onto the diffusers by LED 4924 is given by the equation:

$$B = (I\omega/\pi A) \tag{57}$$

where B is the brightness, I is the intensity, ω is the LED solid angle and A is the effective area. Where ω=0.48 sr and I=128 mlumens/sr and the effective area=1ve−4 m², B=195 lumens/m²-sr. Thus, the illumination onto the barcode is given by:

$$E = T B A/R^2, \tag{58}$$

where T is the efficiency factor similar to that value for T discussed above and R is the distance to the barcode.

The illuminance E is therefore about 1.0 lumens/m² at a distance of about 4 inches or 100 mm from the diffusers, measured along the optical axis, assuming a T factor of 0.5. In this case, the value T includes the coupling efficiency of the diffuser as well as the transmittance of the diffuser.

The preferred illumination optics characteristics are given below:

TABLE 17

| | |
|---|---|
| Source Type | LEDs |
| Packaging: | T 1 3/4 (5 mm) |
| Peak Output Wavelength: | 592 nm |
| Voltage Input: | 5 V |
| Current Draw: | 50 mA max. (peak) |
| Luminous Efficacy: | 480 lumens/W |
| Peak Intensity: | 6000 mcd |
| Input Source Intensity Distribution: | 8 degree lobe |
| LED lens | Untinted and undiffused |
| Lens Material: | Photopolymer |
| Output Illumination | 80% uniformity over wide field of view |
| Distribution: | 90% uniformity over narrow field of view |
| Area Fill: | Coverage over the wide field of view of the imaging lens (no zoom adjust) |

Table 18 gives general optical characteristics of device 4900 in a preferred configuration:

TABLE 18

| | |
|---|---|
| Resolution Min. Size: | X-axis: 4 mil and Y-axis: 4 mil (in NFOV) |
| Pattern Size: | At 12 inches (30.5 cm) from the front of the device, the pattern is 6.75 inches (17.14 cm) horizontally and 5.0 inches (12.7 cm) vertically. |
| Illumination Light Source: | 590 nm. LEDs (plus ambient light, when available) |
| Aiming Light Source: | 650 or 670 nm Laser Diode |
| Wavelength of Operation: | 560–610 nm |
| Aperture: | Fixed Aperture @ f/16 |
| Zoom Function: | Optically compensated — Movement of Second Lens Element |
| Zoom Mechanism: | 5 V DC Magnetic Latching Solenoid or DC Motor; 5 Watts Total Power; 1 second charge time and 50 msec discharge, reversible voltage |
| Solenoid Size: | 12 mm diameter × 25 mm (including shaft) with 5 mm stroke |
| Solenoid Weight: | 14 grams |
| Magnification: | 2.5 to 1; Zoom Position 1: 1/6.0× Zoom Position 2: 1/15× |
| No of Elements in Lens System: | 4; all spherical |
| Lens Element Diameters: | 10 mm |
| Lens Element Coatings: | < % Reflectance from 580–600 nm |
| Focal Length: | NFOV I: 25 mm; WFOV II: 10 mm |
| Horizontal Field of View: | NFOV: 11 degrees; WFOV: 28 degrees |
| Nominal object Distance | NFOV 5.5" WFOV 5.5" |

TABLE 18-continued

| | |
|---|---|
| (from Window (Along optical axis)) | |
| 100% Ensquared Energy: | <40 microns |
| Allowable Vignetting: | <10% |
| Allowable Distortion: | <10% |
| Overall Barrel Length: | 30 mm |
| Barrell Diameter: | 12 mm |
| Optical Lens Assembly: | 28 grams (estimated for plastic lenses) |
| Weight: | Prototype = Glass (Crown/Flint) Production = (Molded Plastic) |
| Overall Length (Lens to CCD): | ≦40 mm |
| Inaccessible Distance (CCD to Scanner Window): | 64 mm |
| Standard Filter: | Narrow Bandpass Filter (center wavelength = 590 nm) |
| Sunlight Filter: | Corning Photochromic Filter Glass or Standard Neutral Density Filter (still under evaluation) |
| Enhancement Filter: | Fresnel Phase Zone Plate (FPZP). |

Characteristics for window 4934 of device 4900 are provided in Table 19:

TABLE 19

| | |
|---|---|
| Material: | Water White Float Glass |
| Size: | Same as Symbol's GENESIS housing |
| Coating: | Both Sides <1% Reflectance 580 nm to 590 nm |
| Tilt Angle From Normal Incidence: | 5–7 degrees |
| Coating Durability: | Withstand 10 eraser rubs, tape pull and 24 hour humidity. |

The preferred framing locator optical characteristics are as follows:

TABLE 20

| | |
|---|---|
| Source Type: | Laser Diode |
| Packaging: | 7.0 mm diameter × 19 mm. |
| System Weight: | 7.5 grams (est.) |
| Supply Voltage: | 3–12 VDC |
| Input Current: | 75 mA max. |
| Peak Output Wavelength: | 670 nm |
| Peak Intensity: | 3.0 mW |
| Source Distribution: | Circular |
| Beam Diameter: | Faint Grating Device (Damson type) |
| Lens Design: | Refractive/Diffractive |
| Lens Material: | Fused Silica or Photopolymer |
| Diffractive Orders: | First Only |
| Diffraction Efficiency: | >87% |
| Number of First Order Beams: | 4 |
| Illumination Angle: | Charges with zoom or field of view position; |
| Aiming Accuracy: | Aiming spots to be located at corners of field of view to within ⅛" at a distance of 10 inches from the front of the OS4000. |

Preferably, the CCD sensor 4914 has the characteristics described below in Table 21.

TABLE 21

| | |
|---|---|
| Type | High Resolution, ⅓-in, CCD image sensor |
| Number of pixels | 659(H) × 494(V) = 32.6K pixels (32.K) |
| Pixel Size | 7.4 μm(H) × 7.4 μm(V) |
| Chip Size | 5.84 mm(H) × 4.94 mm(V) |
| Packaging | 12.2 × 11.4 mm |
| Format | ⅓" |
| Digitization Resolution | Exact 1:1 pixel correspondence between physical silicon photo sensor and pixel byte in the frame store |
| Sensitivity | No filter 256 m/lux |

TABLE 21-continued

| | |
|---|---|
| Auto Exposure | Exposure range 40,000:1. (Typical Exposure: 15 ms; Min. Exposure: 100 μs |
| Auto Calibration Functions | Automatic Exposure Control (Controlled by CPU), Automatic Black-Level Calibration |
| Print Contrast | 30% absolute dark/light reflectance |
| Resolution Differential | 0.004 inch–0.1 inch |

General electrical and power characteristics for device 4900 are as follows. Power consumption should be about 400 m/A at 5 volts (when the trigger is activated) with the device in an image grab mode and 5 mA in standby mode (non-activated trigger). If using a solenoid for driving means 4920 it should be magnetic latching with a pulse duty of about 50 msec on-time with one sec. off-time.

Table 22 gives other preferred specifications for such a solenoid.

TABLE 22

| | |
|---|---|
| Style: | Tubular |
| Overall Length: | <1 inch |
| Overall Diameter: | <0.40" (estimated) |
| Weight: | <0.75 oz. (estimated) |
| Sroke Distance: | 0.20" |
| Voltage Input: | 5 V |
| Peak Power Consumption: | 7 Watts |
| Force: | 1 oz at full stroke; 3.5 oz at start |
| Leads: | 2 lead tinned |

Figure 52A:
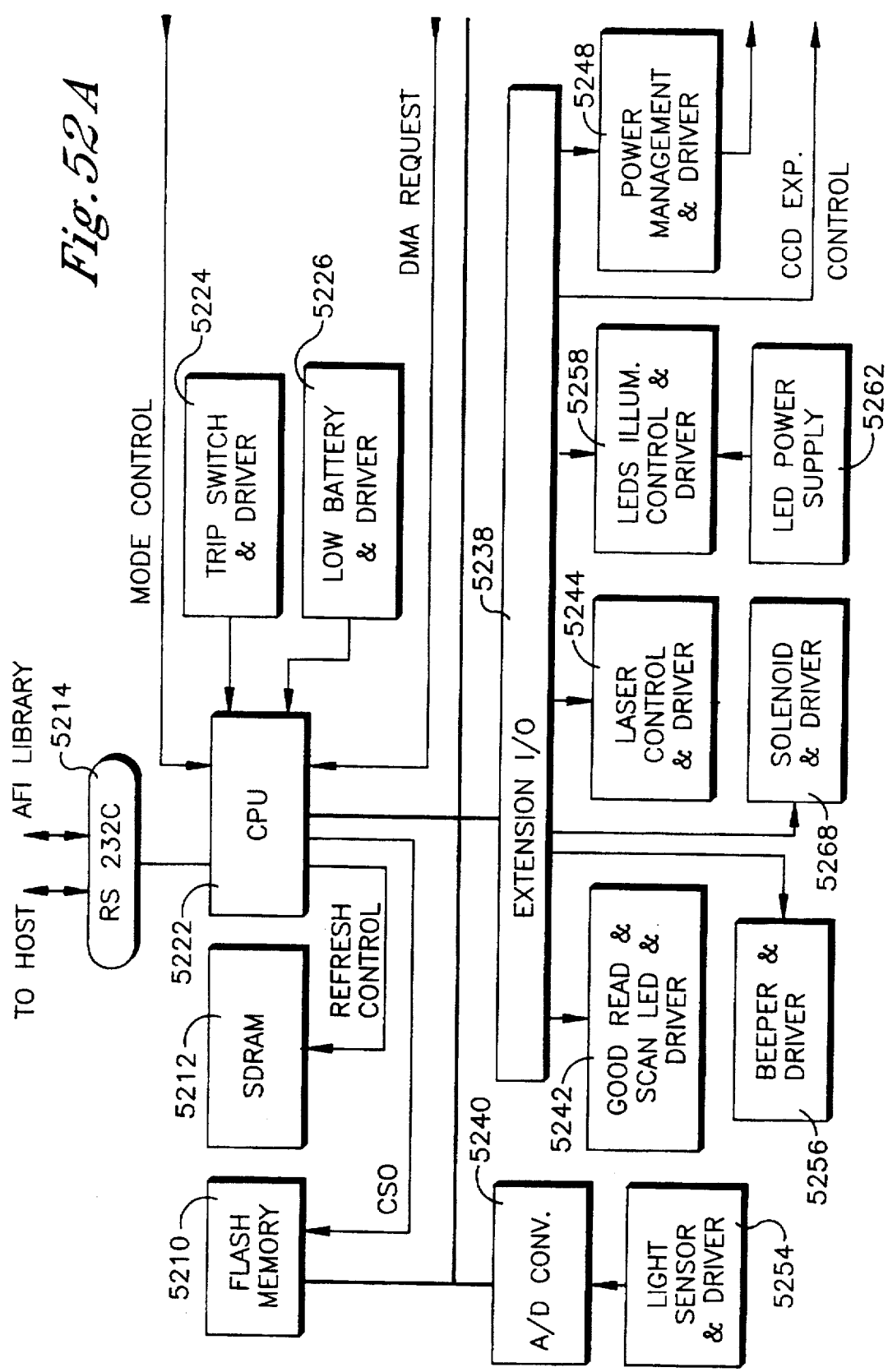
FIG. 52 is a block diagram of the electronic hardware of the optical scanning head of FIGS. 49a–d.
Figure 52B:
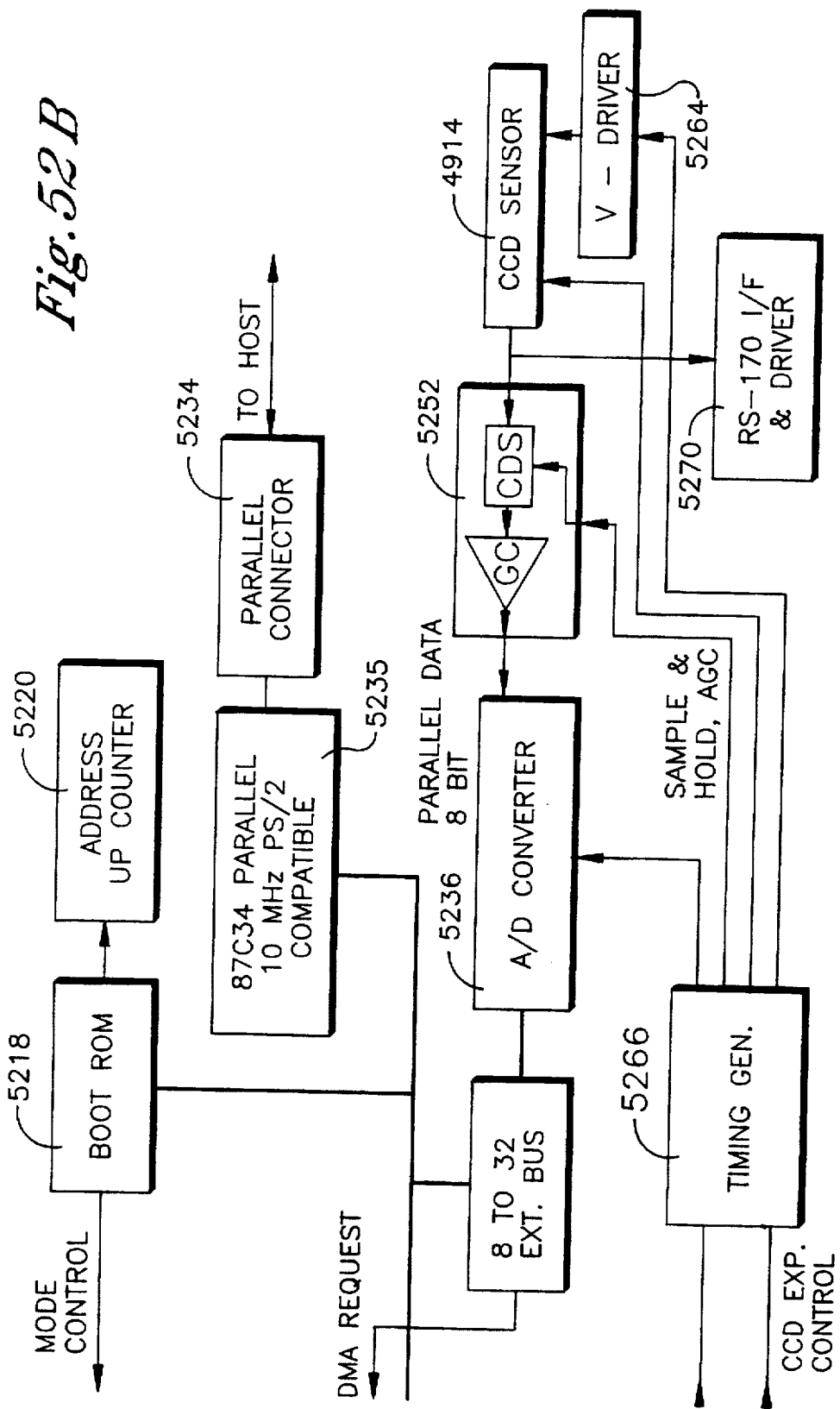

The device 4900 hardware includes two principal subsystems, a microcomputer subsystem and an image acquisition subsystem. FIG. 52 shows a simplified block diagram of the electronic hardware for the subsystems. The microcomputer subsystem includes the CPU 5222, flash RAM or flash memory 5210, SDRAM 5212 (instead of DRAM), I/O including an 8-bit bidirectional parallel port adapter 5235. It also includes parallel connector 5234 and 16 user/system single-bit I/O's 5238, a system bus interface logic included with the CPU, and other necessary logic for supporting CPU operations.

The image acquisition subsystem includes the CCD sensor array 4914, automatic gain control (AGC) including sample and hold electronic module 5252, a fast A/D converter 5236, timing generator 5266, and other logic (discussed below) for control of components and power.

Logic for control of components is provided by laser control and driver module 5244, LED illumination control and driver module 5258, beeper and driver module 5256, solenoid and driver module 5268, and RS-170 and driver module 5268. Power management and driver module 5248 provides power control in the same manner as described above with reference to FIG. 8. LED power supply 5262 provides power to the LED illumination control and driver 5258.

Light sensor and driver 5224 measures the intensity of ambient light. CPU 5222 reads the output of this sensor through A/D converter 5240. There are 256 possible read values indexed into a look-up table providing exposure times. The exposure times are provided to CPU 5222 for control of an electronic shutter included with CCD sensor 4914.

LED and driver module 5242 verifies a good read. If not, further LED illumination is provided. This way, illumination power is not wasted. All of the components communicate through the system bus to CPU 5222 through user/system I/O 5238. Nevertheless, RS/170 and driver module 5268 communicate directly to module 5252, which then communicates to the CPU. Vertical driver module 5264 is provided for timing generator 5266 for control of CCD sensor array 4914. When using a solenoid, the solenoid and driver module 5268 controls movement of moving lens assembly 4910 through drive means 4920.

The prototype device 4900 hardware is distributed on four separate PCB subassemblies. For the sake of simplicity only two PCBs 4902 and 4912 are shown; however, it will be apparent to those skilled in the art that the choice of number of boards depends on many factors such as packaging constraints. Each of the four PCB subassemblies are distributed on PCBs 4902 and 4912 of device 4900. The four subassemblies are as follows:

(1) Main subassembly PCB;
(2) CCD subassembly PCB;
(3) Image acquisition subassembly PCB; and
(4) Interface subassembly PCB.

The system bus 5250 is shared among all of the above-referenced subassemblies PCBs. Signals on the system bus will include at least the following, power lines (+5 volts), signal ground, 32 data bus lines, 24 address lines, all CPU control signals, system power mode signals (system state mode), interrupt signals and system reset signals.

The main subassembly PCB includes the CPU 5222, timing generator 5266, non-volatile flash memory 5210, volatile SDRAM 5212, system bus interface logic, universal asynchronous receiver-transmitter (UART; not shown) and programmable input-output as part of module 5238.

The CCD subassembly PCB includes the components for primary support of the CCD sensor array 5250 including timing generator 5266, vertical driver 5264, and AGC and sample hold module 5252. The image acquisition subassembly PCB includes all of the image acquisition circuitry including A/D converter 5236 and auto exposure electronics. Also the frame locator circuitry may be placed on this board.

The interface subassembly PCB contains a DC—DC voltage converter (not shown) trigger switch and driver module 5224, low battery and driver module 5226, beeper and driver module 5256, RS 232 driver interface module 5214, and an analog video interface that may optically include a well-known B&C connector (not shown). The system input voltage is preferably 5.0 volts; however, it may be necessary to use 12.0 volts for the CCD sensor array of 5250 and for programming flash memory 5210. Low power devices on all boards will probably require 3.3 volts. Well-known DC—DC converters can generate those required voltages.

A boot ROM 18 and address-up counter 5220 operate together for initialization of CPU 5222. CPU 5222 is preferably a 32 bit reduced instruction set chip (RISC) operating at 28.7 MHZ with 25 MIPS at the nominal 5.0 V. The preferred embodiment of the CPU module 5222 is a Hitachi SH-7604S 32 bit microcontroller including built-in peripheral devices and a small cache.

It is preferred that the application code for image acquisition and processing be loaded from an external host computer into the SDRAM. The SDRAM has a similar speed advantage of a dynamic RAM (DRAM) but has an advantage that it may be controlled by the CPU to maintain data during sleep mode. ("Sleep mode" refers to standby operation when no images are being grabbed.) The CPU operates in normal or standby mode. The CPU further controls memory access (DMA) transfer and DMC capability. The CPU 5222 includes a serial communication interface, a 16 bit timer and an interrupt controller, as well as a watchdog timer. The Hitachi SH-7604 CPU is a low power CMOS RISC microcontroller typically using 110 milliamps. The processor is idle in standby mode and is activated when the trigger switch and driver module 5224 indicates that the trigger has been pulled to grab an image.

CPU 5222 operating monitor software (discussed below), uploads a captured image to a host computer and downloads application programs from the host computer. General utilities for software development such as programming the flash memory 5210 and debugging are also provided on a host computer. The CPU controls serial communication to the host computer and power management for all system components. The CPU controls setup and initialization functions for beeper and good read LED module 5254. CPU 5222 controls other component drivers on the PCB, and runs user specific application code that is downloaded from the host to either flash memory 5210 or SDRAM 5212. The flash memory is preferred for this purpose.

The flash memory 5210 should have sufficient memory capacity to handle multiple software routines for signal encoding and decoding, e.g., data compression. The SDRAM 5212 receives digital data directly from CCD sensor 4914 after A/D converter 5236 converts the analog signal to digital data. The SDRAM stores an entire frame of essentially raw digital data. The use of a 1-megabyte SDRAM greatly increases performance over the prior known method of using a DRAM that requires frequent refreshing. Nevertheless, the CPU still uses memory management algorithms such as a first in and first out (FIFO) algorithm for efficient memory management. During operation of the SDRAM (non-refresh) the FIFO buffer can be written to, and a DMA transfer requested by control circuitry after a sufficient number of bits have been written into FIFO buffer.

A phototransistor or photodiode is preferably implemented as light sensor for light sensing driver module 5254 to measure light reflected from the symbology target. Shutter exposure time may be controlled, in view of this measurement, for optimal contrast and clarity. The voltage signal generated by the photodiode of light sensor and drive module 5254 is amplified by circuitry therein and converted to a digital signal by A/D converter 5254. If the ambient illumination is sufficient for exposure, then the LEDs are not activated, thus conserving power.

Table 24 describes the component type, manufacturer and their part number for particular components for the main subassembly PCB.

TABLE 24

| Component Type | Manufacturer | Part No. |
| --- | --- | --- |
| CPU | Hitachi | SH-7604S |
| SDRAM (1MB) 256R × 16 Bit × 2 banks | Hitachi | HM5241605TT |
| Flash RAM (5 BM) 256K × 16 bits (200 nsec) | AMD | Am29F400B |
| Timing Crystal (25 MHz) | Dale | |
| I/O (Serial) | Hitachi | HC374 |
| Power Management | Linear Tech. | |
| A/D Converter (Light) | Linear Tech. | 8-bit |
| FPGA | Xilinx | XC5204VQ100C-5 |

Table 25 provides similar descriptions for components on the image acquisition subassembly PCB, including illumination component, i.e., LEDs and laser diodes.

TABLE 25

| Component Type | Manufacturer | Part |
| --- | --- | --- |
| ADC (8bit, 20 MSPS) | Sony | CXD2311AR |
| DC—DC Converter | National Semicon. | LM317LZ |
| LEDs | HP | HLMT-CL00 |
| Laser Diode | Hitachi | |

Table 26 lists the preferred component type manufacturer and that manufacturer's part number for above-referenced components included on the block diagram of FIG. 52 for the CCD subassembly PCB.

TABLE 26

| Component Type | Manufacturer | Part No. |
| --- | --- | --- |
| CCD (7.4 × 7.4 um) | Sony | ICX084AL |
| Timing Generator | Sony | CXD2434TQ |
| Vertical Driver | Sony | TMC57253 |
| AGC, CDS | Sony | CXA1690Q |

Table 27 shown below includes similar information for the hardware components included on the interface subassembly PCB.

TABLE 27

| Component Type | Manufacturer | Part No. |
| --- | --- | --- |
| Connectors | Elco | |
| Beeper | Star | |
| Switch TOP | Omron | B3W-4000 (200G) |
| G.R. & Decode LED | Lumex | SSL-LX151GC |
| DC—DC Converter | National Semicon. | LM2577S-ADJ |
| DC—DC Converter | National Semicon. | LM2574M-5 |

Device 4900 is intended to have compact size with low power consumption. It may be integrated into a variety of scanning or image capture devices including a hand-held embodiment or fixed-mount embodiment. Normal operation is controlled by monitor software that is resident in flash memory 5210. The monitor software constantly monitors or listens to the serial port for executing host computer commands.

Application program interface (API) functions may be provided from an API library and loaded through serial port 5214 into flash memory or SDRAM for providing many functions including image processing and image segmentation. The monitor software transfers control to application code whenever the trigger is activated through an interrupt. After the application code is executed, control is transferred back to the monitor software. Such application-specific software downloadable from the API library includes decoding software for specific barcode symbology such as Maxi-Code or PDF417.

The CPU 5222 constantly monitors and adjusts power requirements of device 4900. All circuits are placed in stand-by or sleep mode whenever possible to conserve power. The monitor software manages power by idling CPU 5222 when possible, and turning off power to dormant circuitry, e.g., the CCD sensor 4914 and associated image capture electronics.

There are five modes of operation and all supporting subsystems can check state bits for the mode. The system modes include:

(1) Normal mode;
(2) Image-grab mode;

(3) Processing mode;
(4) Transferring mode; and
(5) Idle mode.

Normal mode is used when flash memory is being programmed and otherwise when power consumption is of little concern. In these situations, an external power source is usually available. CPU 5222 automatically senses presence of an external power source and switches to this mode. Image-grab mode is entered when trigger switching driver module 5224 indicates that the trigger has been pulled. All subsystems required for image acquisition are awaken upon activation of image grab mode, but communication components such as the hardware UART remains in power-down mode. Processing mode is entered after the image is acquired and transferred to SDRAM 5212. Then the frame grabber subsystem is placed in power-down mode to save power. CPU 5222 processes the image in the SDRAM which typically involves reading a barcode. During transfer mode, the CPU 5222 wakes the hardware UART and transfers data out through serial port 5214. Alternatively, the parallel port may be used for data transfer. Idle mode is entered when device 4900 is not in operation. CPU 5222 and all other power-consuming subsystems are placed in power-down or idle mode. When the trigger is pulled, the system mode is switched back to image grab mode.

Diagnostic software is run by CPU 5222 when device 4900 is powered on. There are two sets of diagnostics: soft and hard. Soft diagnostics check the condition and presence of components such as flash memory, SDRAM, LEDs, light sensor and laser diodes at power-up. Soft diagnostics include a complete CRC check of monitor software to ensure that there is no corruption of code. Upon successful completion of diagnostics, beeper and driver module 5256 signals a beeper signal with some predetermined number of beeps to indicate this system is ready for operation. Failure of diagnostics result in some predetermined audible signal and shut-down of device 4900. The diagnostic function can be turned "on" or "off" by a programmable selection.

Figure 54:
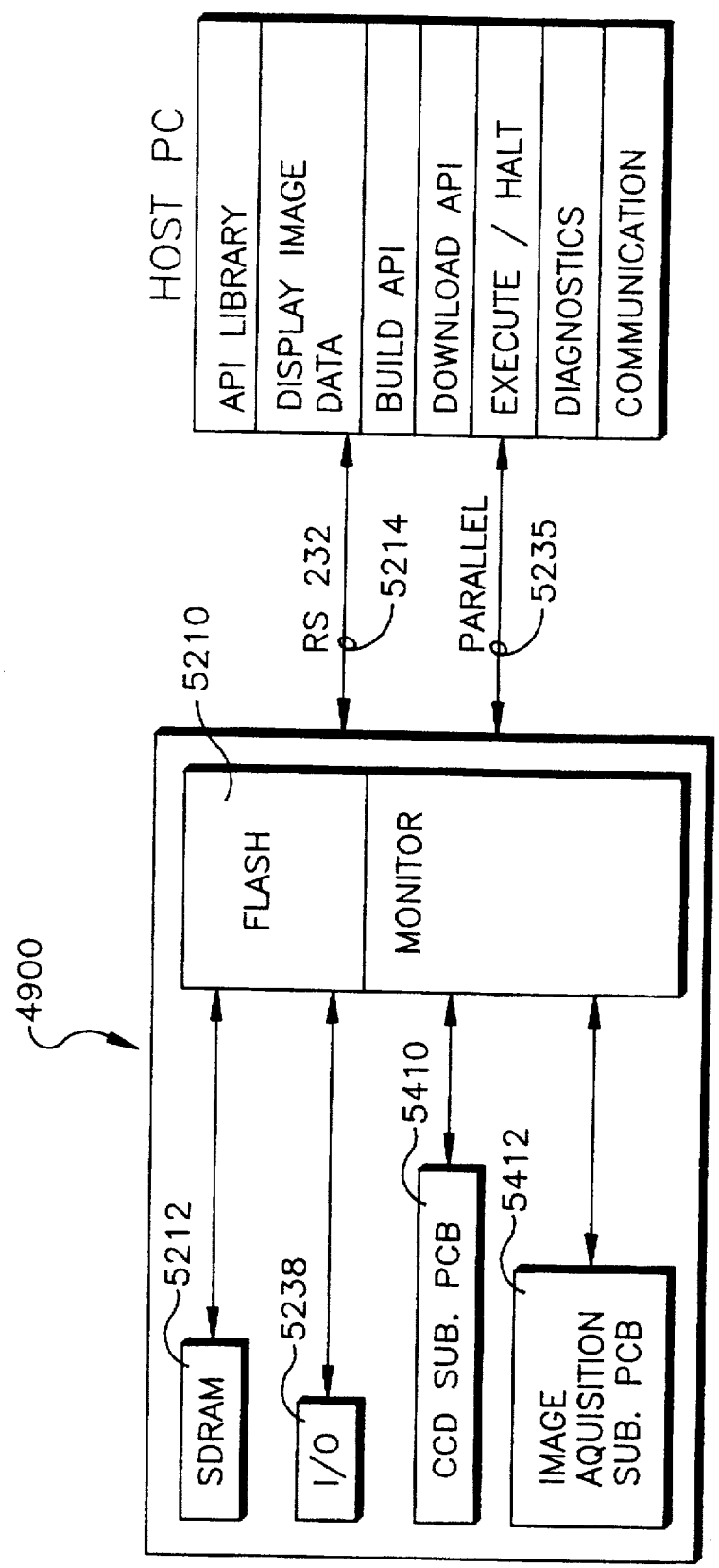
FIG. 54 is a block diagram of the hardware/software architecture of the scanning device of FIGS. 49a–d, including hardware elements of FIGS. 52, and a host PC including an application process interface (API) library.

FIG. 54 is a simplified block diagram representing an overview of the architecture of the 4900 device and the host PC. The monitor program is preferably loaded in flash memory 5210. The host PC communicates with the monitor program through RS2 or serial interface 5214. The parallel port 5235 is available for faster download/uploads. The host PC is adapted with an application program's interface or API library. Utilities for a programmer's workbench, preferably provided on the host PC accessible through a windows-based user interface, include a general utility for building application programs for the API library (API). Utilities include downloading applications to the device 4900 (download API), an execute-halt device 4900 program, hardware and software diagnostics, communications utilities. Other API library functions preferably include configurating host/device, communicating, timing math processing, image processing, image segmenting and other miscellaneous functions.

It is preferred that software for decoding images be downloaded from the host through the API library. Having such software on the host provides flexibility for adapting to symbologies as they are created. The API library preferably includes decoding software for known dimensional barcode symbologies such as PDF417, CODE 1, Data Matrix, and Maxi-Code. Further well-known decoding software for one dimensional symbology through software is also provided to the API library for UPC, EAN, 3 of 9, 12/5, and Code 128.

Certain development tools are recommended for programmers skilled in the art to program flash memory and the SDRAM of device 4900. The tools should be provided at the host PC. Such tools should include an ANSI C compiler, download-upload utilities, an assembler and a C run-time library. Further tools should include a utility library, a linker-locator, and a library manager. Programmer's tools should further include an object-file converter, a symbolic debugger, and a instruction-level simulator. Project building utilities should be provided to the programmer and an emulator for emulating operation of the CPU 5222 should also be helpful to the programmer.

The general steps for development of a software application (build API) preferably include the following steps:

1. Write software in C language on host PC.
2. Test/debug/run application on host PC using C compiler and debugging tools.
3. Build application for device 4900 using cross-development tools on the host PC.
4. Execute/test/debug device 4900 application code with a CPU 5222 simulator running on the host.
5. Download application to device 4900.
6. Run application on device 4900.
7. Optimize code by rewriting the time critical code portions in CPU 5222 assembly language. The CPU is preferably a Hitachi SH7064S and assembly language programming information is available from Hitachi.
8. Use RS232 or parallel link for monitoring code execution and displaying data in images on host PC.
9. Further test/debug on device 4900.
10. Run application stand alone, i.e., on device 4900 without host support for verifying field operation.

The application programming interface (API) is a set of C and/or assembly routines called by user programs at run-time. A brief description of the major API calls follows. The configuration functions include initializing and resetting the device 4900 and setting various systems parameters and the modes referenced above. Host communication functions provide all control over RS232 (serial)/parallel communication with the device 4900. Timer functions provide software access to the built-in timer to on device 4900. The math functions include various optimized math functions required for numerical computations, and in particular during the decoding process. The image processing functions provide various digital processing and image enhancement. Such image processing functions include histograms, equalization, threshold, analysis, and filtering. The image segmentation functions range from complex connected component algorithms to simple projection routines for decoding features, i.e, target symbologies such as barcodes from other features within the same processed image. Barcode reading functions specifically deal with barcode decoding applications. All common linear barcode decoding algorithms as well as popular 2D barcode decoding routines may be provided on the host, and programmability allows upgrading for future symbologies. API functions will also include miscellaneous functions that do not fit into the above categories but may become important at a later date. The host PC may be an IBM architecture PC having at least an Intel 80486 microprocessor and including at least a VGA level monitor and mouse pointing device. The preferred C language for development is ANSI and/or microsoft C.

When decoding software is downloaded through the API library into flash memory 5210 or SDRAM 5212, device 4900 can read all one dimensional barcodes irrespective of the orientation in the field of view, and at least the known two-dimensional barcode symbologies referenced-above.

Custom logic loaded into flash memory 5210 controls much of the image acquisition without direct interference from CPU 5222. Nevertheless, CPU 5222 performs actual data transfer and refresh of SDRAM that may be required because of image processing and generally controls any subassembly PCB. The image acquisition subassembly PCB control circuitry should be able to handle all the following tasks:

(1) Activation/Deactivation of the electronic shutters in the CCD sensor;
(2) Control of the timing generator;
(3) Control of CCD exposure time;
(4) Power management based on system mode;
(5) Control of A/D converter circuitry; and
(6) Control of illumination and frame locator circuitry.

CPU 5222 controls the image acquisition functions by using on-board control-status registers. Therefore, the CPU 5222 may reset or flush the CCD sensor array 4914 and control exposure time. The CPU 5222 may terminate the current image capture sequence and initiate a new one with a different exposure time if the captured image is not satisfactory. CCD sensor output is digitized by A/D converter 5236 and written directly by DMA request into SDRAM 5212. It is best to keep image capture time under about 30 ms. Adaptive threshold algorithms may be used to dynamically write a threshold version of the image into another bank of the two banks in the SDRAM.

The CCD sensor is preferably a Sony ICX084AL progressive transfer image sensor including an electronic shutter with variable charge-storage time. Under software control, the CPU completes the following sequence of actions during a complete image capture and decoding tasks. The initialization steps follow. First the trigger is pulled placing the system in image-grab mode. The monitor software in flash memory 5210 returns full power to all system components and CPU 5222 turns on the framing locator dots 5121.

Following the initialization, the image capture steps follow. The image is captured which includes the following steps. First, the CCD sensor array 5250 is flushed. Next, the frame grabber circuitry is reset. Then the light sensor is read by light sensor and driver module 5254. The approximate exposure time is looked up according to the illumination value read by sensor 5254. If insufficient light is detected, then illumination LEDs 4924 are activated. Mathematical functions are downloaded from the API library for image capturing. When mathematical integration is complete, the shutter in CCD sensor 5250 is closed, and the image data is transferred to SDRAM 5212. The image quality is checked to determine if it is satisfactory. If it is not, then the process begins again with the flushing of the CCD array. Then each step is repeated until a satisfactory image is captured or execution is halted.

Once the image capture steps are complete, the frame locators and LEDs are turned off, the decode LED is turned on, and the captured image is decoded. The decoded data is sent out through the serial interface or RS232 5214. The decode LED is turned off. A beep or some other audible signal is activated by the beeper and driver module 5260 to signal the user that the image is decoded. The good read LED line is then turned on. Preferably, the good read LED light is green and the decode LED is red; however, this is a design choice. Next, the device 4900 is placed in sleep or idle mode for a predetermined time, e.g., 500 ms. The beep signal is deactivated, and the good read LED is turned off.

Preferably, the monitor software is configurable for the selection of hardware and software options available to device 4900. The configuration of the software is preferably performed through the host computer via serial port 5214 or in a stand-alone mode. The CPU 5222 may be placed in a "programming" mode via the detection of a special symbology or barcode.

CPU 5222 controls laser diodes 4922 for generating frame locator beamlets, described above with reference to FIGS. 38A, 38B and 51. Laser diode 4922 is activated for a duration of time sufficient for aiming at the targeted area and framing the image. The laser diode will stay on as long as trigger switch and driver module 5224 indicates the trigger is depressed, except during image capture (i.e., when the CCD sensor 5250 electronic shutter is open). If decoding is successful, the laser diode 4922 is turned off to preserve power.

Table 28 gives the function of each pin-out for parallel interface 5235 of device 4900. Generally, image transfer data is via an 8 bit parallel interface with a TTL compatible signal level, since a serial interface would be unacceptably slow for such an operation. The direction of the data is input mode upon downloading image data or program code and output mode upon uploading image data. SDRAM 5212 may be accessed for up to a 4 KB buffer while uploading or downloading.

TABLE 28

| Pin No. | Function |
|---------|----------|
| 1 | Strobe |
| 2–9 | Bi-directional Data D0–D7 |
| 10 | ACK |
| 11 | Busy |
| 12 | PE |
| 13 | Select |
| 14 | Auto feed |
| 15 | Fault |
| 17 | Sel |
| 18–25 | GND |

RS2-232 serial interface 5214 is preferably compatible with EIA RS-232C requirements for electrical signal levels and timing of designated signals. The primary function of the serial interface is to allow communications between the monitor software and host computer. 4 KB of buffer is available from the SDRAM if needed. Preferably, the serial interface is compatible with a programmable IBM PS/2 BUS. Table 29 gives the recommended functions for each pin number for the preferred RS-232C module 5214.

TABLE 29

| Pin No. | Function | Remark |
|---------|----------|--------|
| 1 | S.G. | Earth ground |
| 2 | TX | Transmit Data |
| 3 | RX | Receive Data |
| 4 | Low Battery | |
| 5 | GND | |
| 6 | External Trigger | Input |
| 7 | CTS | Input |
| 8 | RTS | Output |
| 9 | VCC | Input +5V, +/−5% |

Hardware handshaking implements traditional RS-232 RTS-CTS flow control handshaking, that includes the modes of handshaking, DTE and DEC. If DTE hardware handshaking is enabled, then the monitoring software will assert an RTS signal whenever it has one or more characters to send. Device 4900 will only transmit characters while the CTS signal is asserted. If the CTS signal is negated, device 4900 will not send data following transmission of the current character. Transmission will resume when the CTS signal is once again asserted.

If the DCE mode of hardware handshaking is selected, the monitoring software controls the RTS and CTS lines with the assumption that an external interface connector will swap the RTS and CTS pins. In other words, the RTS output from device 4900 will be connected to the external devices, CTS input, and the device 4900 CTS input will be connected to the external devices (RTS output). When configured for this mode, the device 4900 will assert RTS whenever there is room in its receive data buffer (SDRAM). When the receive data buffer is at some predetermined "almost full" threshold level, the device 4900 will negate the RTS signal. When there is again room in the receive data buffer, the device 4900 will reassert the RTS signal.

Figure 55:
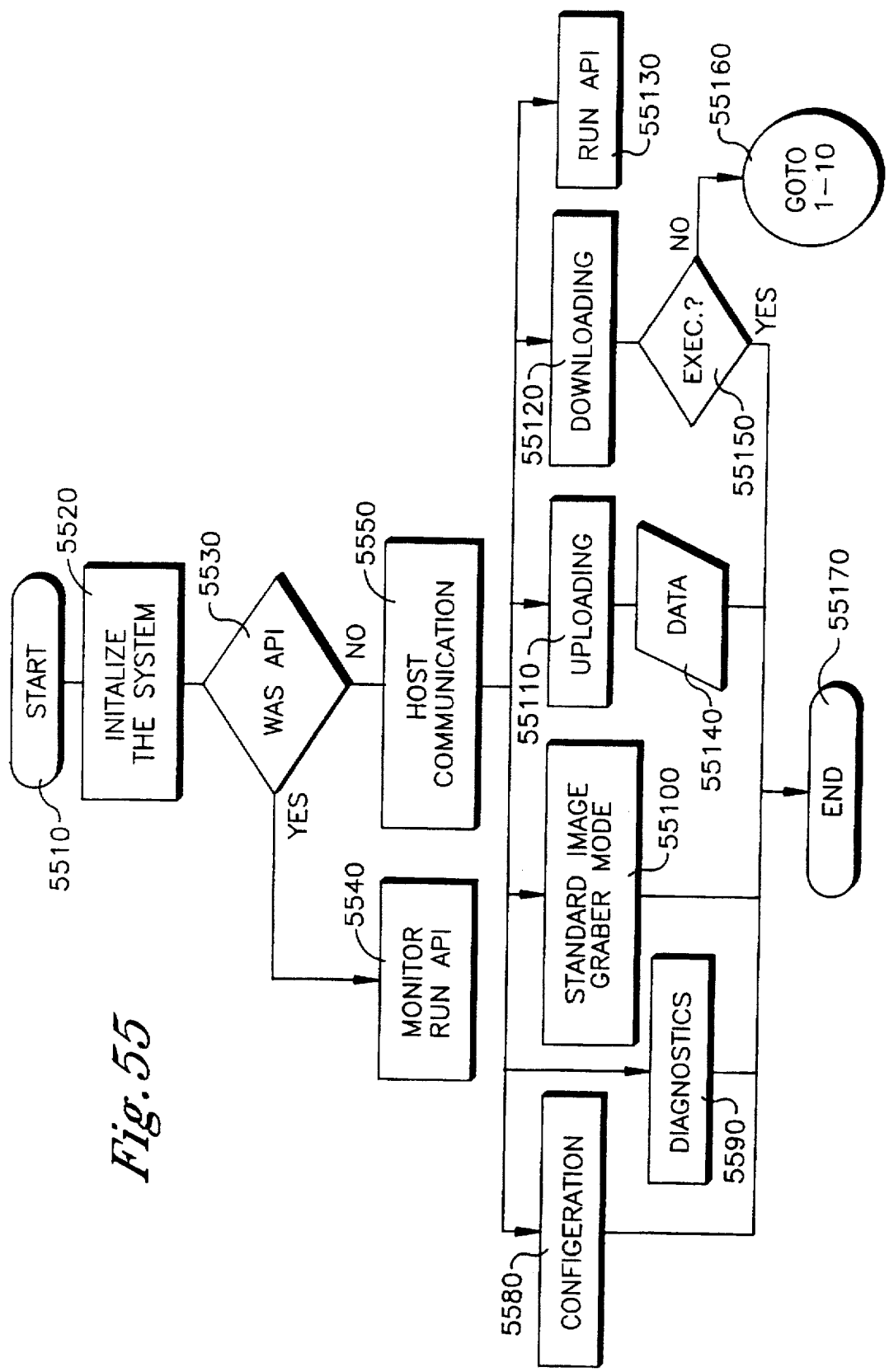
FIG. 55 is a flow diagram of the operational sequence of the monitoring software included as part of the architecture illustrated in FIG. 54.

Referring to FIG. 55, a simplified overview of the monitor software operation is shown. Step 5510 is the starting step of device 4900. In step 5520, the entire system is initialized, explained below with reference to FIG. 56. Step 5530 tests whether API software has been downloaded from the host PC to device 4900. If the answer is "Yes", then the monitor software loaded in flash memory 5210 requests the CPU to execute the downloaded application. If the answer to the inquiry of step 5530 is "No", then the monitor software enters host communication mode through either the serial or parallel interface. Host communication may involve a configuration function to be executed in step 5580, a diagnostic function to be executed in step 5590, an uploading function to be executed in step 55110, or a downloading function to be executed in step 55120. Once in communication mode, an application may be run from the API library in the host PC as shown in step 55130.

In step 55100 host communication includes standard image grabbing mode. The image is uploaded in step 55110 and processed in the data processing step 55140. Step 55150 tests whether a downloaded program is executable. If "Yes", the program executes, control is transferred from the monitor program, and processing ends in step 55170. If the program is not executable, then step 55160 begins loop execution that returns to and executes step 5530, until an API function call takes over, or execution is transferred from the monitor software in step 55170.

Figure 56:
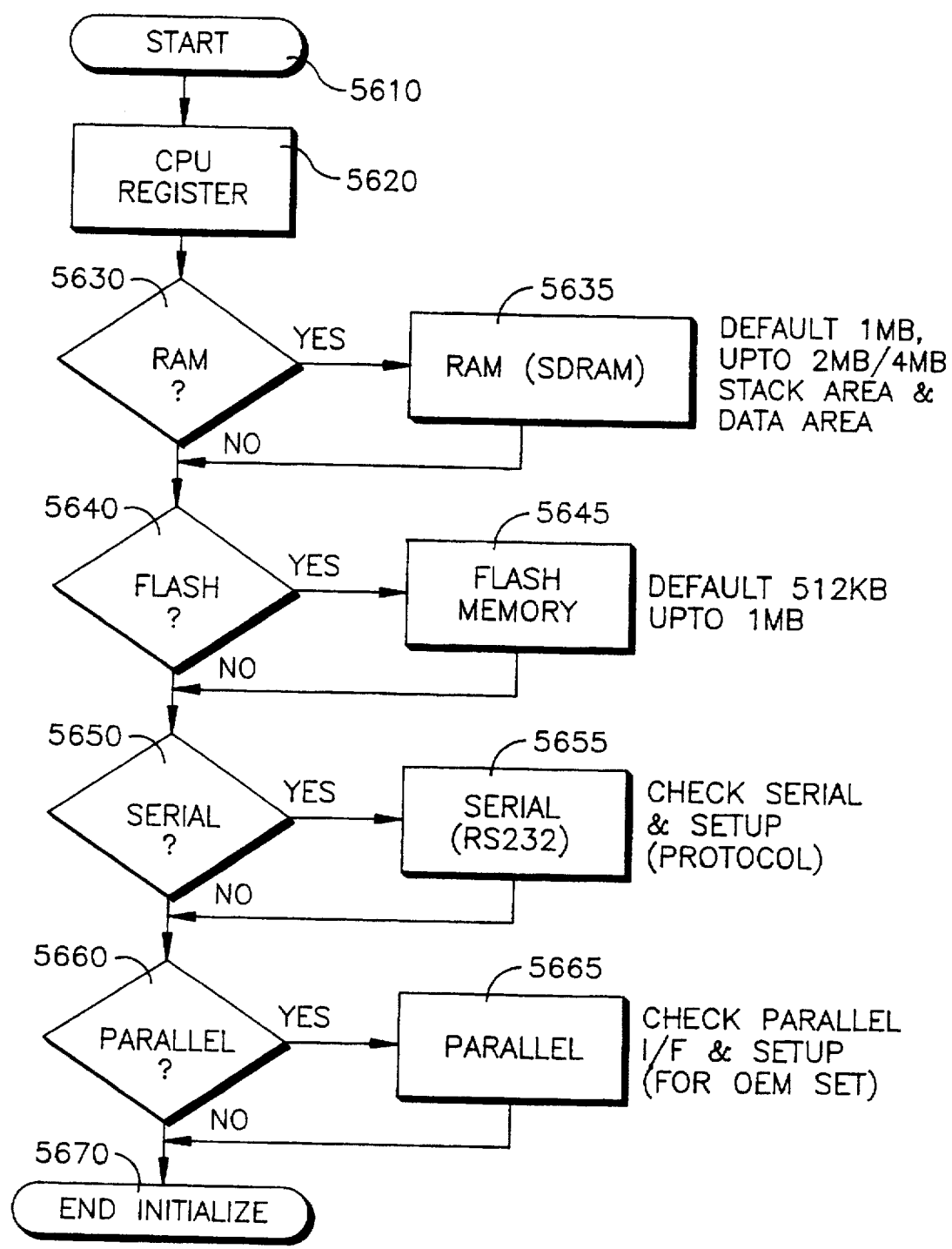
FIG. 56 is another flow diagram illustrating the operational sequence of initializing the scanner device of FIGS. 49a–d under control of the monitoring software illustrated in FIG. 55.

FIG. 56 shows a simple overview of system initialization that begins with step 5520 of FIG. 55. Step 5610 starts the process. The CPU 5222 is initialized in step 5620 setting up a predetermined cache size. Next in step 5630, the presence of ram memory is determined. If present, the SDRAM memory is initialized in step 5635 setting up a default one megabyte store including a stack area and a data area. Optionally, the SDRAM has four megabytes of combined stack area and data area. Whether the answer to the inquiry of step 5630 is "Yes" or "No", execution passes to checking for flash memory in step 5640. If the answer to that inquiry is "Yes", then flash memory is initialized in step 5645. The preferred flash memory configuration will have a default store of 0.5 megabytes, and optionally may have up to one megabyte (MB). Following these steps, execution passes to step 5650 which tests for a serial port. If "Yes" is the result of the testing query, then execution passes to step 5655 for setting up the serial (RS232) interface. Regardless of the answer to the inquiry of step 5650, execution eventually passes to step 5660. This step determines if a parallel port is present. If the answer is "Yes", then the parallel port is set up for parallel communication in step 5665. If the answer is "No", then initialization of the system ends in step 5670. If the answer is "Yes", in step 5665, then step 5670 terminates the procedure.

Referring to FIG. 57, initialization of the SDRAM is shown in more detail. Initialization begins with start step 5710. In step 5720, the address count is initialized or set to zero. This is the first step in setting up the size of the stack and data area of SDRAM. In step 5730, all available addressable areas are set, the upper level address depending on the size available (1 MB to 4 MB). In step 5750, the data is read and each data value is checked. This is done in a continuous loop fashion with the loop count increased in step 5770 until the loop count exceeds the predetermined number of loop iterations in step 5780. However, if the answer to the inquiry of step 5750 is "No", then the address count is checked to see if it is greater than the default 0.5 MB. If it is, and 0.5 MB is the set configuration, then a system error is flagged in step 5790. In step 57110, following the required number of loop counts, the address count is checked to see if it exceeds 4 MB. If the answer is "No", then the address count is increased in step 5700, looping to step 5730. However if the answer to the inquiry in step 5710 is "Yes", then the SDRAM configuration bit is set, and processing ends in step 57130.

Figures 58, 60:
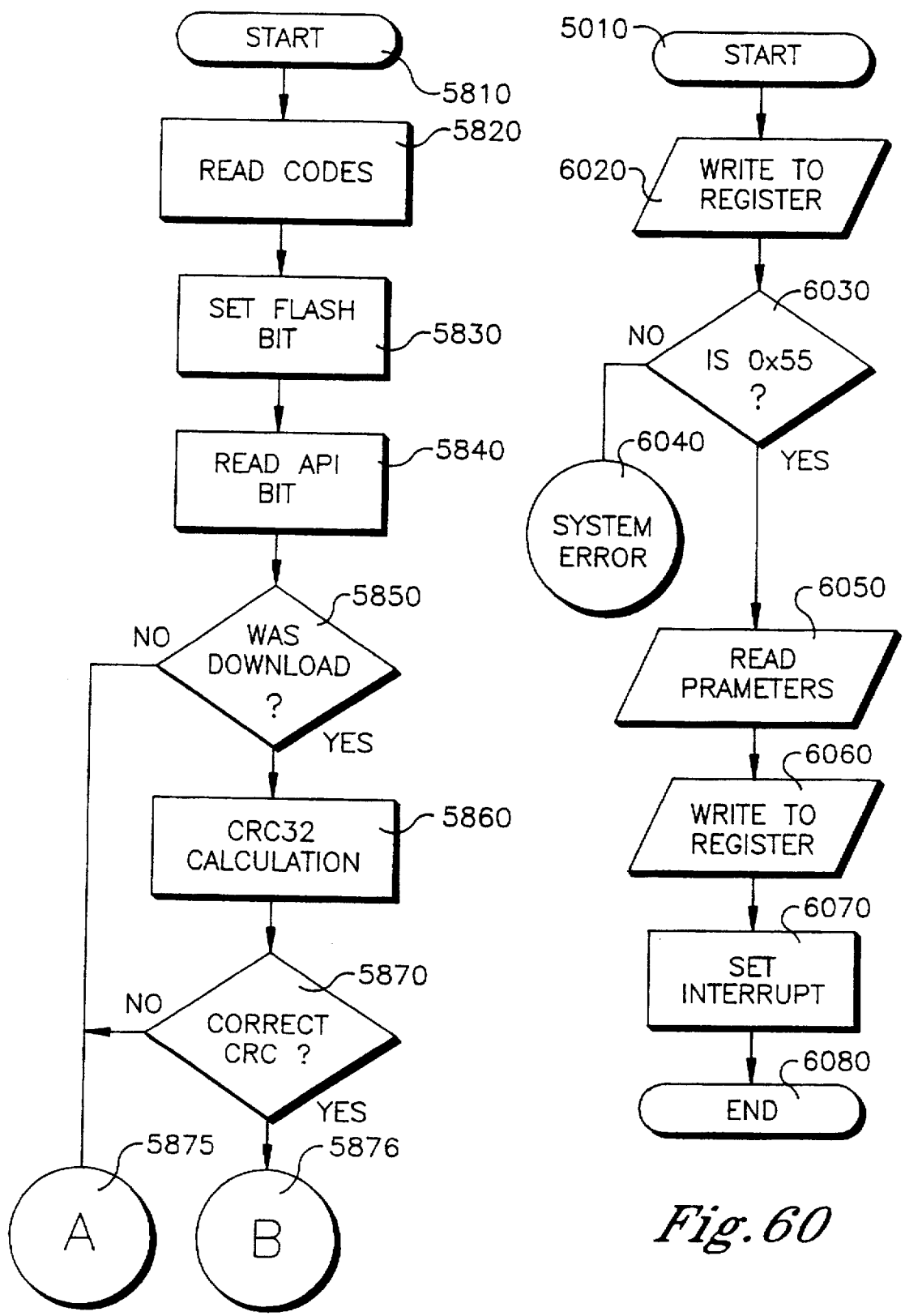
FIG. 58 is a flow diagram illustrating the operational sequence of initializing the flash memory of FIG. 52 under control of the monitoring software illustrated in FIG. 55.
FIG. 60 is a flow diagram illustrating the operational sequence of initializing the serial communications port of FIG. 52 by the monitoring software illustrated in FIG. 55.

FIG. 58 shows the initialization of flash memory 5210 starting with step 5810. In step 5820, codes are read in flash memory including the device and manufacturer's code. In the preferred configuration, flash memory is set to 0.5 MB, or optionally up to 1 MB. In step 5830, the flash memory configuration bit is set to indicate how much flash memory is present. The monitor area, sector 1 and 2, is preferably set to 48 KB, and the parameter area, sector 3, is sized at 16 KB. Any remaining sectors in flash memory are available for programming. An API bit is checked in step 5840 for indication of a download. Cyclic redundancy checking (CRC) is done to check for errors, as is well known in the art. In step 5850, if there is a download, then step 5860 is executed and the CRC bit is checked. Step 5870 checks for the correct CRC bit compared to the CRC word. If this is the correct CRC bit, then execution passes to continuation node "B" in step 5876. If the answer to the inquiry of step 5870 is "No", then processing flows to continuation node "A" in step 5875.

Figure 59:
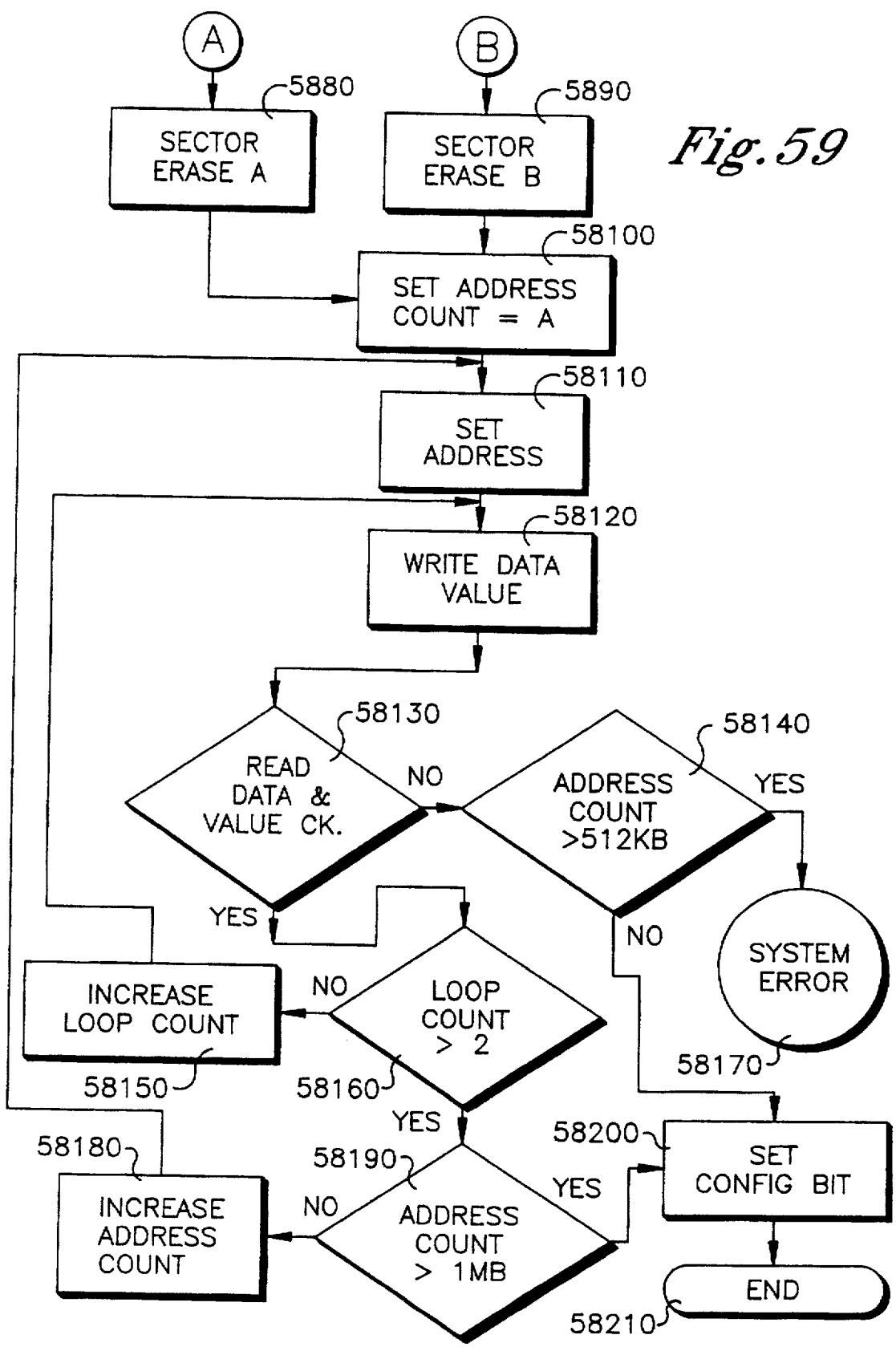
FIG. 59 is a continuation of the operational sequence illustrated in FIG. 58.

Referring to FIG. 59 and step 5880, "sector erase" A means that all programmable area is erased because the correct CRC is not present. Nevertheless, if the correct CRC is present, then in step 5890, the downloaded areas of flash memory are not erased. In step 58100, the address count is set to "A," where "A" signifies the end of the downloaded point in memory. In step 581110, the new address is set. The data value is written in step 58120, i.e., the data value is some hex values, such as 0X55 or 0XAA. Wherein, "X" signifies a variable data value indicative of the downloaded program. In step 58130, a data and value check is performed, similar to that done when initializing SDRAM in step 5750 (FIG. 57). In step 58140, if the data and value check is not satisfactory, then the address count is checked to see if it is higher than 512 KB (0.5 MB). If "Yes", then a system error is flagged in step 58170. If the answer is "No", then the flash memory configuration bit is set in step 58200. Returning to step 58130, if the data and value check is okay then processing continues to step 58160 which verifies whether the loop count is greater than 2 or not. If the loop count is less than or equal to 2, then processing continues to step 58150 and back to step 58120. Finally, when the loop count is greater than 2, processing continues to step 58190 to test whether the address count is greater than 1 MB. If the answer is "No", the address count is increased in step 55180. Loop execution goes to step 58110. The loop repeats until either a system error is flagged or the address count is discovered to be greater than 1 MB in step 58190. When the answer to the inquiry in step 58190 is "Yes", the flash memory configuration bit is set in step 58200. Processing ends for the initialization of flash memory in step 58210.

FIG. 60 shows initialization of the serial port which starts in step 6010. A register value 0X55 for recognition of the serial port is written to the CPU register in step 6020. The CPU register is read and the value is checked in step 6030. If it is the correct value, then the parameters are read in step 6050. If it is not correct, an error is flagged in step 6040. Parameters includes such things as baud rate, parity, data length, and other such well known serial communication values. These parameter values are written to a register in the CPU in step 6060. In step 6070, an interrupt is set to enable the "receiver ready" and transmitter empty interrupt. Initialization of the serial port ends in step 6080.

Figure 61:
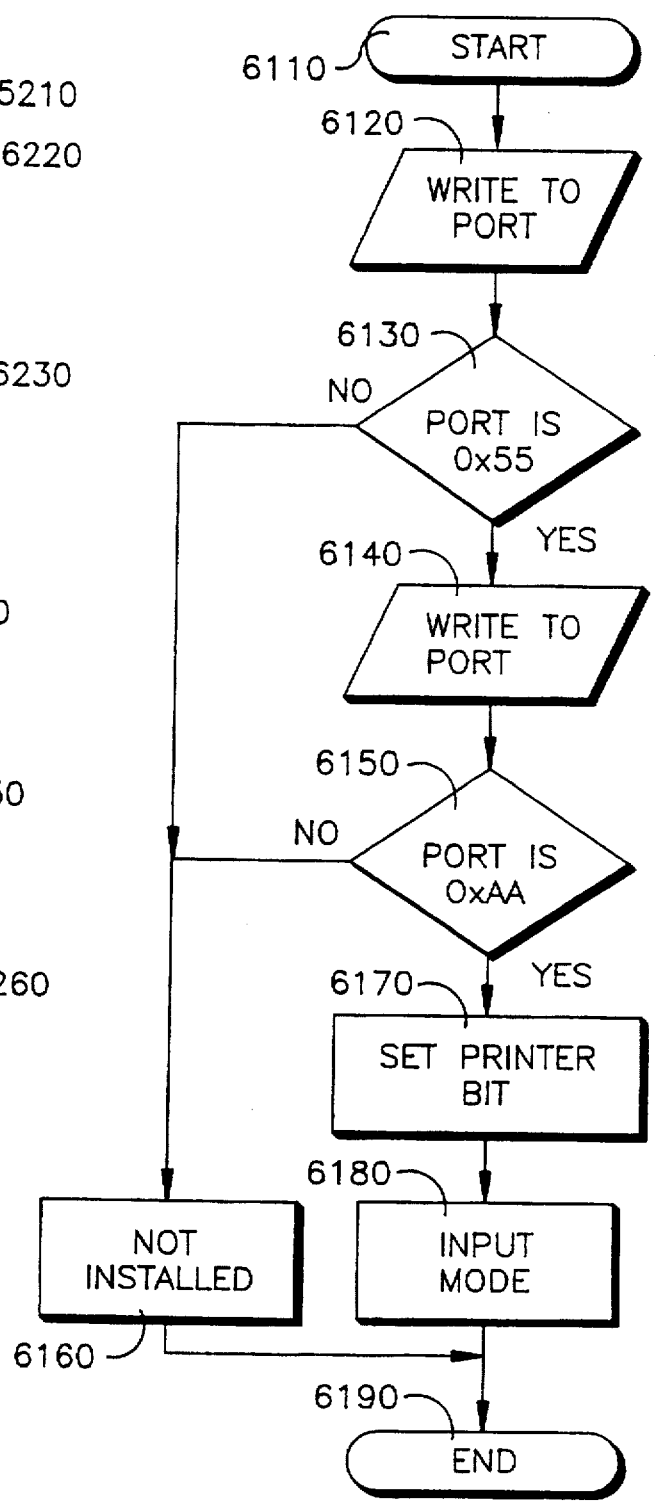
FIG. 61 is a flow diagram illustrating the operational sequence of initializing the parallel port of FIG. 52 under control of the monitoring software illustrated in FIG. 55.

The initialization of the parallel port is shown in FIG. 61 beginning with step 6110. In step 6120, the output mode and port register value are written to the parallel port. The port register value is set to a hex value, such as 0X55 for testing that the port is addressable is step 6150. Recall that "X" is a variable to be replaced by a hexadecimal character. If the port value is correctly set in step 6130, the answer to the inquiry is "Yes", and the output mode will be set to zero while the port register is rewritten to a hex value, such as 0XAA. If the answer is "No", a message is posted in step 6160 to indicate that there is no parallel port. This is not an error condition because the parallel port is considered optional. Considerations for whether or not to include the parallel port are cost and available space balanced against faster communication speed. In step 6150, if the port register value is reset to the correct value, then the input mode value is set to zero, and parameter values are read from the register port. If the port register value is not set correctly, the answer to the inquiry of step 6150 will be "No" and a message of step 6160 indicating that a parallel board is not installed is posted. If the answer to the inquiry in step 6150 is "Yes", processing flows to step 6170. In step 6170, a printer bit is set to indicate printers are available. Next, the input mode interrupt is set for host data input in step 6180, finally initialization of the parallel port ends in step 6190.

Figure 62:
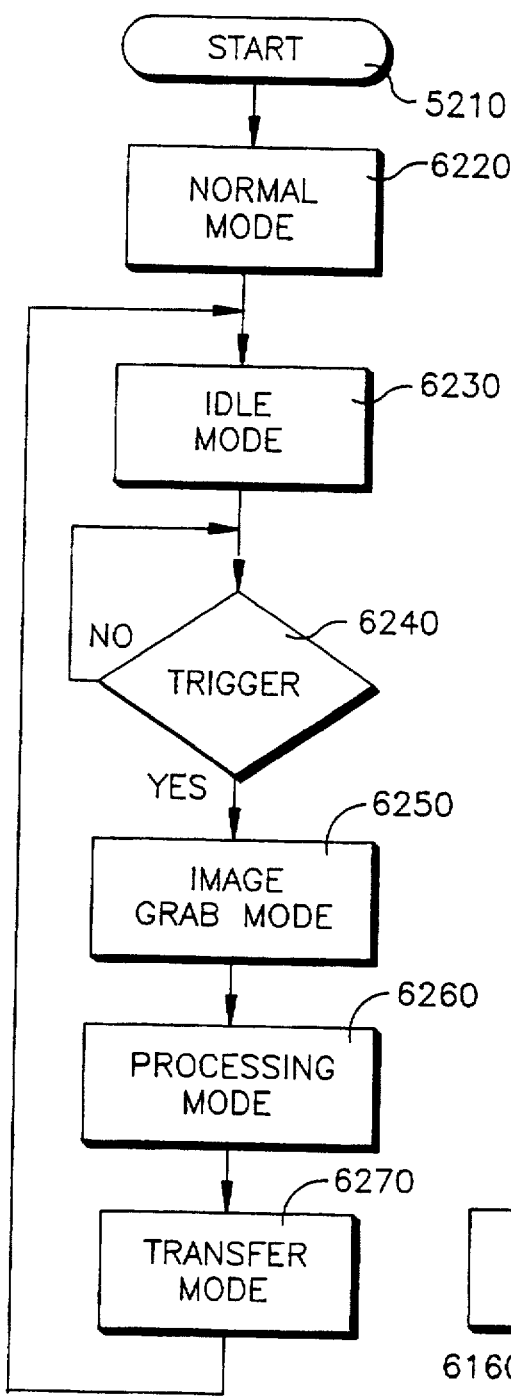
FIG. 62 is a block diagram illustrating the operational sequence of power management by the monitoring software illustrated in FIG. 55.

The power control process is shown in FIG. 60 and it starts with step 5210 of FIG. 62. The device 4900 provides power management by inclusion of a power management and driver module 5248 under control of the CPU and operation of monitor software loaded in flash memory 5210. The reset period for normal mode is set in step 6220. Idle mode is set in step 6230 which powers down the CCD image acquisition subsystem, the illumination LEDs, and the laser diode. The idle mode also places the CPU into standby mode. Idle mode is kept until the trigger is pressed. The state of the trigger is tested in step 6240. Once the trigger is pressed execution of the process continues in step 6250. Pressing the trigger puts the device in image grab mode. In image grab mode the CPU returns to a ready state (wakeup), the CCD sensor 5250 and the image acquisition subsystem turn on, including illumination LEDs and laser diode. Once the image is grabbed, execution of the process continues in step 6260, which begins image processing mode. In response to an indication of processing mode, the CCD array is turned off to save power. When the device enters image transfer mode the image data is transferred to the host for analysis. Then the laser diode 4922 and LEDs 4924 are turned off. Processing continues in a loop until power is totally removed from device 4900.

Figure 63:
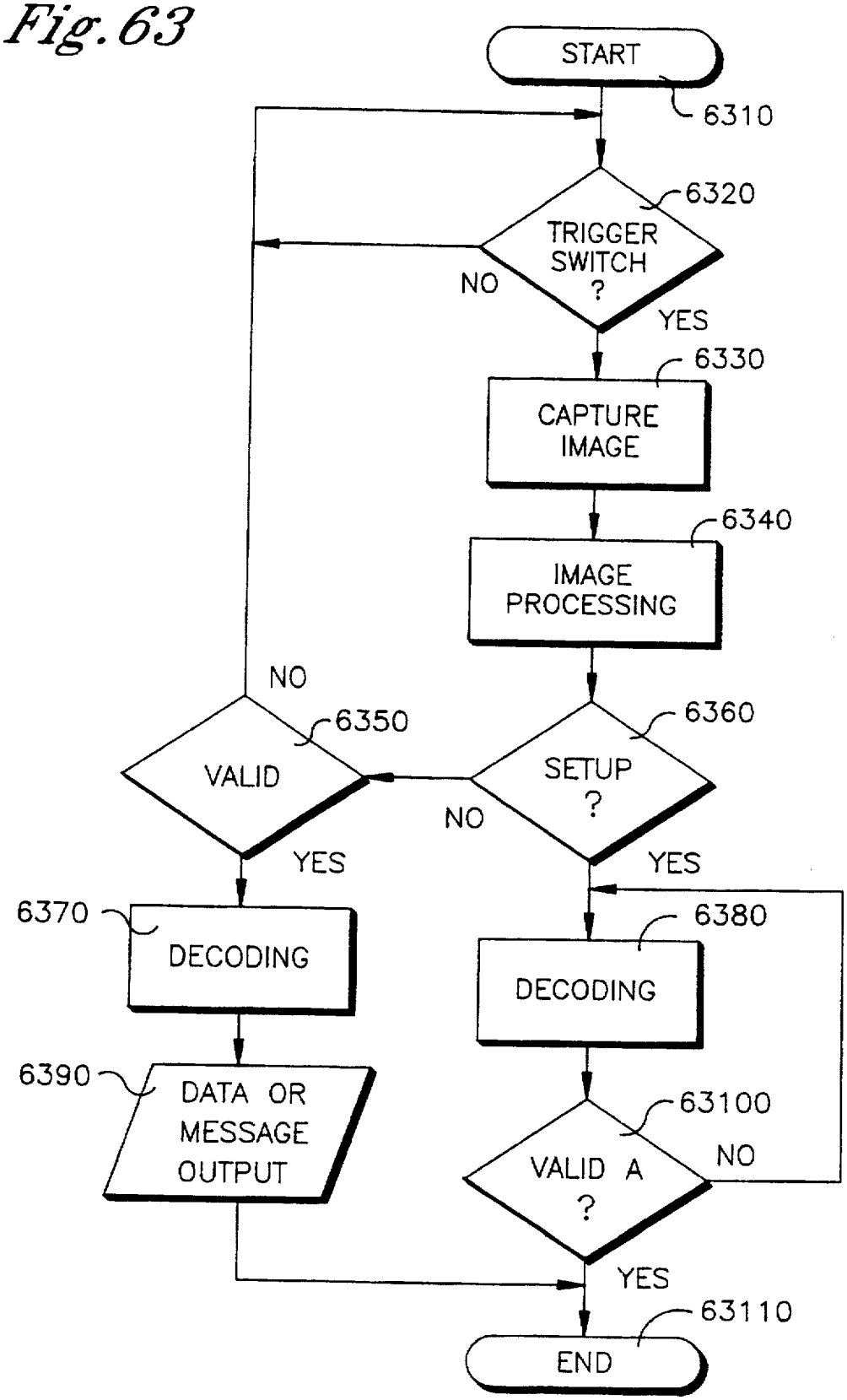
FIG. 63 is a flow diagram illustrating an overview of the operational sequence of processing optical images captured by the scanning device of FIGS. 49a–d.

FIG. 63 shows a simplified overview of the image capture and processing method. The processing begins in step 6310. In step 6320, an inquiry is posed to see if the trigger switch has been pressed. If the answer is "Yes", the image is captured and processed in step 6330 and 6340, respectively. Next an inquiry in step 6360 to test whether the system is setup for decoding target symbology. If the answer is "No", this captured image is tested for validity in step 6350. If invalid, execution continues in a looping fashion to allow time for set up to occur. If setup is fine or the image is valid, decoding occurs in either step 6370 or 6380. Following step 6370, the image data is outputted in step 6390. A test of a bit indicating if the decoding image is valid is performed in step 63100. If it is then the process ends in step 63100. If not, processing flows back to step 6380 and continues until the bit indicates the data is valid in step 63100. When processing ends in step 63110, device 4900 is placed in stand-by mode.

Figure 64:
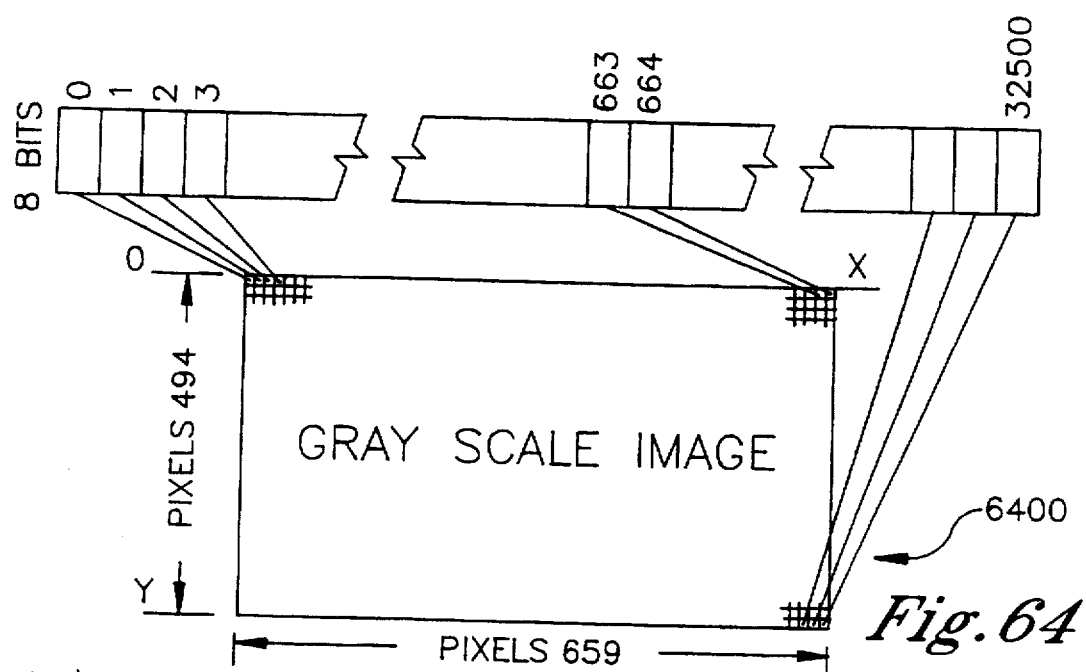
FIG. 64 is a bit-map or gray scale image optically captured by the scanning head of FIGS. 49a–d.

FIG. 64 shows a pixel bit map 6400 corresponding to a framed image field referred to as gray scale image that has been transduced by CCD sensor 4914 and digitized by A/D converter 5236. The digitized gray scale image is processed by CPU 5222 with image processing software downloaded from the host computer. The preferred Sony CCD sensor consists of a large number of photosensitive elements. The pixel bit map corresponds to the illumination level of each of this element. The preferred CCD sensor has a gridded array of 494 lines of photosensitive elements by 659 lines of photosensitive elements forming a gray scale energy bit map.

More specifically, during the accumulation phase, each photosensitive element collects electrical charges which are generated by the absorbed photons. Thus, the collected charge is proportional to the illumination. In the read-out phase, these charges are sequentially transported and finally converted into an electrical voltage which is digitized. When the signal is digitized, the digital signal is converted into small regions called picture elements or pixels for short. At each pixel location, the image brightness is sampled and quantified. This quantification step generates a value for each pixel representing the brightness or darkness of the image at that point. When this has been done for all pixels, the image is represented by a rectangular array known as the gray scale image.

For example, a bit value is set to represent each one of the values from the CCD sensor array. Each pixel has a location or address (line or row number, and sample or column number) and an illumination value called the gray level. This array of digital data is now a candidate for computer processing. Specifically, in the present invention, the gray level of each pixel is used to determine the brightness (or darkness) of the corresponding framed image field reflected on the CCD sensor array. For gray scale image 6400, representing a grid of 494 pixels by 659 pixels, there are bits numbered 0 through 32,600 (32.6 KB).

Figure 65:
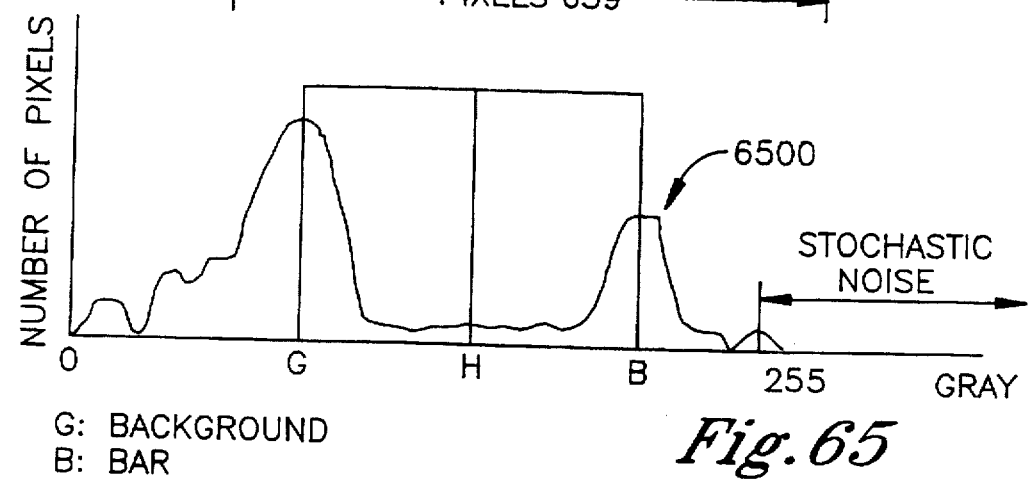
FIG. 65 is a gray distribution curve of the gray scale image of FIG. 64.

FIG. 65 is a gray level curve 6500 or histogram which is useful for analyzing the illumination or gray level distribution of digitized gray scale image 6400. It is well known that a gray level histogram is a useful tool for digital image processing. Basically, the histogram is a summary of the gray level content of an image. The gray level histogram shows the number of pixels in the image field having a particular gray level. The absicca varies from 0 to 255 and describes gray level. The ordinant is the frequency of occurrence of each particular gray level.

In the image field there is a "feature" which is the object of interest, such as a barcode symbology. Additionally, there is background information surrounding the feature and noise caused by items such as image disturbances, light problems, or electrical problems. It is necessary to determine which part of the gray scale image 6400 corresponds to the feature and which part corresponds to noise.

The inventors have recognized that a so-called "double-peak" detection method is useful for detecting the feature when there is noise on the image. For example, in FIG. 65, a peak "G" shows that there are many pixels having a relatively low gray level, while there are a smaller number of pixels having a gray level clustered around another peak "B." The area under the curve corresponding to the peak G represents background of the image, while those pixels clustered under the curve peaking at point B correspond to the feature, such as a barcode symbology. Thus, the image processing software takes advantage of contour lines between peak G and peak B to set a "threshold" gray level. Since the histogram is merely a summary of the distribution of gray points, it is necessary to define contour lines to identify those areas on the image that are the feature. The inventors have recognized that the area of the dip corresponding to peak level H will produce a reasonable boundary for an object of interest because the area of function changes slowly with gray level in that region. Thus, the threshold gray value can be identified as H where H is defined as:

$$H = 1/2 \; (G+B) \tag{59}$$

Therefore, all values below the threshold H value can be easily recognized as background, while all gray values to the right can be mathematically operated on to extract the feature. While the general procedure of identifying thresholds is known, the present invention provides improved methods and means for using them for image processing.

It is well known to perform true floating threshold binary processing on a gray distribution curve to select a global threshold. The steps for true floating threshold binary processing are: (1) test neighboring peaks of an elemental portion I of image field; (2) get the local threshold $H_i$ of part I; (3) binary process the elemental portion I with the local threshold H; and (4) repeat steps 1–3 for the next I, until all of the image is processed. The processing time is very long about 2.5 times greater than normal image binary processing, and about 2.7 times greater than the inventive process known as "similar floating threshold binary processing," described below. For an image with well-differentiated foreground and background intensities, the histogram will have two distinct peaks, such as G and B shown in FIG. 65 and true floating threshold binary processing works well. Because the value between these peaks can be found as the minimum point between two maximum points and the intensity value there is chosen as the threshold. Nevertheless, images do not always contain well-differentiated foreground and background intensities because of poor illumination and noise. An additional problem is that a peak for foreground intensities may be much smaller than a peak for background intensities making it very difficult to find a valley between two peaks.

Further, if illumination is not well-distributed, true floating threshold binary processing is difficult especially if there is stochastic noise. This is especially true if the illumination is very low. Additionally, sampling every point in the image field to determine a gray distribution curve, such as the curve shown in FIG. 65, requires a great amount of processing time. Using true floating threshold binary processing, the quality is high but the processing speed is very low.

Figure 66:
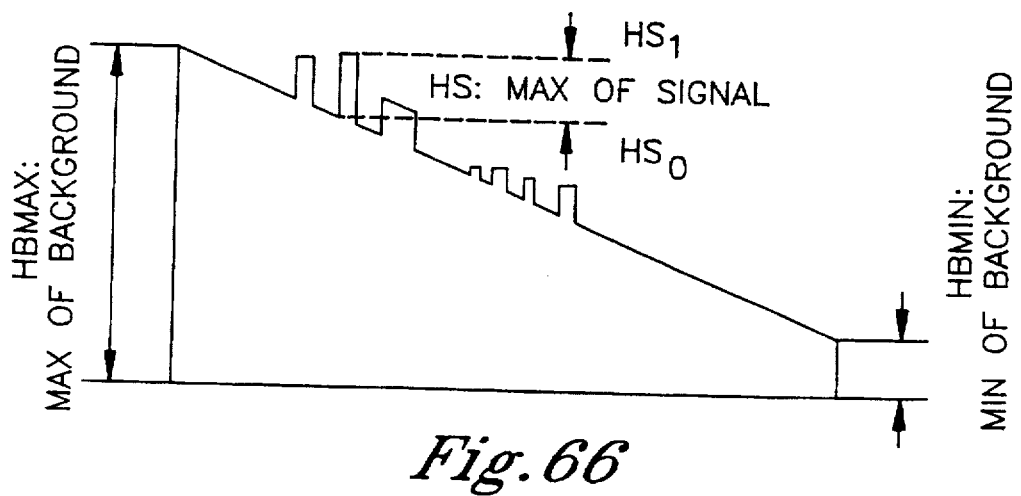
FIG. 66 is a plot of gray scale to illustrate the problem of disproportionate amplitude of a gray level of a symbology versus the gray level of the background.

Referring to FIG. 66, a histogram for such a poorly illuminated image is shown. The ordinant and the absicca in FIG. 66 represents the same units as those portrayed in FIG. 65 (i.e., number of pixels and gray level). The points indicated as hbmin and hbmax are the minimum and maximum gray level values of the background, respectively. The maximum value of the signal is hs, the gray level value of the feature which is superimposed on the noise. The value of hs is less than (hb max–hb min) so the gray image background is very poor and the signal is very small. In this case, true floating threshold binary processing quality is high but speed is very low. The inventor's similar floating threshold binary processing method increases speed with little sacrifice to image quality.

Figure 67:
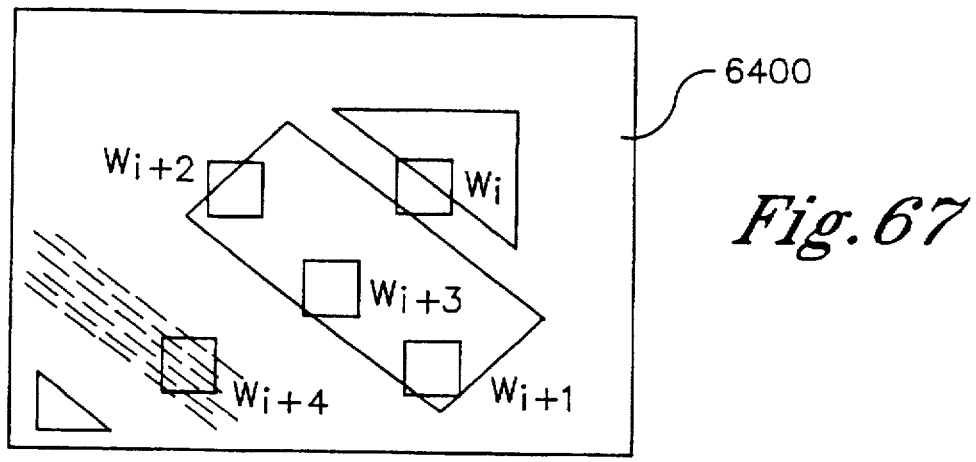
FIG. 67 is an illustration of sampling windows used for detecting a bimodal distribution curve within every sampling window for efficient processing of the gray scale image of FIG. 64.
Figure 68:
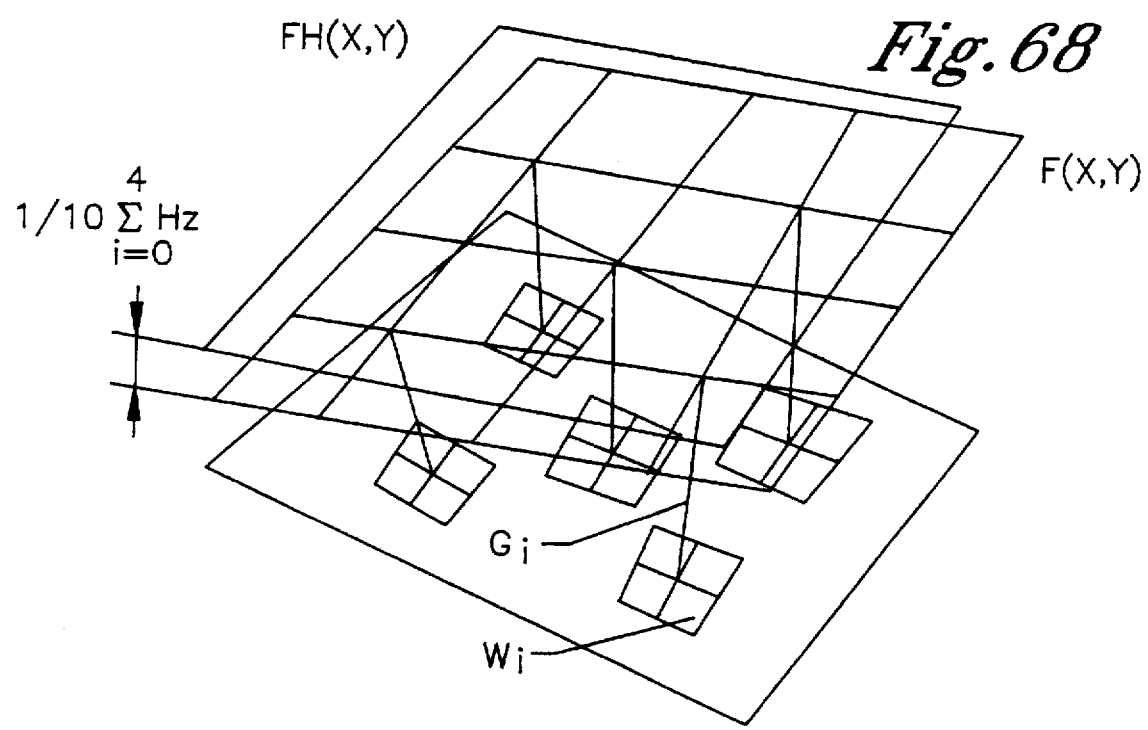
FIG. 68 is a more detailed illustration of the sampling windows of FIG. 67 to illustrate the principal of similar floating threshold binary processing in accordance with the computer implemented processes of this invention.

Referring to FIG. 67, similar floating threshold binary processing selects 5 test windows $w_i$ through $w_{i+4}$. Thus, the five windows are within the framed field of the gray scale image 6400. A good choice for a window size is about 40×40 bits. Using the five small test windows, the image processing software detects the two peaks of the gray distribution curve in each window. The first peak $G_i$ is background and the second peak $B_i$ is the bar symbol or noise. $H_i$ is the distance from peak to peak within each window. Thus, the increment of the threshold is $H = 1/10 \; \Sigma^4_{i=0}$ (i=0, 1, ... 4). Therefore, in the well known space model of gray degree that identifies gray value plotted against a two dimensional space coordinate, one can derive a plan F(x·y) that is parallel to the background plan from $G_i$ (i=0, 1, ... 4). The similar floating threshold plan is shown in FIG. 68 and may be mathematically represented by the equation $$F_h \; (x \cdot y) = F(x \cdot y)H \tag{60}$$

The present invention provides a new data structure for processing images that relies on run length code descriptions. The run length code is a compact representation of an entire binary image. A binary image is typically scanned line by line. If a line contains a sequence of P pixels, rather than store P times the number of times it occurs, the value of the pixel is stored with an indication that it occurs three times. In this way large uniform line segments can be stored in a very efficient way. For example, the size of the image data array 6400 having 32.K bits can be compressed down to 14–16K bits. A new data structure called the "double taper structure" enables a new method for image segmenting. Image segmenting detects multiple barcodes symbologies in the same field of view. The new method of image segmenting is called the "taper structure method", which operates on the run length code and a "feature level" code to extract features in segment images. The taper structure method further removes noise and other labels from the image, locates the particular symbology or feature of interest and decodes it for different types of 1-D or 2-D barcodes. 1-D barcodes may include UPC, EAN, 3 of 9, 12/5, and Code 128. 2-D barcode with a fixed feature on the outer edge may include DataMatrix, PDF 417, code 16IK and code 49. A 2-D barcode with a fixed feature on the outer-edge may include DataMatrix, PDF417, Code 16K and Code 49. A 2-D barcode with a fixed feature on the center that is supported is Code 1, and also supported is Maxi-Code. It is preferable to use the run length code, but the chain length code may be used.

The chain code is a data structure that represents the boundary of a binary image on a discreet grid in a very effective way. Instead of storing the positions of all the boundary pixels, a starting pixel is selected and stored by indexing its coordinate. Then the boundary is followed in a clockwise direction, then the outline or boundary of the image can be stored rather than the entire image. This is very useful for describing the symbology outline.

Figure 69:
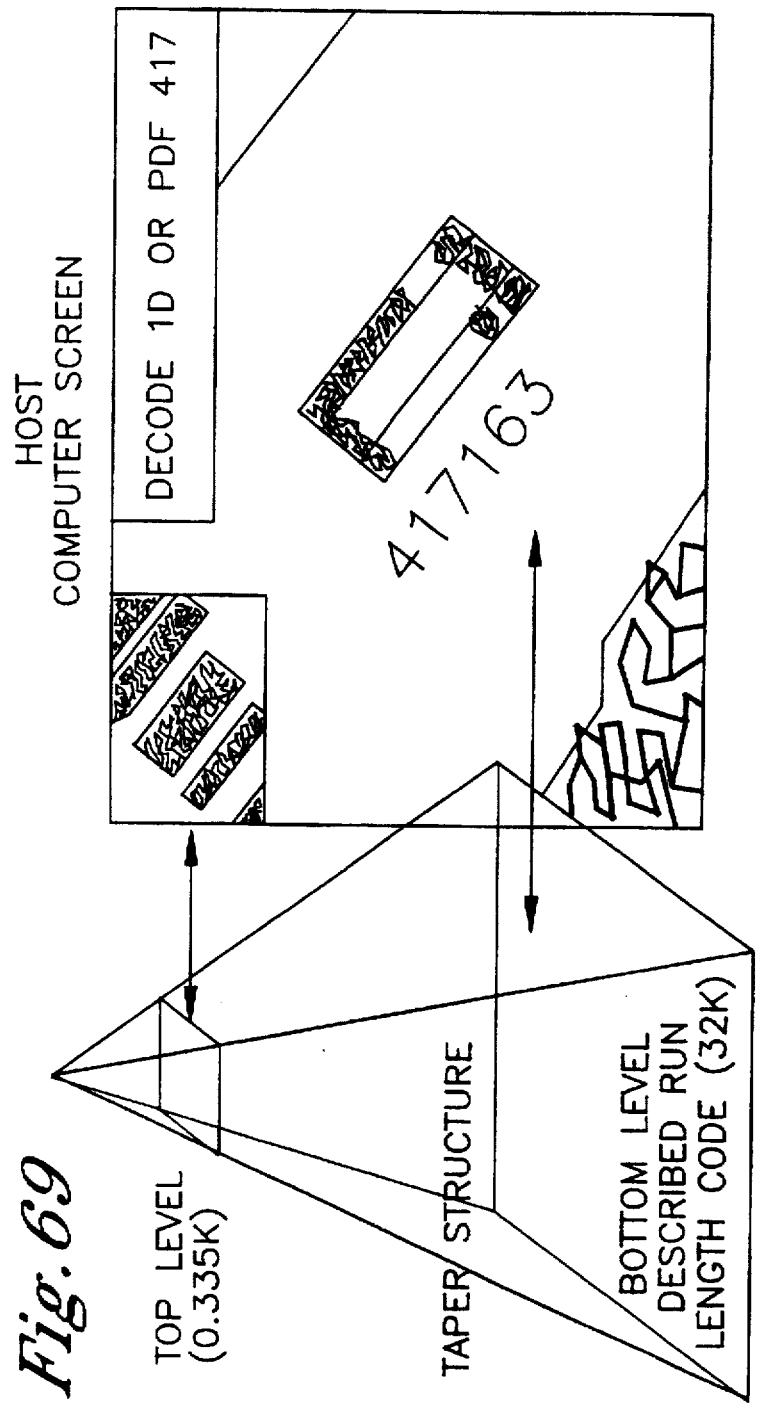
FIG. 69 is data structure parsed into a "two-level" or "double" taper structure including run length code of the gray scale image of FIG. 64 on the bottom level, and the feature of interest at the top level.

The double taper data structure is shown in FIG. 69. The top level is about 0.335K bytes of data, representing information about the feature field, i.e., the particular symbology, such as a barcode of interest. The bottom level is the run length code describing the entire gray scale image and is about 32K bytes of data. For a better understanding of the taper structure method, FIG. 70 gives a simplified overview of the process.

Figure 70:
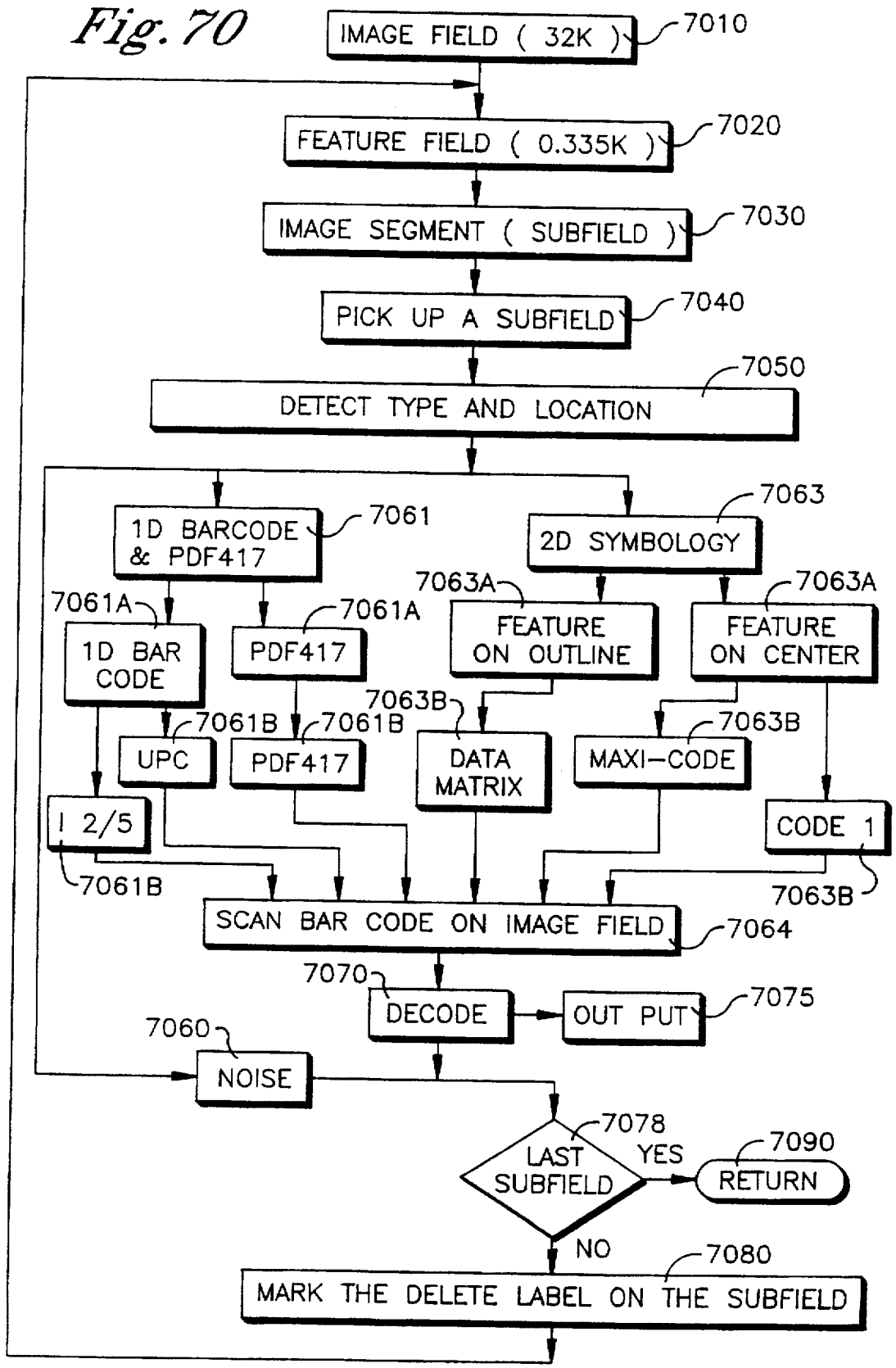
FIG. 70 is a flow diagram illustrating an overview of the operational sequence of the image processing software of this invention.

Referring to step 7010 of FIG. 70, the image field of 32K bytes is processed from the run length code by the image processing software. The feature field at the top level (0.335K bytes) is then extracted in step 7020. Image segmenting is required in step 7030 for removing noise and locating it on the top level of the small feature field to identify the existence of a plurality of symbologies such as barcodes in the feature field. Each identified feature such as a barcode will then be identified as a subfield. The type and location of each subfield is detected in step 7050 following the selection of a particular subfield in step 7040. Noise is extracted in step 7060.

Figure 71:
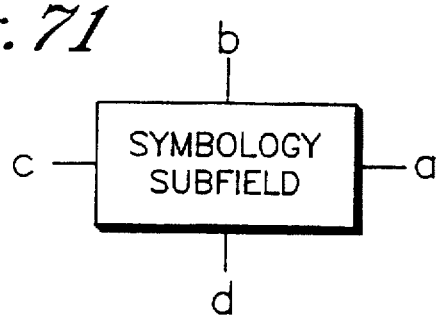
FIG. 71 is a simplified diagrammatic view of a subfield of an image field captured by the scanning device of 49a–d.

Referring to FIG. 71, in the case of a one-dimensional barcode, the barcode type is identified by testing the four edges of a subfield and testing for smooth edges or rough edges. For example in the case of a 1-D or PDF4117 barcode type, vector algebra is conducted to identify the symbology. Once a particular type of symbology is identified in accordance with vector algebra results, the barcode is scanned onto the image field and quickly decoded as shown in step 7061 through 7064 and step 7070. If no subfields remain following the inquiry of step 7078 then the delete label on the subfield is marked and execution returns to pick up the next feature field. If the answer to the inquiry is "Yes", then control returns back to the monitor program as shown in step 7090. Returning to step 7063, if the type of subfield of subfield is a 2-D symbology then the processing steps 7063 through step 7064 are performed to the vector algebra resultant. Then steps 7063 through 7063B identify the particular 2-D symbology is in the field such as DataMatrix or Maxi-Code. When a barcode is scanned into the image field and decoded in step 7070, the output is uploaded to the host in step 7075.

For some types of barcodes, such as Maxi-Code, the information density is very closely packed, therefore the feature on the top level of the double taper structure is very loose. A structure difference algorithm and a structure sum algorithm may be used to process such a loosely structured feature. The structure difference and sum algorithm are well known but are not useful when the image feature is very close to noise. Therefore, the image software combines fuzzy logic control with the double tapered data structure of FIG. 69 in such a situation.

Fuzzy logic theory was first proposed in 1969 by Professor La Zedeh of the University of California at Berkeley. The fuzziness theory deals with a set of ambiguous boundaries instead of an ordinary set having well-defined boundaries. For example, in a conventional Boolean set comprising "0" and "1", the boundary of an individual set can be clearly seen. Unfortunately this bivalent logic does not describe most natural systems very well. Fuzzy logic is more general logic system that allows for formal manipulation of set whose boundaries are fuzzy. The goal is to compare and associate information rather than come up with an absolute numerical solution. An input data point may be partially a member of one set and may partially be a member of another set at the same time. Unfortunately true software implementation of fuzzy logic is very slow. The present invention includes a combination of a table lookup and instruction interpretation to improve the speed of the process.

Table 31 gives a lookup table that can be accessed for fuzzy interference, i.e., undefined boundaries. The fuzzy control table is given below, and should be read in view of FIGS. 72 and 73 for a better understanding.

TABLE 31

| Slop/Dist. | MS | MI | ML | LA |
|---|---|---|---|---|
| SM | M3 | M1 | M1 | M1 |
| MS | M3 | M1 | M1 | M1 |
| ML | M3 | M1 | M1 | M1 |
| LA | M4 | M2 | M2 | M2 |

Referring to Table 31 and FIGS. 72 and 73, the table legion is as follows SM is small, MS is middle small, MI is middle, ML is middle large and MA is large. Each value refers to the slope distance. The rule of fuzzy logic is that if membership of slope and membership of distance are satisfied, then operate the relevant mode $M_i$, where i=1,2, 3,4. Each mode tries to place lines in a membership set for a particular symbology. Using the run length code, it is easy to detect all the points that are positioned on a barcode edge. The image processing software tries to match the barcode meaning match with the line of the barcode. However, a line has many elements (i.e., pixels) and a point on the line is one element (pixel). Therefore matching lines to define a barcode is more difficult than matching points. Nevertheless, it is well known that a line can be defined according to any two points on that line. Therefore the problem of matching lines translates to a problem of matching two points. Fuzzy set theory is based on carefully selecting a fuzzy set and membership function.

Figure 72:
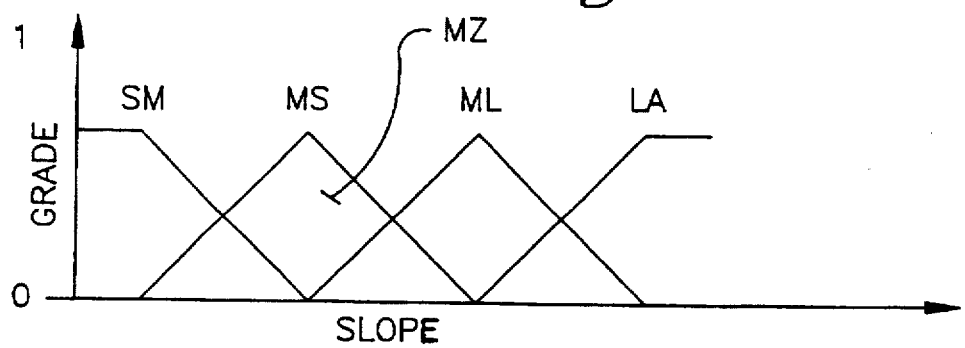
FIGS. 72 and 73 are plots of grade versus slope and distance respectively for determining membership in accordance with fuzzy set and membership functions of this invention.
Figure 73:
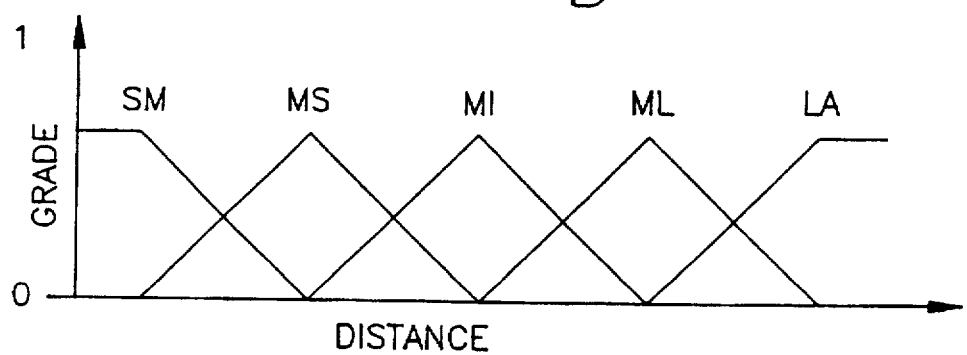

It is convenient to define membership in terms of slope and distance as shown in FIGS. 72 and 73 respectively. It is preferred to use a selected triangle such as triangle M2 (FIG. 72) as a membership function.

Thus, the designing principal for each operating mode is that two points must be close to the outline of the barcode and the distance between the two points must be as far as possible for the highest matching precision. For example, the distance of two points on the barcode outer edge is the middle and the step of two points is large. According to the fuzzy control rule, if distance equals M1 and Step equals LA then operate the membership function M2.

The invention further includes a method known as "regression method for image processing." The regression method is developed on the basis of the double tapered data structure and the fuzzy match model as described above. The statistical name regression derives from fusing the outside information of a field boundary with the inside information and using the inside information to modify the outside information again. The inventors have applied this by using the two parts of information representing outside and inside of edges of symbology boarders and their relationship to each other for detecting damage, stain or missing pixel information. It is well known that a fast Fourier transform (FFT) is effective when only using inside information. For example, the Maxi-Code pattern is decoded very well with the well-known FFT method. Nevertheless, if inside information is lost it is difficult to detect Maxi-Code when using the FFT method. The regression method, on the other hand, processes the Maxi-Code with damage or stain on the outside or on the inside.

There are two software floating point simulation methods available to calculate an FFT for Maxi-Code symbology, the simulated floating point and the amplifier floating point. An example of the simulating floating point is as follows:

$X^1=3.4567$ $X=34567$ $P_x=4$ $P_x=4$ $X^1=34567$ $P_x=0$ X=34567 $P_x=0$
For example:
$X^1_1 + X^1_2 = 3.25 + 6.743 = X^1_3$
Point Operate:
$Px_2 > Px_1$
Therefore right shift $X_1$ until $Px_1 = Px_2$
$X_1 = 3250$ $Px_1 = 3$
Data Operate
$X_1 + X_2 = 3250 + 6743 = 9993$
$X_3 = 9993$ $Px_3 = Px_1 = Px_2 = 3$ $X^1_3 = 9.993$
For example:
$X^1_1 \cdot X^1_2 = 32.1 \times 4.89 = X^1_3$
$X_1 = 321$, $Px_1 = 1$; $X_2 = 489$, $Px_2 = 2$;
Data Operate:
$X_1 \cdot X_2 = 321 \times 489 = 156969$
Point Operate:
$Px_3 = Px_1 + Px_2 = 2 + 1 = 3$
then $X_3 = 156969$ $Px_3 = 3$ $X^1_3 = 156.969$
An example of the amplifier floating point is given below.

$F(u,v) = 1/N^2 \sum_{x=0}^{N-1} \sum_{y=0}^{N-1} f(x \cdot y) \cdot \exp \cdot (-j=(ux+vy)/N)$
$1/N^2 \sum_{x=0}^{N-1} \sum_{y=0}^{N-1} f(x \cdot y) \cdot \exp \cdot \Phi(x \cdot y, u \cdot v) \cdot \Delta)]/\Delta$ $\Delta$ = amplifier parameter
For example:
Suppose $\Delta = loc$,

| | Exp.{φn} | Exp.{φn}·Δ | List (Exp.¹{φn}) |
|---|---|---|---|
| φ₀ | 0.48745 | ×100 | 487 |
| φ₀ | 0.96518 | ×100 | 965 |
| φ₀ | 1.86887 | ×100 | 1868 |

$f_0 = 10$
$f_1 = 20$
$f_2 = 30$ $\sum_{N=0}^{2} [f_{(n)} \cdot \text{Exp.}\{\phi n\}] = 10 \times 0.48745 + 20 \times 0.96518 + 30 \times 1.86887$
$= 4.8745 + 19.3 + 56.4 - 80.21 \gtreqless 80$ $\sum_{N=0}^{2} [f_{(n)} \cdot \text{Exp.}\{\phi n\}]/\Delta = (10 \times 487 + 20 \times 965 + 30 \times 18687)/1000$
$= (4870 + 19300 + 56040)/1000$
$= 80210/1000 \gtreqless 80$ The simulated floating point method has high operating precision while the amplifier floating point parameter method has high operating speed. It is preferred that a special mathematical library be included in the API library on the host PC for this image processing. The amplifier floating point parameter is the preferred method for using an FFT algorithm while the floating point parameter method is better for non-FFT algorithms.

All the above-described algorithms for determining features operate with the assumption that the feature scanned is not "skewed" relative to the plane of the entire image field. For example, assume that the plane of the image field is coincident with a plane of flat paper that the image is imposed upon. If the feature to be scanned has horizontally or vertically aligned text lines that are parallel to the respective edges of that paper, then the feature is said to have zero skew. Since the algorithms for processing and segmenting the images depend on a feature with zero skew, it is important to perform skew estimation and correction prior to image processing. This is a difficult problem because a skew angle cannot be represented accurately by a gray level. One well known algorithm for correcting for skew angle is known as the "perspective translation algorithm." The perspective translation algorithm essentially creates a histogram of the number of on-pixel values accumulated along parallel sample lines taken through the image. The perspective translation computes this skew at a number of angles close to the expected orientation. For each angle, measure is made of the variation in the height along the profile, and the one with the maximum variation gives the skew angle. Unfortunately, the perspective translation algorithm depends on the distance from the image plane to the focal plane of the scanning device being known. With a handheld device, such as device 4900, it is difficult to predict the distance since the operator will scan from various distances from the image plane. Therefore, the invention includes two new perspective translation methods in order to compensate for skew angle. Additionally, the new perspective translation methods compensate for pitch angle. The pitch angle is a further degree of resolution for defying the orientation of the feature in the image plane.

Figure 74:
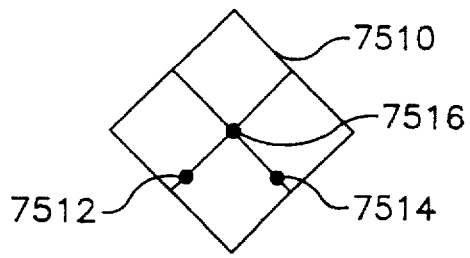
FIG. 74 is a simplified representation of a skewed gray scale image to illustrate the average perspective translation method implemented by the scanning device shown in FIGS. 49a–d.

The two new perspective translation methods are referred to as the "average perspective translation" and the "approximate approach algorithm." FIG. 74, shows a polygon 7510 representing a feature to be analyzed by a scanning device such as device 4900. The polygon 7510 is skewed at an angle (P relative to the plane of the paper on which the image is imposed. The average perspective translation uses the center intersection point 7516 of two middle lines of the polygon 7510 and 7512, respectively. In accordance with the geometry principle of the known true perspective translation algorithm, the average perspective translations corrects for the skew angle $\Phi$ in the case where the skew angle is smaller than about ±30°.

Figure 75:
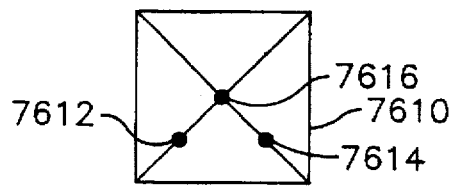
FIG. 75 is a simplified representation of another gray scale image for illustrating the approximate approach method implemented by the scanning device of FIGS. 49a–d.

Referring to FIG. 75, the approximate approach algorithm is illustrated by the crossing point 7616 of diagonal lines 7612 and 7614 of polygon 7610 being taken by the software as the center point of an image feature, such as a barcode. Using the information about the center, all scan lines can be modified relative to the center. This method is also performed in accordance with the geometry principle of the true perspective translation but modified in view of the center point. This method allows for pitch and/or skew angle to exceed about ±45°.

The computer code for each of the above-described software functions is filed herewith as Microfiche Appendix A.

An image capturing scanning device including a laser-beam frame locator including diffractive optics, a LED illumination subsystem including a holographic image for shaping the illumination beam, a zoom lens with phase and band filtering having means for rotating a refractive optic mechanism and including a mini-computer with machine-executed image processing means that aims the laser beam into the aiming frame, segmenting, analyzing and decoding an image has been described. Other embodiments may occur to those skilled in the art in view of the teachings above that are within the scope and spirit of this invention. The above description and illustrations are exemplary only. Therefore, this invention is limited solely by the appended claims and their equivalents.

We claim:

1. In an optical scanning device for reading one or more one- or two-dimensional symbologies contained within a symbology image field having a first width, wherein said optical scanning device includes at least one printed circuit board having a front edge with a second width, an illumination light source mounted on said at least one printed circuit board for projecting an incident beam of light onto said symbology image field, said incident beam of light having substantially said second width at said front edge of said at least one printed circuit board and a first height and a third width at said symbology image field, said third width being greater than said second width and at least as large as said first width, and said optical scanning device further including an optical assembly comprising a plurality of lenses disposed along an optical path for focusing reflected light at a focal plane, said optical assembly including moving means for moving at least one of said plurality of lenses with respect to other lenses of said plurality of lenses to provide a variable field of view, and said optical scanning device further including a detector disposed on said at least one printed circuit board within said optical path substantially at said focal plane of said optical assembly, said variable field of view having said first height and said third width, said detector including a plurality of pixel elements for sensing illumination levels of said focused light, and said optical scanning device further including a processor in communication with circuitry on said at least one printed circuit board for processing said sensed symbology to obtain an electrical signal proportional to said illumination levels and an output means for converting said electrical signal into output data, said output data describing a gray illumination level for each pixel element that is directly relatable to discrete points within said symbology image field, and said processor having a communication path for communicating with a host computer, a combination comprising:

memory means in communication with the processor;

optical framing locator means including a light source for directing light for framing said symbology image within a selected field of view of the variable field of view; and machine-executed means coupled with the memory and the processor for controlling said optical scanning device and processing one or more symbologies, the machine-executed means including:

monitor means for monitoring and controlling power consumption of said electronic circuitry, and said illumination and laser light sources; and image processing means for analyzing and decoding one or more symbologies contained within said framed symbology image field including means for correcting for skewed orientation of said one or more symbologies within a symbology image field.

2. The combination of claim 1, wherein at least portions of said image processing means are selectably downloadable from said host computer.

3. The combination of claim 2, wherein said decoded one or more symbologies is selectably uploadable to said host computer.

4. The combination of claim 1, wherein said light source is a laser diode.

5. The combination of claim 1, wherein said optical framing locator means includes at least one diffractive optical element for transforming the light beam from said light source into a plurality of diverging beamlets having a beamlet spacing at said symbology image field at least as large as said first width.

6. The combination of claim 5, and further comprising at least one refractive optical element for selectively refracting each of said plurality of diverging beamlets at a predetermined angle.

7. The combination of claim 6, wherein said at least one refractive optical element comprises at least one wedge-shaped prism.

8. The combination of claim 7, wherein said at least one wedge-shaped prism includes a horizontal refracting means and a vertical refracting means.

9. The combination of claim 6, wherein a plurality of refractive optical elements are disposed on a rotatable ring and further comprising a linkage for rotating said rotatable ring in response to movement of said at least one of said plurality of lenses to form said framing light beams to indicate said variable field of view.

10. The combination of claim 9, wherein said linkage comprises camming means.

11. The combination of claim 1, wherein said image processing means processes said one or more symbologies within said symbology image field by:

(i) parsing said output data describing said gray illumination level of said image symbology field into a double taper data structure including a first data field, and a second data field, wherein a first set of information related to each said symbology is placed in the first data field and a second set of information related to said symbology image field is placed in the second data field, wherein said first and second sets of information contain at least a pixel bit map describing the gray illumination level of each pixel in each said symbology and said symbology image field;

(ii) segmenting said image symbology field to determine a location and type of each symbology within said symbology image field;

(iii) extracting said first set of symbology information for each symbology from said first data field and determining the gray level of illumination of each pixel within each symbology;

(iv) removing information describing noise from said first and second sets of information in said first and second data fields, respectively;

(v) electronically scanning symbology information describing location and type of each symbology within each said symbology image field into the second data field, wherein said information describing location and type of each symbology segmented in step (ii) is determined in accordance with the gray level determined in step (iii) after noise is removed in step (iv);

(vi) decoding the symbology information scanned in the second data field in step (v); and (vii) outputting said symbology information for each said symbology.

12. The combination of claim 1, wherein the machine-executed means further includes fuzzy set membership means for decoding said one or more symbologies by determining membership of one or more lines contained in said one or more symbologies by comparing characteristics of said one or more lines to predefined characteristics contained in a look-up table.

13. The combination of claim 1, wherein the machine-executed means further includes means for executing a simulated floating point threshold binary processing process to determine type and location of one or more symbologies within said symbology image field by sampling pixels within predefined areas within said symbology image field to determine a gray illumination level curve for each predefined area to determine a binary threshold within each predefined area and summing each said binary threshold within said predefined area to determine a symbology type and location of each symbology within said symbology image field.

14. The combination of claim 1, wherein the machine-executed means for correcting for skewed orientation of said one or more symbologies within said framed symbology image field executes an average perspective translation process by using the crossing point of two middle lines defined by pixels within an area representing a symbology within a symbology image field to define a center point of said symbology portion of said symbology image field.

15. The combination of claim 1, wherein the machine-executed means for correcting for skewed orientation of said one or more symbologies within said framed symbology image field executes an approximate approach process by using the crossing point of two diagonal lines defined by pixels within an area representing a symbology within a symbology image field to define a center point of said symbology portion of said symbology image field.

16. In an optical scanning device for reading a one- or two-dimensional symbology having a first width, and including at least one printed circuit board having a front edge with a second width, and also including an illumination light source mounted on said at least one printed circuit board, said illumination light source for projecting an incident beam of light onto said symbology and having a first spectral bandwidth, said incident beam of light having substantially said second width at said front edge of said at least one printed circuit board and a first height and a third width at said symbology, said third width being greater than said second width and at least as large as said first width, and also including a processor for processing sensed symbology to obtain an electrical signal and output means for converting said electrical signal into output data, a combination comprising:

- an optical assembly comprising a plurality of lenses disposed on said at least one printed circuit board along an optical path for receiving and focusing light reflected from a symbology to obtain a focused light at a focal plane, said optical assembly having moving means for moving at least one of said plurality of lenses with respect to other lenses of said plurality to provide a variable field of view;
- optical framing locator means disposed on said at least one printed circuit board for framing said symbology to identify an area to be scanned by said scanner, wherein said at least one framing means comprises at least one laser diode for emitting a laser beam and at least one diffractive optic for transforming said laser beam into a plurality of diverging beamlets;
- one or more movable refractive optical elements for selectively focusing said plurality of diverging beamlets in response to movement of said at least one of said pluralilty of lenses for selectively forming said laser beamlets within a selected field of view of the variable fields of view; and
- a detector disposed on said at least one printed circuit board within said optical path substantially at said focal plane of said optical assembly for detecting at least a portion of said focused light within said variable field of view of said detector, said variable field of view having said first height and said third width, said detector for sensing said focused light to obtain a sensed symbology.

17. The combination of claim 16, wherein said movable refractive optical elements include a plurality of prisms spaced apart on a rotatable ring at a predetermined distance.

18. The combination of claim 17, wherein said one or more rotatable ring is rotated by camming means in response to movement of said at least one of said plurality of lenses to build said framing light beams.

19. The combination of claim 16, further comprising:

memory means in communication with the processor;

machine-executed means coupled with the memory and the processor for controlling said optical scanning device and processing one or more symbologies, the machine-executed means including:
- monitor means for monitoring and controlling power consumption of said electronic circuitry, and said illumination and laser light sources; and
- image processing means for analyzing and decoding one or more symbologies contained within said framed symbology image field including means for correcting for skewed orientation of said one or more symbologies within a symbology image field.

20. The combination of claim 16, further comprising a band pass filter coupled with the optical assembly.

21. The combination of claim 16, further comprising a phase filter coupled with the optical assembly.

22. The combination of claim 21, wherein the phase filter is a Fresnel phase zone plate (FPZP).

23. The combination of claim 21, wherein the phase filter is an aspheric phase optical element (APOE).

24. The combination of claim 16, wherein the detector is a Charge Coupled Device (CCD) having an electronic shutter with electronically adjustable speeds and having a maximum peak sensitivity of 590 nanometers.

25. The combination of claim 24, wherein the illumination light source is at least one light emitting diode (LED) having a peak output wavelength corresponding to the maximum peak sensitivity of the CCD.

26. The combination of claim 25, wherein the illumination light source is a pair of LEDs, each LED of the pair of LEDs disposed on either side of said optical path and each LED casting a LED light beam having a wide angular output of 23 degrees.

27. The combination of claim 26, further comprising a pair of collecting-projection lens, each said collecting-projection lens spaced a predetermined distance from each pair of LEDs to capture each LED light beam of each LED in each pair over said wide angular output.

28. The combination of claim 27, wherein each said collecting-projection lens has a first side and a second side, wherein said first side is disposed closer of said pair of LEDs and said second side serves as an output point for passing each said LED light beam, and said first side serves as a diffuser having a surface relief hologram disposed thereon for uniformally distributing the intensity of each said LED light beam of each said pair of LEDs at said output point of second side.

29. The combination of claim 28, wherein said diffuser distributes said LED light beam such that it is elliptically shaped, wherein the major axis of said ellipitical shaped beam is dispersed parallel to said optical path and the minor axis of said elliptical shaped beam is dispersed normal to said major axis, and the elliptical aspect ratio of the major axis compared to the minor axis is about 2:1.

30. The combination of claim 20, wherein the bandpass filter is centered on the wavelength of each LED light beam such that decoding of a symbology in a symbology image field is possible in absence of ambient light other than said LED light beam or in direct sunlight.

31. In an optical scanning device for reading a one- or two-dimensional symbology having a first width, said optical scanning device comprising at least one printed circuit board having a front edge with a second width, a light source mounted on said at least one printed circuit board, said light source for projecting an incident beam of light onto said symbology, said incident beam of light having substantially said second width at said front edge of said at least one printed circuit board and a first height and a third width at said symbology, said third width being greater than said second width and at least as large as said first width, an optical assembly comprising a plurality of lenses disposed on said at least one printed circuit board along an optical path for receiving and focusing light reflected from said framed symbology to obtain a focused light at a focal plane, said optical assembly having moving means for moving at least one of said plurality of lenses with respect to other lenses of said plurality to provide a variable field of view, a detector disposed on said at least one printed circuit board within said optical path substantially at said focal plane of said optical assembly for detecting at least a portion of said focused light within said variable field of view of said detector, said variable field of view having said first height and said third width, said detector for sensing said focused light to obtain a sensed symbology, a processor for processing said sensed symbology to obtain an electrical signal; and an output means for converting said electrical signal into output data; the improvement comprising:

- at least one framing means disposed on said at least one printed circuit board for framing said symbology to identify an area to be scanned by said scanner, wherein said at least one framing means comprises:
- at least one light source for emitting a beam of light;
- at least one diffractive optic for transforming said beam of light into a plurality of diverging beamlets; and
- at least one refractive optical element disposed in an optical path of each of said plurality of diverging beamlets for directing said plurality of diverging beamlets to project spots of light to frame said variable field of view, whereby said variable field of view is identified.

32. The optical scanning device of claim 31, wherein said at least one refractive optical element is at least one wedge-shaped prism.

33. The optical scanning device of claim 32, wherein said at least one refractive optical element includes a pair of wedge-shaped prisms, a first prism providing a horizontal divergence and a second prism providing a vertical divergence.

34. The optical scanning device of claim 32, wherein said at least one refractive optical element comprises a first refractive optical element for framing a narrow field of view of said variable field of view, and a second refractive optical element for framing a wide field of view of said variable field of view.

35. The optical scanning device of claim 34, wherein said first and second refractive optical elements are disposed on a rotatable ring and further comprising a linkage for rotating said rotatable ring in response to movement of moving means to project each beamlet of said diverging beamlets through a corresponding first refractive optical element when said moving means causes said narrow field of view to be selected and to project said each beamlet through a corresponding second refractive optical element when said moving means causes said wide field of view to be selected.

36. The optical scanning device of claim 35, wherein said linkage comprises camming means.

37. The optical scanning device of claim 31 wherein said light source is a laser diode.

* * * * *

UNITED STATES PATENT AND TRADEMARK OFFICE
CERTIFICATE OF CORRECTION

PATENT NO. : 5,756,981
DATED : May 26, 1998
INVENTOR(S) : Alexander R. Roustaei et al.

It is certified that error appears in the above-indentified patent and that said Letters Patent is hereby corrected as shown below:

```
Column 13, line 56, insert --TABLE 5--.
Column 14, line 4, delete "Table 5".
Column 17, line 37, insert --TABLE 7--.
Column 18, line 9, delete "Table 6";
           line 14, change "7" to --8--.
Column 27, line 12, insert --TABLE 9--;
           line 33, delete "Table 8";
           line 61, insert --TABLE 10--.
Column 28, line 6, delete "Table 9".
Column 32, line 43, change "10" to --11--;
           line 49, change "10" to --11--.
Column 38, line 16, change "11" to --12--;
           line 18, change "11" to --12--.
Column 39, line 46, change "5V" to --+5V--.
Column 42, line 36, change "12a" to --13a--;
           line 38, change "12a" to --13a--.
Column 44, line 4, change "12b" to --13b--;
           line 48, change "12c" to --13c--;
           line 61, change "12d" to --13d--.
Column 45, line 2, change "12d" to --13d--;
           line 11, change "12e" to --13e--;
           linee23, change "12f" to --13f--;
           line 35, change "13a" to --14a--;
           line 38, change "13a" to --14a--;
           line 46, change "13b" to --14b--;
           line 50, change "13b" to --14b--.
Column 47, line 15, change "14 and 15" to --15 and 16--;
           line 19, change "14" to --15--;
           line 33, change "15" to --16--;
           line 55, change "16" to --17--;
           line 56, insert --TABLE 17--;
           line 65, delete "Table 16".
```

UNITED STATES PATENT AND TRADEMARK OFFICE
CERTIFICATE OF CORRECTION

PATENT NO. : 5,756,981
DATED : May 26, 1998
INVENTOR(S) : Alexander R. Roustaei et al.

It is certified that error appears in the above-indentified patent and that said Letters Patent is hereby corrected as shown below:

```
Column 51, line 21, change "17" to --18--;
           line 37, change "18" to --19--;
           line 40, change "18" to --19--.
Column 52, line 2, change "18" to --19--;
           line 22, change "19" to --20--;
           line 24, change "19" to --20--;
           line 36, change "20" to --21--;
           line 55, change "21" to --22--;
           line 57, change "21" to --22--.
Column 53, line 2, change "21" to --22--;
           line 17, change "22" to --23--;
           line 20, change "22" to --23--.
Column 67, line 65, change "31" to --30--.
Column 68, line 3, change "31" to --30--;
           line 11, change "31" to --30--.
```

Signed and Sealed this

Twentieth Day of October, 1998

Attest:

BRUCE LEHMAN

*Attesting Officer*  *Commissioner of Patents and Trademarks*